(12) United States Patent
Tanaka

(10) Patent No.: US 12,113,134 B2
(45) Date of Patent: Oct. 8, 2024

(54) TRANSISTOR, METHOD OF MANUFACTURING TRANSISTOR, AND DISPLAY DEVICE USING THE SAME

(71) Applicant: Mikuni Electron Corporation, Saitama (JP)

(72) Inventor: Sakae Tanaka, Saitama (JP)

(73) Assignee: MIKUNI ELECTRON CORPORATION, Saitama (JP)

( * ) Notice: Subject to any disclaimer, the term of this patent is extended or adjusted under 35 U.S.C. 154(b) by 0 days.

(21) Appl. No.: 18/447,360

(22) Filed: Aug. 10, 2023

(65) Prior Publication Data

US 2023/0387323 A1    Nov. 30, 2023

Related U.S. Application Data

(63) Continuation of application No. 17/572,789, filed on Jan. 11, 2022, now Pat. No. 11,929,439, which is a
(Continued)

(30) Foreign Application Priority Data

Sep. 26, 2018   (JP) .................................. 2018-180487

(51) Int. Cl.
*H01L 29/786* (2006.01)
*H01L 21/02* (2006.01)
(Continued)

(52) U.S. Cl.
CPC .. *H01L 29/78693* (2013.01); *H01L 21/02565* (2013.01); *H01L 21/02631* (2013.01);
(Continued)

(58) Field of Classification Search
CPC ......... H01L 29/78693; H01L 21/02565; H01L 21/02631; H01L 27/1225; H01L 27/127;
(Continued)

(56) References Cited

U.S. PATENT DOCUMENTS 5,245,450 A    9/1993    Ukai et al.
6,037,718 A    3/2000    Nagami
(Continued)

FOREIGN PATENT DOCUMENTS

CN          1716366 A      1/2006
CN        101165906 A      4/2008
(Continued)

OTHER PUBLICATIONS

Japanese Office Action issued in Japanese Patent Application No. 2022-532499 dated Jul. 4, 2023.
(Continued)

*Primary Examiner* — Jonathan Han
(74) *Attorney, Agent, or Firm* — PEARNE & GORDON LLP

(57) ABSTRACT

A transistor in an embodiment includes an oxide semiconductor layer on a substrate, the oxide semiconductor layer including a first region and a second region, a first gate electrode including a region overlapping the oxide semiconductor layer, the first gate electrode being arranged on a surface of the oxide semiconductor layer opposite to the substrate, a first insulating layer between the first gate electrode and the oxide semiconductor layer, and a first oxide conductive layer and a second oxide conductive layer between the oxide semiconductor layer and the substrate, the first oxide conductive layer and the second oxide conductive layer each including a region in contact with the oxide semiconductor layer.

20 Claims, 33 Drawing Sheets

Related U.S. Application Data continuation of application No. 16/577,044, filed on Sep. 20, 2019, now Pat. No. 11,257,961.

(51) Int. Cl.

| | | |
|---|---|---|
| *H01L 27/12* | (2006.01) | |
| *H01L 29/24* | (2006.01) | |
| *H01L 29/423* | (2006.01) | |
| *H01L 29/66* | (2006.01) | |
| *H10K 59/12* | (2023.01) | |
| *H10K 59/121* | (2023.01) | |
| *H10K 59/124* | (2023.01) | |

(52) U.S. Cl.
CPC ........ *H01L 27/1225* (2013.01); *H01L 27/127* (2013.01); *H01L 29/24* (2013.01); *H01L 29/42384* (2013.01); *H01L 29/66969* (2013.01); *H01L 29/78648* (2013.01); *H01L 29/78696* (2013.01); *H01L 27/1248* (2013.01); *H10K 59/1201* (2023.02); *H10K 59/1213* (2023.02); *H10K 59/124* (2023.02)

(58) Field of Classification Search
CPC ............... H01L 29/24; H01L 29/42384; H01L 29/66969; H01L 29/78648; H01L 29/78696; H01L 27/1248; H01L 29/7869; H01L 27/1259; H10K 59/1201; H10K 59/1213; H10K 59/124; H10K 59/1315
See application file for complete search history.

(56) References Cited

U.S. PATENT DOCUMENTS

| | | | |
|---|---|---|---|
| 6,730,970 | B1 | 5/2004 | Katoh et al. |
| 8,344,387 | B2 | 1/2013 | Akimoto et al. |
| 8,421,068 | B2 | 4/2013 | Yamazaki et al. |
| 8,427,607 | B2 | 4/2013 | Lee et al. |
| 8,598,610 | B2 | 12/2013 | Oda |
| 8,816,380 | B2 | 8/2014 | Oda |
| 10,020,374 | B2 | 7/2018 | Sone et al. |
| 10,074,709 | B1 | 9/2018 | Tanaka |
| 10,102,804 | B2 | 10/2018 | Tanikame |
| 10,141,343 | B2 | 11/2018 | Ito et al. |
| 10,141,384 | B2 | 11/2018 | Takata |
| 10,158,005 | B2 | 12/2018 | Akimoto et al. |
| 10,326,008 | B2 | 6/2019 | Kimura |
| 10,388,520 | B2 | 8/2019 | Yamazaki et al. |
| 10,418,384 | B2 | 9/2019 | Yamazaki et al. |
| 10,615,233 | B2 | 4/2020 | Muccini et al. |
| 11,233,132 | B2 | 1/2022 | Kimura |
| 11,239,449 | B2 | 2/2022 | Tanaka |
| 2001/0002857 | A1 | 6/2001 | Shimada et al. |
| 2002/0020875 | A1 | 2/2002 | Arao et al. |
| 2002/0089616 | A1 | 7/2002 | Hashimoto et al. |
| 2002/0093600 | A1 | 7/2002 | Chol |
| 2002/0149722 | A1 | 10/2002 | Anno et al. |
| 2002/0167280 | A1 | 11/2002 | Hayashi et al. |
| 2003/0137242 | A1 | 7/2003 | Seki |
| 2003/0184699 | A1 | 10/2003 | Matsumoto et al. |
| 2003/0197666 | A1 | 10/2003 | Akimoto et al. |
| 2004/0095168 | A1 | 5/2004 | Miyazawa |
| 2004/0222429 | A1 | 11/2004 | Yamazaki et al. |
| 2004/0227891 | A1 | 11/2004 | Hirota |
| 2005/0018114 | A1 | 1/2005 | Park et al. |
| 2005/0199880 | A1 | 9/2005 | Hoffman et al. |
| 2006/0007073 | A1 | 1/2006 | Kwak |
| 2007/0069202 | A1 | 3/2007 | Choi et al. |
| 2007/0126671 | A1 | 6/2007 | Naoaki |
| 2007/0269936 | A1 | 11/2007 | Tanaka et al. |
| 2008/0122341 | A1 | 5/2008 | Orita et al. |
| 2008/0238835 | A1 | 10/2008 | Asano et al. |
| 2009/0135105 | A1 | 5/2009 | Nakamura et al. |
| 2009/0140955 | A1 | 6/2009 | Nakamura et al. |
| 2009/0179195 | A1 | 7/2009 | Obata et al. |
| 2009/0179208 | A1 | 7/2009 | Obata et al. |
| 2009/0189161 | A1 | 7/2009 | Honda |
| 2009/0206332 | A1 | 8/2009 | Son et al. |
| 2009/0315043 | A1 | 12/2009 | Nakamura et al. |
| 2010/0102313 | A1 | 4/2010 | Miyairi et al. |
| 2010/0193782 | A1 | 8/2010 | Sakata |
| 2010/0200851 | A1 | 8/2010 | Oikawa et al. |
| 2010/0224878 | A1 | 9/2010 | Kimura |
| 2010/0224880 | A1 | 9/2010 | Kimura |
| 2010/0244020 | A1 | 9/2010 | Sakata et al. |
| 2010/0244031 | A1 | 9/2010 | Akimoto et al. |
| 2010/0244710 | A1 | 9/2010 | Obata et al. |
| 2010/0279474 | A1 | 11/2010 | Akimoto et al. |
| 2010/0301383 | A1 | 12/2010 | Shitagaki et al. |
| 2011/0024740 | A1 | 2/2011 | Yamazaki et al. |
| 2011/0031492 | A1 | 2/2011 | Yamazaki et al. |
| 2011/0031496 | A1 | 2/2011 | Yamazaki et al. |
| 2011/0090417 | A1 | 4/2011 | Kim et al. |
| 2011/0108835 | A1 | 5/2011 | Kim et al. |
| 2011/0127521 | A1 | 6/2011 | Yamazaki |
| 2011/0133178 | A1* | 6/2011 | Yamazaki ........... H01L 27/1225 257/43 |
| 2011/0141076 | A1 | 6/2011 | Fukuhara et al. |
| 2011/0147738 | A1 | 6/2011 | Yamazaki et al. |
| 2011/0181349 | A1 | 7/2011 | Yamazaki et al. |
| 2011/0212570 | A1 | 9/2011 | Yamazaki et al. |
| 2011/0240987 | A1 | 10/2011 | Lee et al. |
| 2011/0240994 | A1 | 10/2011 | Yamazaki |
| 2011/0248258 | A1 | 10/2011 | Kim et al. |
| 2012/0007083 | A1 | 1/2012 | You et al. |
| 2012/0112200 | A1 | 5/2012 | Nagano |
| 2012/0138922 | A1* | 6/2012 | Yamazaki ............. H01L 29/247 257/43 |
| 2012/0146062 | A1 | 6/2012 | Oda |
| 2012/0146713 | A1 | 6/2012 | Kim et al. |
| 2012/0248451 | A1 | 10/2012 | Sone et al. |
| 2012/0313903 | A1 | 12/2012 | Pyon et al. |
| 2013/0001602 | A1 | 1/2013 | Park et al. |
| 2013/0240842 | A1 | 9/2013 | Rinzler et al. |
| 2013/0270552 | A1 | 10/2013 | Yamazaki et al. |
| 2013/0286054 | A1 | 10/2013 | Kitadani et al. |
| 2013/0328045 | A1 | 12/2013 | Takata et al. |
| 2014/0111406 | A1 | 4/2014 | Wang et al. |
| 2014/0340608 | A1 | 11/2014 | Yamazaki et al. |
| 2015/0137103 | A1 | 5/2015 | Hosono et al. |
| 2015/0153599 | A1 | 6/2015 | Yamazaki et al. |
| 2015/0179802 | A1 | 6/2015 | Kim et al. |
| 2015/0221678 | A1 | 8/2015 | Yamazaki et al. |
| 2015/0228799 | A1 | 8/2015 | Koezuka et al. |
| 2016/0056214 | A1 | 2/2016 | Pyo et al. |
| 2016/0155858 | A1 | 6/2016 | Yoo et al. |
| 2016/0155980 | A1 | 6/2016 | Lee et al. |
| 2016/0218324 | A1 | 7/2016 | Kim et al. |
| 2016/0284854 | A1 | 9/2016 | Okazaki et al. |
| 2016/0285027 | A1 | 9/2016 | Hosono et al. |
| 2016/0300950 | A1 | 10/2016 | Lee et al. |
| 2016/0329388 | A1 | 11/2016 | Yokota et al. |
| 2016/0343868 | A1* | 11/2016 | Koezuka ............. H01L 29/7869 |
| 2017/0098782 | A1 | 4/2017 | Choi et al. |
| 2017/0117705 | A1 | 4/2017 | Sekine et al. |
| 2017/0176826 | A1 | 6/2017 | Tsuda et al. |
| 2017/0186984 | A1 | 6/2017 | Hosono et al. |
| 2018/0122833 | A1 | 5/2018 | Lee et al. |
| 2018/0166585 | A1 | 6/2018 | Takechi |
| 2018/0301472 | A1 | 10/2018 | Matsukizono |
| 2019/0013333 | A1 | 1/2019 | Inoue et al. |
| 2020/0089064 | A1 | 3/2020 | Morinaga et al. |
| 2020/0373430 | A1 | 11/2020 | Shima et al. |
| 2021/0012728 | A1 | 1/2021 | Shan |

FOREIGN PATENT DOCUMENTS

| | | | |
|---|---|---|---|
| CN | 101336491 | A | 12/2008 |
| CN | 101383125 | A | 3/2009 |
| CN | 101847661 | A | 9/2010 |
| CN | 101997007 | A | 3/2011 |
| CN | 102782858 | A | 11/2012 |
| CN | 103377617 | A | 10/2013 |

(56) References Cited

FOREIGN PATENT DOCUMENTS

| | | |
|---|---|---|
| CN | 105762196 A | 7/2016 |
| CN | 109637493 A | 4/2019 |
| CN | 110875437 A | 3/2020 |
| EP | 2634812 A1 | 9/2013 |
| EP | 3410490 A3 | 2/2019 |
| EP | 3618136 A2 | 3/2020 |
| JP | H09-152625 A | 6/1997 |
| JP | H09-269508 A | 10/1997 |
| JP | 2909266 B2 | 6/1999 |
| JP | H11-212493 A | 8/1999 |
| JP | 2001-144298 A | 5/2001 |
| JP | 2001-291583 A | 10/2001 |
| JP | 2002-033331 A | 1/2002 |
| JP | 2002-303877 A | 10/2002 |
| JP | 2002-311424 A | 10/2002 |
| JP | 2002-343578 A | 11/2002 |
| JP | 2003-005203 A | 1/2003 |
| JP | 2003-108034 A | 4/2003 |
| JP | 2003-295207 A | 10/2003 |
| JP | 2004-145300 A | 5/2004 |
| JP | 2004-341465 A | 12/2004 |
| JP | 2005-004193 A | 1/2005 |
| JP | 2005-338653 A | 12/2005 |
| JP | 2006-165529 A | 6/2006 |
| JP | 2007-053286 A | 3/2007 |
| JP | 2007-095685 A | 4/2007 |
| JP | 2007-149922 A | 6/2007 |
| JP | 2007-157871 A | 6/2007 |
| JP | 2007-310334 A | 11/2007 |
| JP | 2008-066385 A | 3/2008 |
| JP | 2008-084655 A | 4/2008 |
| JP | 2009-075613 A | 4/2009 |
| JP | 2009-175563 A | 8/2009 |
| JP | 2010-040552 A | 2/2010 |
| JP | 2010-050165 A | 3/2010 |
| JP | 2010-153842 A | 7/2010 |
| JP | 2010-206187 A | 9/2010 |
| JP | 2010-232645 A | 10/2010 |
| JP | 2010-232651 A | 10/2010 |
| JP | 2010-232652 A | 10/2010 |
| JP | 2010-251731 A | 11/2010 |
| JP | 2010-283338 A | 12/2010 |
| JP | 2011-049550 A | 3/2011 |
| JP | 2011-128442 A | 6/2011 |
| JP | 2011-146694 A | 7/2011 |
| JP | 2011-199273 A | 10/2011 |
| JP | 2011-223004 A | 11/2011 |
| JP | 2012-146764 A | 8/2012 |
| JP | 2012-191131 A | 10/2012 |
| JP | 2013088657 A | 5/2013 |
| JP | 2014-505324 A | 2/2014 |
| JP | 2014-154382 A | 8/2014 |
| JP | 2014-218706 A | 11/2014 |
| JP | 2015-143396 A | 8/2015 |
| JP | 2015-179822 A | 10/2015 |
| JP | 2015-228515 A | 12/2015 |
| JP | 2016-181695 A | 10/2016 |
| JP | 2016-213052 A | 12/2016 |
| JP | 2016-219801 A | 12/2016 |
| JP | 2017-005064 A | 1/2017 |
| JP | 2017-057288 A | 3/2017 |
| JP | 2017-084868 A | 5/2017 |
| JP | 2017-116622 A | 6/2017 |
| JP | 2017-168860 A | 9/2017 |
| JP | 2017-537350 A | 12/2017 |
| JP | 2018-098364 A | 6/2018 |
| JP | 2018-133144 A | 8/2018 |
| JP | 2018-206822 A | 12/2018 |
| JP | 2019-016659 A | 1/2019 |
| JP | 2019-149561 A | 9/2019 |
| JP | 2020-035942 A | 3/2020 |
| KR | 10-2006-0003633 A | 1/2006 |
| KR | 10-2011-0015373 A | 2/2011 |
| KR | 10-2011-0041139 A | 4/2011 |
| KR | 10-2013-0037569 A | 4/2013 |
| KR | 10-2014-0081662 A | 7/2014 |
| KR | 10-2016-0120394 A | 10/2016 |
| KR | 10-2017-0021903 A | 2/2017 |
| TW | 201545360 A | 12/2015 |
| TW | 201630181 A | 8/2016 |
| TW | 201639213 A | 11/2016 |
| TW | 201714313 A | 4/2017 |
| WO | 2005/071764 A1 | 8/2005 |
| WO | 2007/043697 A1 | 4/2007 |
| WO | 2007/043704 A1 | 4/2007 |
| WO | 2015/098458 A1 | 7/2015 |
| WO | 2016/043234 A1 | 3/2016 |
| WO | 2016/195039 A1 | 12/2016 |
| WO | 2019/043510 A1 | 3/2019 |

OTHER PUBLICATIONS

Japanese Notice of Allowance issued in Japanese Patent Application No. 2022-190674 dated Aug. 29, 2023.
Extended European search report issued in European Patent Application No. 21827868.7 dated Sep. 5, 2023.
Hee Yeon Kim et al, "Transparent InP Quantum Dot Light-Emitting Diodes with ZrO2 Electron Transport Layer and Indium Zinc Oxide Top Electrode", Advanced Functional Materials, Wiley-VCH Verlag Gmbh & Co. KGAA, DE, vol. 26, No. 20, Apr. 6, 2016, pp. 3454-3461, XP072413443.
Japanese Office Action issued in Japanese Patent Application No. 2020-018120 dated Sep. 5, 2023.
US Office Action issued in U.S. Appl. No. 18/299,101 dated Nov. 9, 2023.
Japanese Office Action issued in Japanese Patent Application No. 2023-035885 dated Nov. 21, 2023.
Extended European Search Report issued for European application No. 23191776.6 dated Nov. 28, 2023.
Woo Jae Jang et al., "Low Resistive High-Work-Function Gate Electrode for Transparent a-IGZO TFTs", IEEE Transactions on Electron Devices, IEEE, USA, vol. 64, No. 1, Jan. 1, 2017, pp. 164-169, XP011637544 ISSN: 0018-9383, DOI:10.1109/TED.2016.2631567 [retrieved on Dec. 26, 2016].
US Notice of Allowance issued in U.S. Appl. No. 18/190,208 dated Oct. 25, 2023.
International Search Report issued in Patent Application No. PCT/JP2021/023638 dated Sep. 14, 2021.
Written Opinion issued in Patent Application No. PCT/JP2021/023638 dated Sep. 14, 2021.
Partial European Search Report for Application No. 18173345.2 dated Oct. 2, 2018.
Extended European Search Report for Application No. 18173345.2 dated Jan. 14, 2019.
Extended European Search Report for 19186679.7 dated Feb. 11, 2020.
Extended European Search Report for 19199145.4 dated Feb. 14, 2020.
Extended European Search Report for 19213814.7 dated May 29, 2020.
Extended European search report issued in European Patent Application No. 21154269.1 dated Jul. 15, 2021.
Extended European search report issued in European Patent Application No. 22161095.9 dated May 9, 2022.
Hosono et al., "Transparent Amorphous Oxide Semiconductors for Organic Electronics: Application to Inverted OLEDs", Proceedings of the National Academy of Sciences, vol. 114, No. 2, Dec. 27, 2016, pp. 233-238.
Gyujeong Lee et al., "Vertical organic light-emitting transistor showing a high current on/off ratio through dielectric encapsulation for the effective charge pathway", Journal of Applied Physics, Jan. 12, 2017, vol. 121, P-024502-(1-8).
Japanese Office Action issued in Japanese Patent Application No. 2019-029934 dated Aug. 2, 2022.
Japanese Office Action issued in Japanese Patent Application No. 2018-162568 dated Aug. 23, 2022.
Japanese Office Action issued in Japanese Patent Application No. 2018-180487 dated Sep. 6, 2022.

(56) References Cited

OTHER PUBLICATIONS

Taiwanese Office Action issued in Taiwanese Patent Application No. 111131731 dated Sep. 1, 2022.
U.S. Office action for U.S. Appl. No. 16/206,744 dated Mar. 5, 2020.
Office Action issued on Oct. 14, 2020 for the U.S. Appl. No. 16/206,744.
US Office Action issued in U.S. Appl. No. 16/206,744 dated Apr. 23, 2021.
Notice of Allowance mailed on Nov. 29, 2022 for the U.S. Appl. No. 17/543,793.
United States Office Action dated Jun. 7, 2022 issued in United States U.S. Appl. No. 17/163,939.
Notice of Allowance mailed on Sep. 30, 2020 for the U.S. Appl. No. 16/678,229.
Notice of Allowance mailed on Jan. 19, 2021 for the corresponding to Japanese application No. 2017-107278.
Notice of Allowance mailed on Nov. 8, 2022 for the corresponding to Korean application No. KR10-2018-0057002.
Extended European Search Report issued on Mar. 2, 2023 for EP application No. 22212464.6.
Chinese Office Action issued in Chinese Patent Application No. 201810479338.8 dated Apr. 1, 2023.
Taiwanese Office Action issued in Taiwanese Patent Application No. 112116069 dated May 29, 2023.
US Office Action issued in US Patent Application No. 16/860,160 dated Mar. 3, 2021.
Korean Office Action issued in Korean Patent Application No. 10-2023-0014691 dated Sep. 27, 2023.
Korean Office Action issued in Korean Patent Application No. 10-2022-7042390 dated Jan. 18, 2024.
European Office Action issued in European Patent Application No. 19186679.7 dated Jan. 24, 2024.
Chinese Office Action issued in Chinese Patent Application No. 201911056626.3 dated Mar. 12, 2024.
Japanese Notice of Allowance issued in Japanese Patent Application No. 2023-035885 dated May 28, 2024.
Office Action issued on Jun. 11, 2024 for Chinese application No. 201910651062.1.
Notice of Allowance issued on Jul. 29, 2024 for Chinese application No. 201911056626.3.

\* cited by examiner

TRANSISTOR, METHOD OF MANUFACTURING TRANSISTOR, AND DISPLAY DEVICE USING THE SAME

CROSS REFERENCE TO RELATED APPLICATIONS

This application is a continuation of U.S. patent application Ser. No. 17/572,789 filed on Jan. 11, 2022, which is a continuation of U.S. patent application Ser. No. 16/577,044 filed on Sep. 20, 2019, which claims the benefit of priority from the prior Japanese Patent Application No. 2018-180487 filed on Sep. 26, 2018, the entire contents of which are incorporated herein by reference.

FIELD

An embodiment of the present invention relates to a transistor including an oxide semiconductor, a method of manufacturing the same, and a display device including a pixel that includes a transistor including the oxide semiconductor.

BACKGROUND

An active matrix display device includes a display element and a transistor driving the display element that are provided in each of pixels thereof. Usable as the display element is a liquid crystal element including a pair of electrodes and a liquid crystal layer provided between the pair of electrodes or an organic electroluminescence element (hereinafter, referred to as an "organic EL element") including a cathode electrode, an anode electrode and a layer that is provided between the cathode electrode and the anode electrode and contains an organic electroluminescence material. The transistor may be a thin film transistor including components formed of an amorphous silicon semiconductor or a polycrystalline silicon semiconductor. Recently, a thin film transistor including components formed of an oxide semiconductor is also used.

An amorphous silicon semiconductor film may be easily formed on a substrate having a large area size, but has a problem of having a low field effect mobility when being used to manufacture a thin film transistor. By contrast, a thin film formed by use of a polycrystalline silicon semiconductor has a high field effect mobility, but has the following problem. A polycrystalline silicon semiconductor requires a crystallization step such as laser annealing or the like, and therefore, is not easily formed into a uniform film on a substrate having a large area size. This causes the threshold voltage to be varied. A thin film transistor manufactured by use of an oxide semiconductor has a field effect mobility higher than that of a thin film transistor manufactured by use of an amorphous silicon semiconductor film. In addition, a thin film transistor manufactured by use of an oxide semiconductor is more easily formed on a substrate having a large area size than a thin film transistor manufactured by use of a polycrystalline silicon semiconductor, and has an advantage of not requiring a crystallization step. However, an oxide semiconductor film has the following problem. The composition of the oxide semiconductor film varies in accordance with the film formation conditions or manufacturing conditions of the thin film transistor, and thus a defect may be caused to easily fluctuate the electric characteristics of the thin film transistor.

For example, Japanese Laid-Open Patent Publication No. 2010-153842 discloses a thin film transistor including a first oxide semiconductor region as an active region. The thin film transistor includes a second oxide semiconductor region formed between the first oxide semiconductor region and a protective insulating layer, and the second oxide semiconductor region has a conductivity lower than that of the first oxide semiconductor region and acts as a protective layer. With such a structure, the first oxide semiconductor region is prevented from being changed in the composition or from being deteriorated in the film quality, and thus the thin film transistor has stable electric characteristics.

SUMMARY

A transistor in an embodiment according to the present invention includes an oxide semiconductor layer on a substrate, the oxide semiconductor layer including a first region and a second region, a first gate electrode including a region overlapping the oxide semiconductor layer, the first gate electrode being arranged on a surface of the oxide semiconductor layer opposite to the substrate, a first insulating layer between the first gate electrode and the oxide semiconductor layer, and a first oxide conductive layer and a second oxide conductive layer between the oxide semiconductor layer and the substrate, the first oxide conductive layer and the second oxide conductive layer each including a region in contact with the oxide semiconductor layer. The first region and the second region include a region overlapping each other, the first region is arranged on the substrate side, and the second region is arranged on a side opposite to the substrate. A carrier concentration of the second region is lower than a carrier concentration of the first region.

A transistor in an embodiment according to the present invention includes an oxide semiconductor layer on a substrate, the oxide semiconductor layer having a first surface on a side of the substrate and a second surface opposite to the first surface, a first gate electrode including a region overlapping the oxide semiconductor layer, the first gate electrode being arranged on the second surface, a first insulating layer between the first gate electrode and the oxide semiconductor layer, and a first oxide conductive layer and a second oxide conductive layer between the oxide semiconductor layer and the substrate, the first oxide conductive layer and the second oxide conductive layer each including a region in contact with the first substrate. A carrier concentration of the second surface side is lower than a carrier concentration of the first surface side.

A method of manufacturing a transistor in an embodiment according to the present invention, the method includes, forming a first oxide conductive layer and a second oxide conductive layer on a substrate, forming an oxide semiconductor layer including a first region and a second region, the first region contacting with the first oxide conductive layer and the second oxide conductive layer, and the second region contacting with the first region on the side opposite to the substrate side, forming a first insulating layer covering the oxide semiconductor layer, and forming a first gate electrode on the first insulating layer, the first gate electrode having a region overlapping with the oxide semiconductor layer. A carrier concentration of the second region is lower than a carrier concentration of the first region.

DESCRIPTION OF EMBODIMENTS

Figure 1:
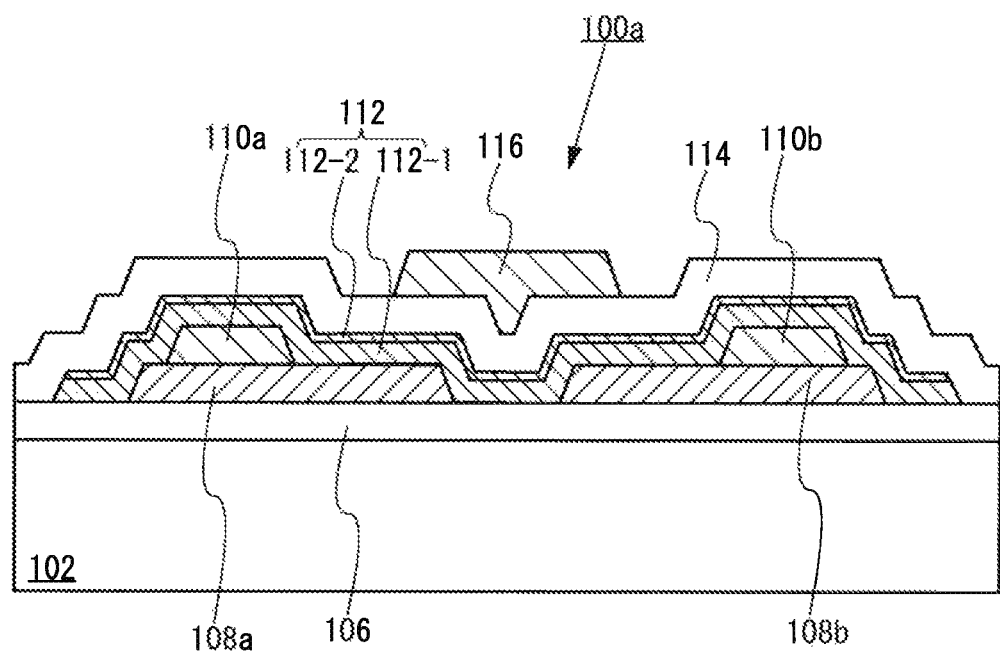
FIG. 1 is a cross-sectional view showing a structure of a transistor in an embodiment according to the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In the specification and the claims, an expression that a component is "on" another component encompasses a case where such a component is in contact with the another component and also a case where such a component is above or below the another component, namely, a case where still another component is provided between such a component and the another component, unless otherwise specified.

An oxide semiconductor is a type of compound semiconductor containing a metal material and oxygen. Therefore, in a process of manufacturing a thin film transistor, it is required to control the composition and the oxygen deficiency of the oxide semiconductor, and also to control the impurities. A thin film transistor of a bottom-gate type described in Japanese Laid-Open Patent Publication No. 2010-153842 has the following problems when being included in a liquid crystal display device or an organic EL display device. In the liquid crystal display device, a back channel-side potential is easily influenced by a common potential. In the case where an organic EL element of an inverted stack structure is provided in a pixel of the organic EL display device, a back channel-side potential is easily influenced by the positive potential of an anode electrode, which is significantly serious. In addition, in the case where the source electrode and the drain electrode are formed of copper (Cu), the copper (Cu) atoms have a strong action as carrier (electron) killers against an n-type oxide semiconductor. In the structure described in Japanese Laid-Open Patent Publication No. 2010-153842, there is a problem that the copper (Cu) atoms contaminate the channel region. In order to control the characteristics of the thin film transistor by the device structure, provision of a back gate, for example, is considered to be effective. However, a thin film transistor including a back gate has problems of being complicated in the structure and of requiring a larger number of photomasks to be manufactured. In some embodiments described below, a transistor and a display device capable of overcoming one or a plurality of these problems will be described.

Embodiment 1

1-1. Transistor Structure

FIG. 1 is a cross-sectional view showing a structure of a transistor 100a in embodiment 1 according to the present invention. The transistor 100a includes a second insulating layer 106, an oxide semiconductor layer 112, a first insulating layer 114, and a first gate electrode 116, which are provided on a substrate 102 having an insulating surface.

The first gate electrode 116 is located to face one surface of the oxide semiconductor layer 112 (surface opposite to a surface facing the substrate 102). The first insulating layer 114 is located between the oxide semiconductor layer 112 and the first gate electrode 116. The first gate electrode 116 and the oxide semiconductor layer 112 are located to partially overlap each other while having the first insulating layer 114 between the first gate electrode 116 and the oxide semiconductor layer 112. In the transistor 100a, a channel is formed in a region where the oxide semiconductor layer 112 overlaps the first gate electrode 116. The first insulating layer 114 acts as a gate insulating film in a region where the oxide semiconductor layer 112 and the first gate electrode 116 overlap each other.

The second insulating layer 106 is located between the oxide semiconductor layer 112 and the substrate 102. A first oxide conductive layer 108a and a second oxide conductive layer 108b are located between the oxide semiconductor layer 112 and the second insulating layer 106. The first oxide conductive layer 108a and the second oxide conductive layer 108b are provided in contact with the oxide semiconductor layer 112. The first oxide conductive layer 108a and the second oxide conductive layer 108b are located such that one end part of the first oxide conductive layer 108a and one end part of the second oxide conductive layer 108b overlap the first gate electrode 116. One of the first oxide conductive layer 108a and the second oxide conductive layer 108b acts as a source region, and the other of the first oxide conductive layer 108a and the second oxide conductive layer 108b acts as a drain region. In the structure shown in FIG. 1, the first oxide conductive layer 108a and the second oxide conductive layer 108b are located such that one end part of the first oxide conductive layer 108a and one end part of the second oxide conductive layer 108b overlap the first gate electrode 116. Therefore, the oxide semiconductor layer 112 does not include any offset region (region having a high resistance). Thus, the level of on-current is increased.

A first line 110a is provided in contact with the first oxide conductive layer 108a, and a second line 110b is provided in contact with the second oxide conductive layer 108b. The first line 110a is located between the first oxide conductive layer 108a and the oxide semiconductor layer 112, and the second line 110b is located between the second oxide conductive layer 108b and the oxide semiconductor layer 112. The first line 110a and the second line 110b are respectively located in contact with the first oxide conductive layer 108a and the second oxide conductive layer 108b. This decreases the number of photolithography steps as described below.

1-2. Oxide Semiconductor Layer

The oxide semiconductor layer 112 is formed of a transparent oxide semiconductor containing one or a plurality of elements selected from indium (In), zinc (Zn), gallium (Ga), tin (Sn), aluminum (Al), tungsten (W) and silicon (Si). For example, an oxide semiconductor material used to form the oxide semiconductor layer 112 may be one of a four-component oxide material, a three-component oxide material, and a two-component oxide material showing semiconductor characteristics. Examples of the four-component oxide material include an $In_2O_3$—$Ga_2O_3$—$SnO_2$—$ZnO$-based oxide material, and the like. Examples of the three-component oxide material include an $In_2O_3$—$Ga_2O_3$—$SnO_2$-based oxide material, an $In_2O_3$—$Ga_2O_3$—$ZnO$-based oxide material, an $In_2O_3$—$SnO_2$—$ZnO$-based oxide material, an $In_2O_3$—$Al_2O_3$—$ZnO$-based oxide material, a $Ga_2O_3$—$SnO_2$—$ZnO$-based oxide material, a $Ga_2O_3$—$Al_2O_3$—$ZnO$-based oxide material, an $SnO_2$—$Al_2O_3$—$ZnO$-based oxide material, and the like. Examples of the two-component oxide material include an $In_2O_3$—$SnO_2$-based oxide material, an $In_2O_3$—$ZnO$-based oxide material, an $SnO_2$—$ZnO$-based oxide material, an $Al_2O_3$—$ZnO$-based oxide material, a $Ga_2O_3$—$ZnO$-based oxide material, an $SnO_2$—$SiO_2$-based oxide material, an $In_2O_3$—$W_2O_3$-based oxide material, and the like. It is especially preferred to use an $In_2O_3$—$Ga_2O_3$—$SnO_2$-based oxide material. The above-listed oxide semiconductors may each contain tantalum (Ta), scandium (Sc), nickel (Ni), lanthanum (La), magnesium (Mg), hafnium (Hf), yttrium (Y) or titanium (Ti). The In—Ga—Sn—O-based oxide materials listed above are each an oxide material containing at least In, Ga and Sn. There is no specific limitation on the composition ratio thereof. Regarding the composition ratio, it is preferred that each of the In—Ga—Sn—O-based oxide materials contains In at 60 atm % to 70 atm %, contains Ga at 10 atm % to 25 atm %, and contains Sn at 5 atm % to 30 atm % with respect to the total of In, Ga and Sn. In other words, the oxide semiconductor layer 112 may be formed of a thin film represented by chemical formula $InMO_3(ZnO)_m$ (m>0). M represents one or a plurality of metal elements selected from Sn, Ga, Zn, Sc, La, Y, Ni, Al, Mg, Ti, Ta, W, Hf and Si. The oxide material contained in each of the four-component oxide materials, the three-component oxide materials and the two-component oxide materials listed above is not limited to having a stoichiometric composition, but may have a composition shifted from the stoichiometric composition.

The oxide semiconductor layer 112 includes a first region 112-1 and a second region 112-2 stacked from the substrate 102 side. The first region 112-1 is located at a first surface, of the oxide semiconductor layer 112, facing the substrate 102, and the second region 112-2 is located at a second surface opposite to the first surface. In the oxide semiconductor layer 112, the first region 112-1 is thicker than the second region 112-2. It is preferred that the first region 112-1 of the oxide semiconductor layer 112 has a thickness of 30 nm to 100 nm. It is preferred that the second region 112-2 of the oxide semiconductor layer 112 has a thickness of 2 nm to 10 nm. The thickness of the first region 112-1 or the second region 112-2 is not limited to such a range. It is sufficient that the oxide semiconductor layer 112 including the first region 112-1 and the second region 112-2 has a thickness of 20 nm to 100 nm, for example, 30 nm to 60 nm.

The first region 112-1 and the second region 112-2 of the oxide semiconductor layer 112 are different from each other in the carrier concentration (concentration of the carrier present in a larger amount). The carrier concentration of the second region 112-2 is of a smaller value than that of the carrier concentration of the first region 112-1. It is preferred that the carrier concentration of the first region 112-1 is about $1\times10^{15}/cm^3$ to about $5\times10^{18}/cm^3$. It is preferred that the carrier concentration of the second region 112-2 is about $1\times10^{11}/cm^3$ to about $1\times10^{15}/cm^3$. In correspondence with this, it is preferred that the first region 112-1 of the oxide semiconductor layer 112 has a conductivity of about $1\times10^{-5}$ S/cm to about 10 S/cm, and that the second region 112-2 of the oxide semiconductor layer 112 has a conductivity of about $1\times10^{-10}$ S/cm to about $1\times10^{-5}$ S/cm. It is also preferred that the second region 112-2 of the oxide semiconductor layer 112 has a carrier mobility smaller than a carrier mobility of the first region 112-1 of the oxide semiconductor layer 112.

The first region 112-1 and the second region 112-2 of the oxide semiconductor layer 112 may be different from each other in the crystallinity. It is preferred that the second region 112-2 of the oxide semiconductor layer 112 has a crystallization ratio higher than a crystallization ratio of the first region 112-1. The first region 112-1 of the oxide semiconductor layer 112 may be in a state of an amorphous phase, or a mixed state of an amorphous phase and a nano-crystalline phase. The second region 112-2 of the oxide semiconductor layer 112 may be in a state of a nano-crystalline phase or a mixed state of an amorphous phase and a nano-crystalline phase. In the case of being such a mixed state, the second region 112-2 may have a ratio of the nano-crystalline phase higher than that of the first region 112-1, and may further contain a polycrystalline phase.

The oxide semiconductor layer 112 may be formed by sputtering. The first region 112-1 and the second region 112-2 may be formed with different sputtering conditions. For example, the first region 112-1 of the oxide semiconductor layer 112 is formed by use of noble gas such as Ar or the like as sputtering gas, whereas the second region 112-2 is formed by use of noble gas such as Ar or the like and oxygen gas as sputtering gas. The partial pressure of oxygen may be made higher for forming the second region 112-2 than for forming the first region 112-1, so that the second region 112-2 has less donor defects and thus has an increased crystallization ratio. As a result, the carrier concentration of the second region 112-2 is made lower than that of the first region 112-1, and in correspondence with this, the conductivity of the second region 112-2 is made lower than that of the first region 112-1. Oxygen may be incorporated into the sputtering gas for forming the second region 112-2 (the partial pressure of oxygen is increased), so that the second region 112-2 is formed of a finer film (denser film) than that of the first region 112-1.

The first region 112-1 and the second region 112-2 of the oxide semiconductor layer 112 may have the same composition but have different crystallization ratios from each other. Alternatively, the first region 112-1 and the second region 112-2 of the oxide semiconductor layer 112 may be formed of the same type of metal oxide material but have different compositions from each other. Still alternatively, the first region 112-1 and the second region 112-2 of the oxide semiconductor layer 112 may be formed of metal oxide materials having different compositions from each other. The first region 112-1 and the second region 112-2 may be formed in any of the above-described manners, so as to be different from each other in the carrier concentration and the conductivity.

Figure 2A:
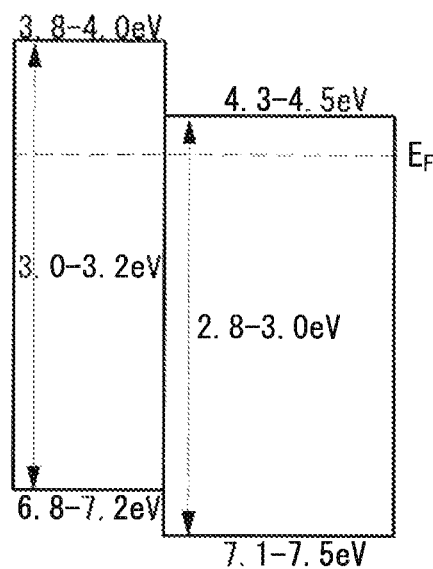
FIG. 2A is an energy band diagram of an oxide semiconductor layer in an embodiment according to the present invention.

FIG. 2A shows an example of band diagram of the oxide semiconductor layer 112 in the case where the first region 112-1 and the second region 112-2 are different from each other in the crystallization ratio. For example, the oxide semiconductor layer 112 may be formed of an $In_2O_3$—$Ga_2O_3$—ZnO-based oxide material, and the first region 112-1 may be in an amorphous state or in a mixed state of an amorphous phase and a nano-crystalline phase. The second region 112-2 may be in a nano-crystalline phase or a mixed state of an amorphous phase and a nano-crystalline phase. It is preferred that the ratio of the nano-crystalline component is higher in the second region 112-2 than in the first region 112-1.

Although the oxide semiconductor layer 112 has a single composition, the first region 112-1 and the second region 112-2 are different from each other in the crystallization ratio. Therefore, the first region 112-1 and the second region 112-2 are different from each other in the bandgap. The bandgap of the first region 112-1 is 2.8 eV to 3.0 eV, whereas the bandgap of the second region 112-2 is 3.0 eV to 3.2 eV. The bandgap of the first region 112-1 is of a smaller value than that of the bandgap of the second region 112-2. In correspondence with the difference in the crystallization ratio, the first region 112-1 has a work function larger than a work function of the second region 112-2. Therefore, in the band diagram of the first region 112-1 and the second region 112-2 in a joined state, the second region 112-2 has an energy (Ec) higher than that of the first region 112-1 at the bottom of the conduction band.

In the case where the oxide semiconductor layer 112 having such a structure is included in the transistor 100a, the second region 112-2 is provided, between the first insulating layer 114 and the first region 112-1, to form an energy barrier to the electrons in the conduction band. With such a structure, the transistor 100a includes a channel region separated from an interface between the first insulating layer 114 and the oxide semiconductor layer 112. The channel is buried in the oxide semiconductor layer 112 and is operable, so that the transistor 100a prevents the carriers (electrons) from being trapped at the interface between the first insulating layer 114 and the oxide semiconductor layer 112.

Figure 2B:
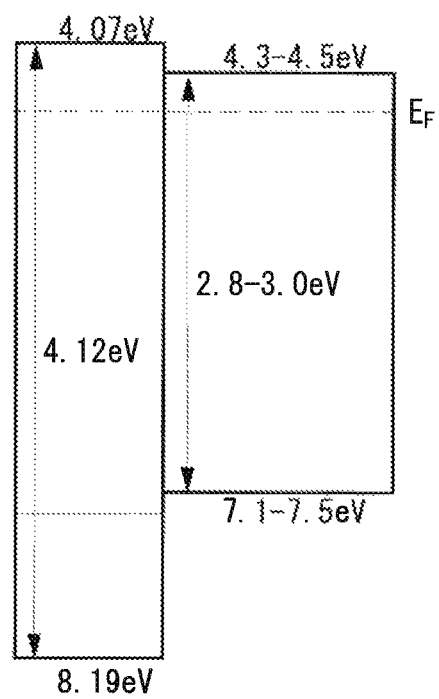
FIG. 2B is an energy band diagram of an oxide semiconductor layer in an embodiment according to the present invention.

FIG. 2B shows an example of band diagram of the oxide semiconductor layer 112 in the case where the first region 112-1 and the second region 112-2 are formed of oxide materials having different compositions from each other. For example, the first region 112-1 may be formed of an $In_2O_3$—$Ga_2O_3$—$SnO_2$—ZnO-based oxide material, an $In_2O_3$—$Ga_2O_3$—$SnO_2$-based oxide material or an $In_2O_3$—$Ga_2O_3$—ZnO-based oxide material. The second region 112-2 may be formed of a gallium oxide material such as a $Ga_2O_3$-based oxide material, a $GaSnO_x$-based oxide material, a $GaSiO_x$-based oxide material or the like. The gallium oxide material is a wide gap material, and may form a bandgap of 4 eV or larger. For example, the bandgap of the $In_2O_3$—$Ga_2O_3$—$SnO_2$-based oxide material usable to form the first region 112-1 is 2.8 eV to 3.0 eV. The oxide materials usable to form the second region 112-2 have the following bandgaps. The bandgap of a-$Ga_2O_3$ is 4.3 eV. The bandgap of a-$GaSnO_x$ is 4.0 eV. The bandgap of a-$GaSiO_x$ is 4.5 eV or larger. Thus, the bandgap of the second region 112-2 may be larger than that of the first region 112-1 by at least 1.0 eV.

The oxide material used to form the first region 112-1 may further contain 2 atm % to 5 atm % of silicon (Si). Silicon contained in the oxide material used to form the first region 112-1 improves the field effect mobility and the heat resistance of the transistor 100a. As a result, the threshold voltage is made controllable.

As shown in FIG. 2B, the first region 112-1 and the second region 112-2 formed of oxide semiconductor materials of different compositions are different from each other in the bandgap. The bandgap of the first region 112-1 is smaller than that of the second region 112-2, and the work function of the first region 112-1 is larger than that of the second region 112-2. Therefore, like in FIG. 2A, in the band diagram of the first region 112-1 and the second region 112-2 in a joined state, the second region 112-2 has an energy (Ec) higher than that of the first region 112-1 at the bottom of the conduction band. With such a structure, the transistor 100a includes a channel region separated from an interface between the first insulating layer 114 and the oxide semiconductor layer 112. In other words, the transistor 100a prevents the carriers (electrons) from being trapped at the interface between the first insulating layer 114 and the oxide semiconductor layer 112.

In the case where the first region 112-1 and the second region 112-2 are formed of oxide semiconductor layers containing different elements from each other, it is sufficient that the bandgap of the Ga oxide material used to form the second region 112-2 is larger by at least 1 eV than the bandgap of the oxide material used to form the first region 112-1. For example, the first region 112-1 of the oxide semiconductor layer 112 may be formed of an $In_2O_3$—$Ga_2O_3$—ZnO-based oxide material, whereas the second region 112-2 may be formed of a $Ga_2O_3$-based oxide material.

In the case where an oxide semiconductor layer is formed by sputtering, the ion sheath is extinguished at the stage of stopping glow discharge. After this, sputtered particles remaining in the gas phase are deposited to form a low-density region. This low-density region is considered to influence the transistor characteristics. In the transistor 100a in this embodiment, the oxide semiconductor layer 112 includes the first region 112-1 and the second region 112-2 to overcome this problem.

In the oxide semiconductor layer 112 of the transistor 110a, the second region 112-2 is lower in the conductivity, and thus in the carrier concentration, than the first region 112-1, so that the carriers do not easily flow at the interface between the first insulating layer 114 and the oxide semiconductor layer 112. The second region 112-2 is higher in the crystallization ratio than the first region 112-1, so that a finer film is formed in the second region 112-2. The second region 112-2 is wider in the bandgap of the energy band than the first region 112-1, so that a channel region is formed in the oxide semiconductor layer 112 (namely, a buried channel-type transistor is formed).

With such a structure, the transistor 100a decreases the level of charges trapped at the interface between the first insulating layer 114 and the oxide semiconductor layer 112 and prevents the threshold voltage from being shifted. Thus, the transistor 100a is realized as a normally-off transistor. Since the transistor 100a is of a buried channel-type, the leak current is suppressed from flowing at the interface between the first insulating layer 114 and the oxide semiconductor layer 112, and thus the level of off-current is decreased. As shown in FIG. 1, the first oxide conductive layer 108a and the second oxide conductive layer 108b acting as the source region and the drain region are in contact with the first region 112-1, which has a high conductivity. Therefore, the level of on-current is increased. As a result, the transistor 100a obtains a ratio of an on-current and an off current (on/off ratio) of about $1\times10^9$ to about $1\times10^{12}$.

An intermediate region, formed of an oxide semiconductor, that has a carrier concentration changing step by step or continuously may be present between the first region 112-1 and the second region 112-2. The intermediate region of the oxide semiconductor may be formed in the oxide semiconductor layer in which the first region 112-1 and the second region 112-2 are formed, or may be separately formed in a different oxide semiconductor layer.

1-3. Oxide Conductive Layer

The first oxide conductive layer 108a and the second oxide conductive layer 108b are formed of a metal oxide material, a metal nitride material, or a metal oxide nitride material, all of which are conductive. Examples of the metal oxide material usable for the first oxide conductive layer 108a and the second oxide conductive layer 108b include indium tin oxide ($In_2O_3 \cdot SnO_2$: ITO), indium tin zinc oxide ($In_2O_3 \cdot SnO_2 \cdot ZnO$: ITZO), indium tin silicon oxide ($In_2O_3 \cdot SnO_2 \cdot SiO_2$: ITSO), tin oxide ($SnO_2$), aluminum zinc tin oxide ($Al_2O_3 \cdot ZnO \cdot SnO_2$: AZTO), gallium zinc tin oxide ($Ga_2O_3 \cdot ZnO \cdot SnO_2$: GZTO), zinc tin oxide ($ZnO \cdot SnO_2$: ZTO), gallium tin oxide ($Ga_2O_3 \cdot SnO_2$: GTO), and the like. Such a metal oxide material forms a good ohmic contact with the first region 112-1 of the oxide semiconductor layer 112.

Examples of the metal oxide material usable for the first oxide conductive layer 108a and the second oxide conductive layer 108b also include titanium oxide ($TiO_x$) and the like. Examples of the metal nitride material usable for the first oxide conductive layer 108a and the second oxide conductive layer 108b include titanium nitride ($TiN_x$), zirconium nitride ($ZrN_x$), and the like. Examples of the metal oxide nitride material usable for the first oxide conductive layer 108a and the second oxide conductive layer 108b include titanium oxide nitride ($TiO_xN_y$), tantalum oxide nitride ($TaO_xN_y$), zirconium oxide nitride ($ZrO_xN_y$), hafnium oxide nitride ($HfO_xN_y$), and the like. The metal oxide materials, the metal nitride materials, and the metal oxide nitride materials described above may contain trace amount of metal element in order to improve the conductivity. For example, titanium oxide doped with niobium ($TiO_x$:Nb) may be used. A high melting point metal silicide oxide such as $TiSiO_x$ or the like may be used. Use of such a metal oxide material, such a metal nitride material, or such a metal oxide nitride material that exhibits an n-type electric conductivity guarantees stability even in the case where the first oxide conductive layer 108a and the second oxide conductive layer 108b are in contact with the first line 110a and the second line 110b, respectively. Namely, use of such a metal oxide material, such a metal nitride material, or such a metal oxide nitride material prevents an oxidation-reduction reaction (local cell reaction) with aluminum (Al) having a lower potential.

1-4. Insulating Layers

The second insulating layer 106 and the first insulating layer 114 are formed of an inorganic insulating material. Examples of the inorganic insulating material usable for the second insulating layer 106 and the first insulating layer 114 include silicon oxide, silicon nitride, silicon oxide nitride, aluminum oxide, and the like. The second insulating layer 106 and the first insulating layer 114 each have a single-layer structure, or a stack structure including a plurality of films, formed of such an organic insulating material. For example, the second insulating layer 106 may include a silicon nitride film and a silicon oxide film stacked in this order from the substrate 102 side. The first insulating layer 114 may include a silicon oxide film and a silicon nitride film stacked in this order from the oxide semiconductor layer 112 side. The second insulating layer 106 and the first insulating layer 114, in the case of including a plurality of organic insulating films, alleviate the action of an internal stress and also improve the barrier property against water vapor or the like.

It is preferred that surfaces of the second insulating layer 106 and the first insulating layer 114 that are in contact with the oxide semiconductor layer 112 are formed of a silicon oxide film, a silicon oxide nitride film or an aluminum oxide film. Since such an insulating layer containing an oxide inorganic insulating material is in contact with the oxide semiconductor layer 112 (in other words, an insulating layer containing a nitride inorganic insulating material is not in contact with the oxide semiconductor layer 112), diffusion of impurities such as hydrogen or the like, which generates a donor in the oxide semiconductor layer 112, is suppressed. Since the oxide insulating film is provided in contact with the oxide semiconductor layer 112, a defect (donor) caused by oxygen deficiency is prevented from being caused to the oxide semiconductor layer 112.

A silicon-based material of the silicon oxide film that is included in the second insulating layer 106 and the first insulating layer 114 and is in contact with the oxide semiconductor layer 112 may be represented by $Si_\alpha X_\beta$. In this formula, it is preferred that X contains at least one of a cyanate group, i.e., —O—C≡N, an isocyanate group, i.e., —N=C=O, a cyano group, i.e., —C≡N, a diazo group, i.e., =$N_2$, an azide group, i.e., —$N_3$, a nitroso group, i.e., —NO, and a nitro group, i.e., —$NO_2$. It is preferred that α is 1 to 3, and that β is 1 to 8. For example, it is preferred to use any one of tetracyanatesilane represented by structural formula (1), tetraisocyanatesilane represented by structural formula (2), tetracyanosilane represented by structural formula (3), 1,1,1,1-isocyanatecyanatecyanonitrosilane represented by structural formula (4), 1,1-diisocyanate 1,1-dicyanatesilane represented by structural formula (5), hexaisocyantesilane represented by structural formula (6) and octaisocyanatesilane represented by structural formula (7). The structural formulas are shown below. In the formation of a silicon oxide film, it is preferred to use, as oxygen gas, at least one of $O_2$, $O_3$, NO, $NO_2$, $N_2O$, $N_2O_3$, $N_2O_4$, $N_2O_5$, CO and $CO_2$.

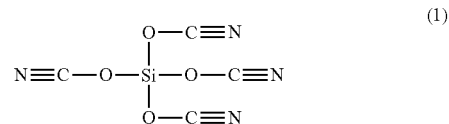

(1)

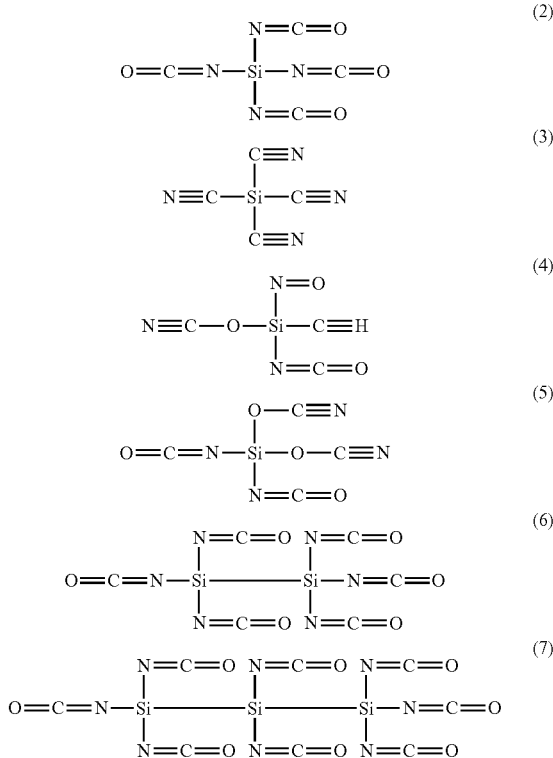

As described above, a hydrogen-free silicon-based material may be used for the silicon oxide film that is included in the second insulating layer 106 and the first insulating layer 114 and is in contact with the oxide semiconductor layer 112, so that the diffusion of impurities such as hydrogen or the like that generates a donor in the oxide semiconductor layer 112 is more suppressed.

For example, the silicon oxide film that is included in the second insulating layer 106 and the first insulating layer 114 and is in contact with the oxide semiconductor layer 112 may be formed of a tetraisocyanatesilate-based material by use of oxygen-containing gas such as oxygen ($O_2$) gas, nitrous oxide ($N_2O$) gas or the like. In the case where a parallel flat plate-type plasma CVD device is used to form the silicon oxide film, it is preferred that the film formation is performed at a reaction gas pressure of 13 Pa or higher and 666 Pa or lower and a substrate temperature of 200° C. to 350° C. In the case where an ICP-DVD device is used, it is preferred that the film formation is performed at a reaction gas pressure of 1.3 Pa or higher and 66 Pa or lower and a substrate temperature of 200° C. to 300° C.

It is preferred that the second insulating layer 106 and the first insulating layer 114 each further include a silicon nitride film stacked on the silicon oxide film on the side opposite to the oxide semiconductor layer 112. It is preferred that a silicon-based material of the silicon nitride film is silicon tetrafluoride ($SiF_4$) gas. In the formation of the silicon nitride film, it is preferred to use nitrogen ($N_2$) as a supply source of nitrogen atoms.

As described above, a hydrogen-free silicon-based material may be used for the silicon nitride film that is included in the second insulating layer 106 and the first insulating layer 114 and is in contact with the silicon oxide film, so that an adverse influence of hydrogen by which the oxide semiconductor layer 112 is reduced to be conductive or that oxygen deficiency is caused to increase the carrier concentration is suppressed. For example, as the silicon nitride film that is included in the second insulating layer 106 and the first insulating layer 114 and is in contact with the silicon oxide film, a fluorine-containing silicon nitride (P—$SiN_x$:F) film may be formed by use of an inductively coupled plasma chemical vapor deposition (ICP-CVD) device and by use of $SiF_4$ gas and $N_2$ gas.

The second insulating layer 106 and the first insulating layer 114 formed of hydrogen-free materials as described above may have a hydrogen content suppressed to about $10^{18}/cm^3$ to about $10^{20}/cm^3$. In the transistor 100a in this embodiment, the second insulating layer 106 and the first insulating layer 114 may each adopt a structure in which a silicon oxide film formed of a tetraisocyanatesilane-based material, and a fluorine-containing silicon nitride film ($SiN_x$:F) formed by use of $SiF_4$ as a material, are stacked on each other. With such a structure, the carrier concentration of the oxide semiconductor layer 112 is suppressed from being increased, and thus the threshold voltage of the transistor 100a is suppressed from being fluctuated.

1-5. Gate Electrodes

The first gate electrode 116 is formed of a metal material such as aluminum (Al), molybdenum (Mo), tungsten (W), zirconium (Zr) or the like. For example, the first gate electrode 116 may be formed of a film of aluminum (Al), a molybdenum-tungsten alloy (MoW), or the like. The first gate electrode 116 may be formed of an aluminum alloy, a copper alloy, or a silver alloy. Examples of the aluminum alloy usable for the first gate electrode 116 include an aluminum-neodymium alloy (Al—Nd), an aluminum-neodymium-nickel alloy (Al—Nd—Ni), an aluminum-carbon-nickel alloy (Al—C—Ni), a copper-nickel alloy (Cu—Ni), and the like. Alternatively, the first gate electrode 116 may be formed of a transparent conductive film of indium tin oxide (ITO), indium zinc oxide (IZO), zinc oxide (ZnO) or the like. Still alternatively, an electrode having a stack structure of three layers of Mo/Al/Mo, Mo/Cu/Mo or the like is effective. Namely, a three-layer stack structure in which any of the above-listed metal materials is sandwiched by oxidation-preventive layers containing molybdenum (Mo), zirconium (Zr), titanium (Ti) or an alloy thereof may be used.

1-6. Lines

The first line 110a and the second line 110b are formed of a metal material having a high conductivity such as aluminum (Al), copper (Cu) or the like. For example, the first line 110a and the second line 110b are formed of an aluminum alloy, a copper alloy, or a silver alloy. Examples of the aluminum alloy usable for the first line 110a and the second line 110b include an aluminum-neodymium alloy (Al—Nd), an aluminum-titanium alloy (Al—Ti), an aluminum-silicon alloy (Al—Si), an aluminum-neodymium-nickel alloy (Al—Nd—Ni), an aluminum-carbon-nickel alloy (Al—C—Ni), a copper-nickel alloy (Cu—Ni), and the like. Use of such a metal material provides heat resistance and decreases the line resistance. Alternatively, a line having a stack structure of three layers of Mo/Al/Mo, Mo/Cu/Mo or the like is effective. Namely, a three-layer stack structure in which any of the above-listed metal materials is sandwiched by oxidation-preventive layers containing molybdenum (Mo), zirconium (Zr), titanium (Ti) or an alloy thereof may be used.

1-7. Operation and Function of the Transistor

The transistor 100a includes the first gate electrode 116 provided on one surface of the oxide semiconductor 112 (surface opposite to the surface facing the substrate 102). In a region where the oxide semiconductor layer 112 overlaps the first gate electrode 116, the channel is formed. The second region 112-2 of the oxide semiconductor layer 112 has a carrier concentration lower than that of the first region 112-1. Therefore, the transistor 100a includes the channel formed in the first region 112-1 in the oxide semiconductor layer 112. The electric current flows in an area, in the first region 112-1 of the oxide semiconductor layer 112, that is closer to the second region 112-2 (on the first gate electrode 116 side), so that the field effect mobility of the transistor 100a is improved.

Figure 3:
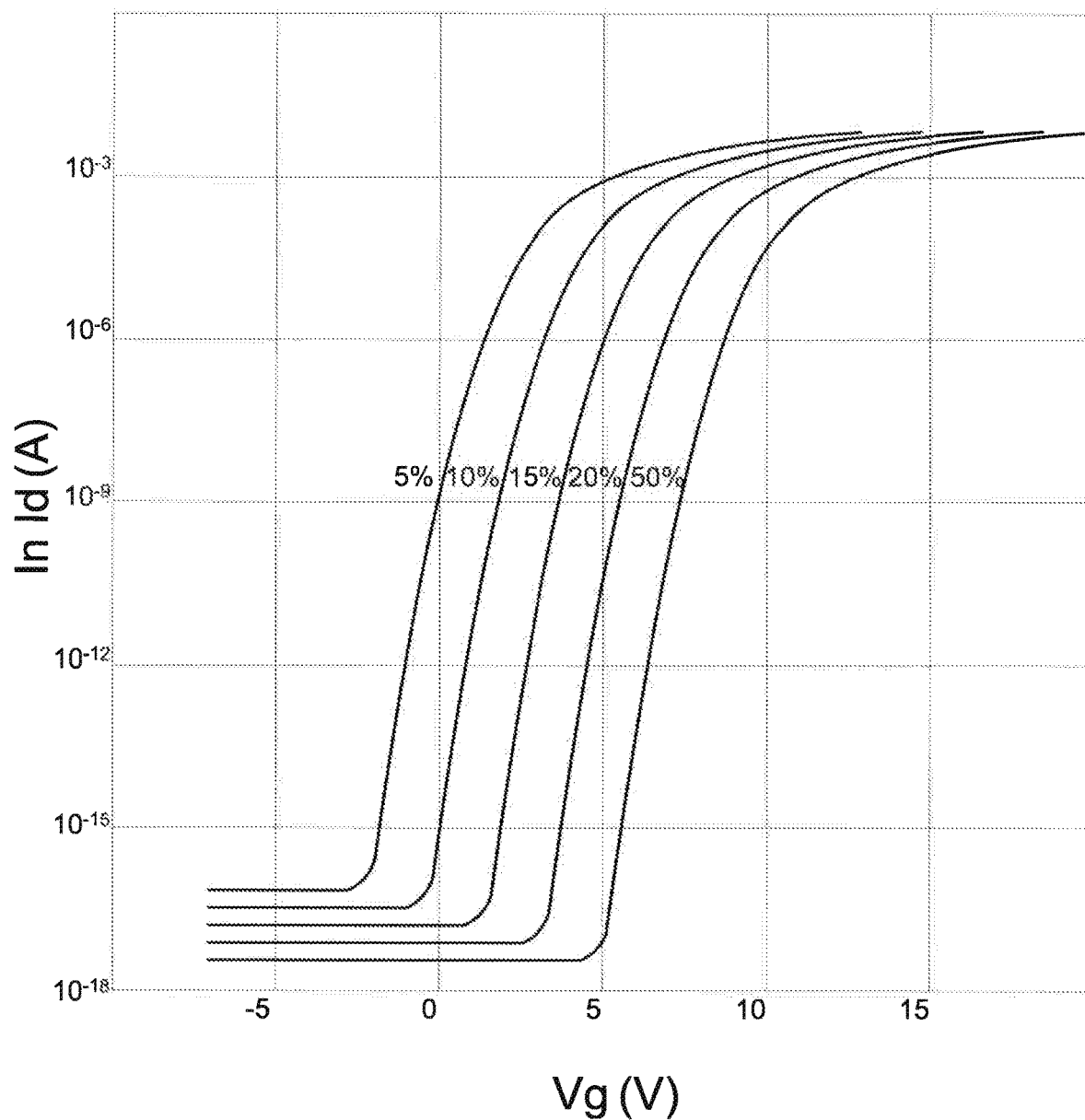
FIG. 3 is a diagram showing electrical characteristics of a transistor in an embodiment according to the present invention.

In the transistor 100a in this embodiment, the second region 112-2 of the oxide semiconductor layer 112 is formed by use of mixed gas of noble gas and oxygen ($O_2$). The partial pressure of oxygen used to form the second region 112-2 of the oxide semiconductor layer 112 is higher than the partial pressure of oxygen used to form the first region 112-1. FIG. 3 shows an electric characteristic (Vg-Id characteristic) of a transistor when the partial pressure of oxygen used to form the second region 112-2 of the oxide semiconductor layer 112 is changed. As shown in FIG. 3, the partial pressure of oxygen used to form the second region 112-2 of the oxide semiconductor layer 112 may be changed to 5%, 10%, 15%, 20% and 50%, so that the threshold voltage of the transistor is adjusted. For the transistor 100a in this embodiment, the threshold voltage is preferably in the range of 0 V to 5 V, and is more preferably in the range of 0.5 V to 3 V. The first insulating layer 114 may be formed with no use of reducing gas, so that the substrate temperature is allowed to be raised to about 250° C. to about 350° C. at the time of film formation. This makes it unnecessary to perform annealing at a high temperature for a long time after the formation of the transistor 100a is completed. Thus, the reliability is improved. In the case where the second region 112-2 of the oxide semiconductor layer 112 is formed at a partial pressure of oxygen in the range of 15% to 20%, the change in the threshold voltage, caused due to a stress such as heat or the like, is decreased. Therefore, even if annealing is performed several times at 220° C. to 250° C. in order to form a color filter after the formation of the transistor 100a is completed, the transistor characteristics are maintained stably.

The transistor 100a includes the first oxide conductive layer 108a and the second oxide conductive layer 108b located on one surface of the oxide semiconductor layer 112 (surface facing the substrate 102). Therefore, the first oxide conductive layer 108a and the second oxide conductive layer 108b are in contact with the first region 112-1 of the oxide semiconductor layer 112. The first region 112-1 of the oxide semiconductor layer 112 has a conductivity higher than that of the second region 112-2. Therefore, the contact resistance between the first oxide conductive layer 108a and the first region 112-1 of the oxide semiconductor layer 112, and the contact resistance between the second oxide conductive layer 108b and the first region 112-1 of the oxide semiconductor layer 112, are decreased. In other words, the first oxide conductive layer 108a and the second oxide conductive layer 108b are in contact with the surface, of the oxide semiconductor layer 112, that faces the substrate 102, so that the contact resistance is decreased.

1-8. Manufacturing Method

Figure 4A:
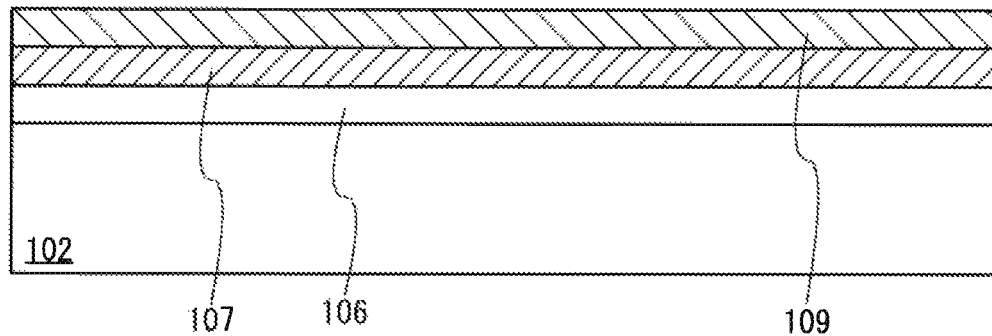
FIG. 4A shows a method for producing the transistor in an embodiment according to the present invention, and shows a stage of forming a second insulating layer, a second conductive film, and a third conductive film.

Now, a method of manufacturing the transistor 100a will be described. FIG. 4A shows a stage of forming the second insulating layer 106, a second conductive film 107, and a third conductive film 109 on a top surface of the substrate 102. From the second conductive film 107, the first oxide conductive layer 108a and the second oxide conductive layer 108b are formed. From the third conductive film 109, the first line 110a and the second line 110b are formed.

The substrate 102 is, for example, a transparent insulating substrate. The transparent insulating substrate is formed of non-alkali glass such as aluminosilicate glass, aluminoborosilicate glass or the like, or quartz. Among various types of transparent insulating substrate, a flexible transparent insulating substrate is formed of, for example, transparent polyimide, transparent polyamide or the like.

The second insulating layer 106 is formed of an inorganic insulating film. For example, the second insulating layer 106 may be a film formed of one or a plurality of materials selected from silicon oxide, silicon nitride, and silicon oxide nitride by plasma CVD (Chemical Vapor Deposition). Alternatively, the second insulating layer 106 may be an aluminum oxide film. In this case, the second insulating layer 106 is formed by sputtering by use of an alumina sputtering target.

The second conductive film 107 used to form the first oxide conductive layer 108a and the second oxide conductive layer 108b is formed of a metal oxide material, a metal nitride material, a metal oxide nitride material, or a high melting point metal silicide oxide material, all of which are conductive. The second conductive film 107 is formed by sputtering. The second conductive film 107 used to form the first oxide conductive layer 108a and the second oxide conductive layer 108b is formed of, for example, a conductive metal oxide material to have a thickness of 30 nm to 200 nm. The third conductive film 109 used to form the first line 110a and the second line 110b is formed of a metal material or an alloy material by sputtering. The third conductive film 109 used to form the first line 110a and the second line 110b is formed of a metal material to have a thickness of 200 nm to 2000 nm in order to have a low resistance.

Figure 4B:
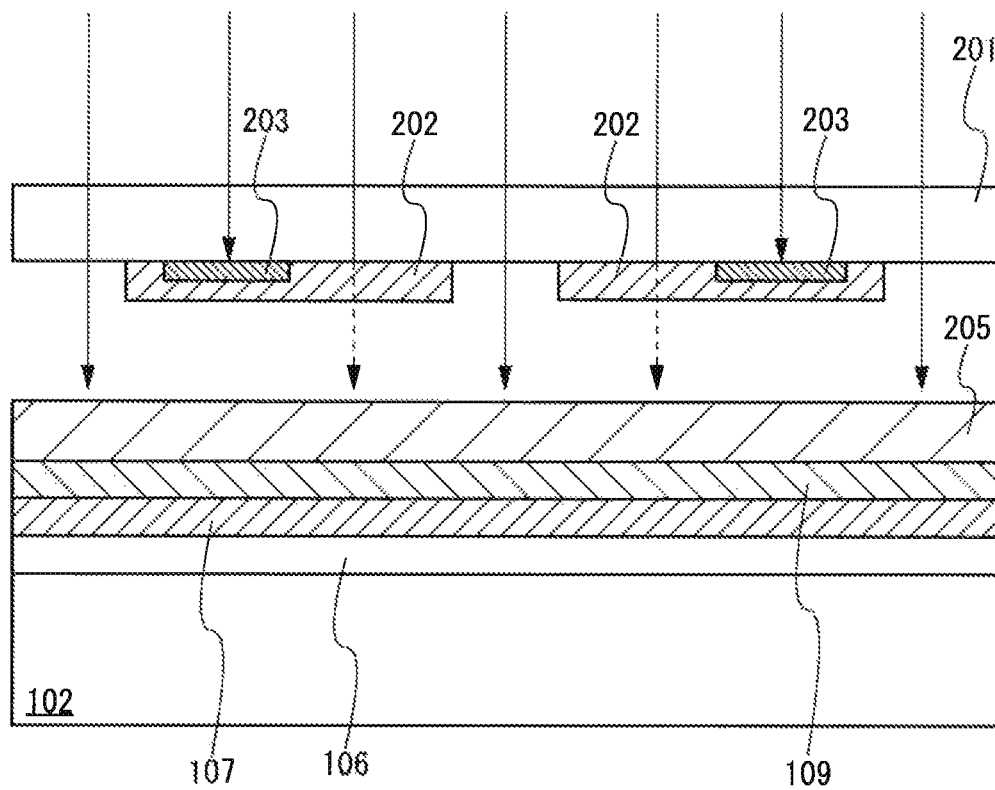
FIG. 4B shows the method for producing the transistor in an embodiment according to the present invention, and shows a stage of forming a photoresist film and exposing with a multi-gradation photomask.

FIG. 4B shows a lithography step of forming the first line 110a, the second line 110b, the first oxide conductive layer 108a and the second oxide conductive layer 108b. In this example, a multi-gradation exposure method (halftone exposure method) is used. Specifically, the patterns of the first line 110a, the second line 110b, the first oxide conductive layer 108a and the second oxide conductive layer 108b are formed by one photomask.

A positive photoresist film 205 is formed on the third conductive film 109. A multi-gradation photomask 201 is used for exposing the photoresist film 205 to light. A multi-gradation photomask is available in two types: a gray tone photomask, which has a multi-gradation scale pattern having slits of a resolution equal to, or lower than, the resolution of an exposure device and realizes multi-gradation exposure by the slits blocking a part of light; and a halftone photomask, which realizes multi-gradation exposure by use of a semi-transmissive film. In this embodiment, both types of multi-gradation photomask are usable as the multi-gradation photomask 201. The photoresist film 205 is exposed to light through a transmissive region, a semi-transmissive region 202 and a non-transmissive region 203 of the multi-gradation photomask 201. As a result, three types of portions, specifically, an exposed portion, a gradation-exposed portion, and a non-exposed portion are formed in the photoresist film 205.

Figure 5A:
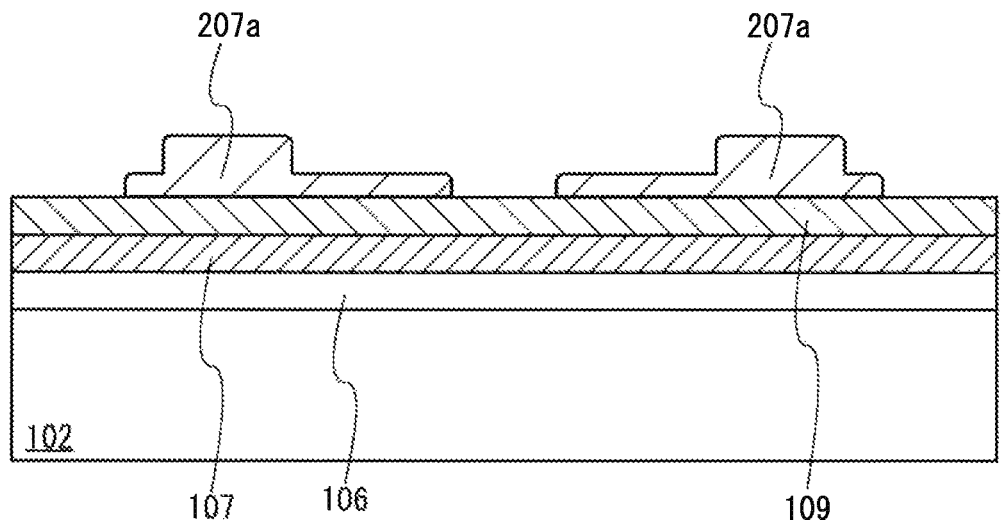
FIG. 5A shows the method for producing the transistor in an embodiment according to the present invention, and shows a stage where a resist mask is formed.

Then, the photoresist film 205 is developed to form a resist mask 207a including regions having different thicknesses as shown in FIG. 5A. As shown in FIG. 5A, the resist mask 207a is thicker in a region corresponding to regions of the third conductive film 109 where the first line 110a and the second line 110b are to be formed, and is thinner in a region corresponding to regions of the second conductive film 107 where the first oxide conductive layer 108a and the second oxide conductive layer 108b are to be formed.

Figure 5B:
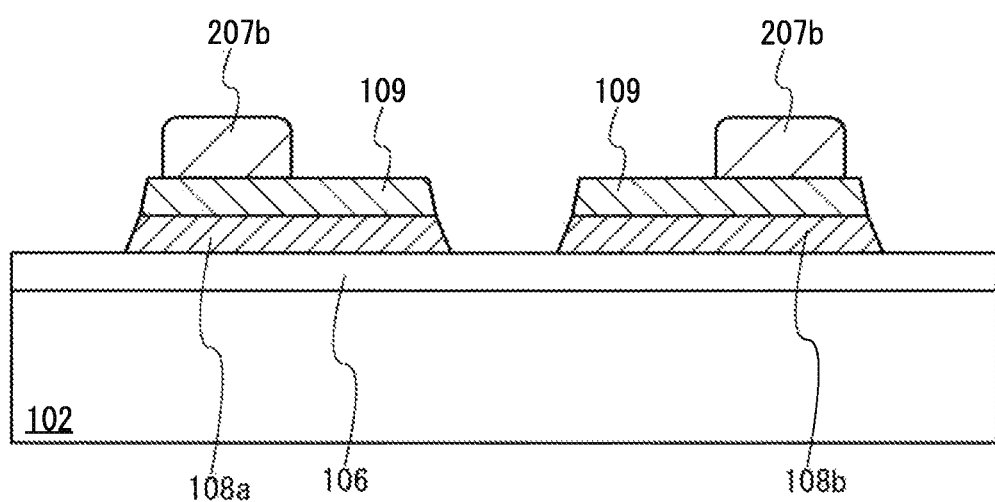
FIG. 5B shows the method for producing the transistor in an embodiment according to the present invention, and shows a stage of etching a second conductive film and a third conductive film.

The third conductive film 109 and the second conductive film 107 are etched by use of the resist mask 207a. There is no specific limitation on the conditions for the etching. For example, the third conductive film 109, which is formed of a metal material, is wet-etched by use of a mixed acid etchant, and the second conductive film 107, which is formed of a metal oxide material or the like, is dry-etched by use of chlorine-based gas or wet-etched by use of an oxalic acid-based material. On this stage, the first oxide conductive layer 108a and the second oxide conductive layer 108b are formed. After the etching, an ashing process is performed to remove the thinner region of the resist mask 207a to expose a surface of the third conductive film 109. FIG. 5B shows a resist mask 207b after the ashing process. The resist mask 207b is left on the third conductive film 109.

Figure 6A:
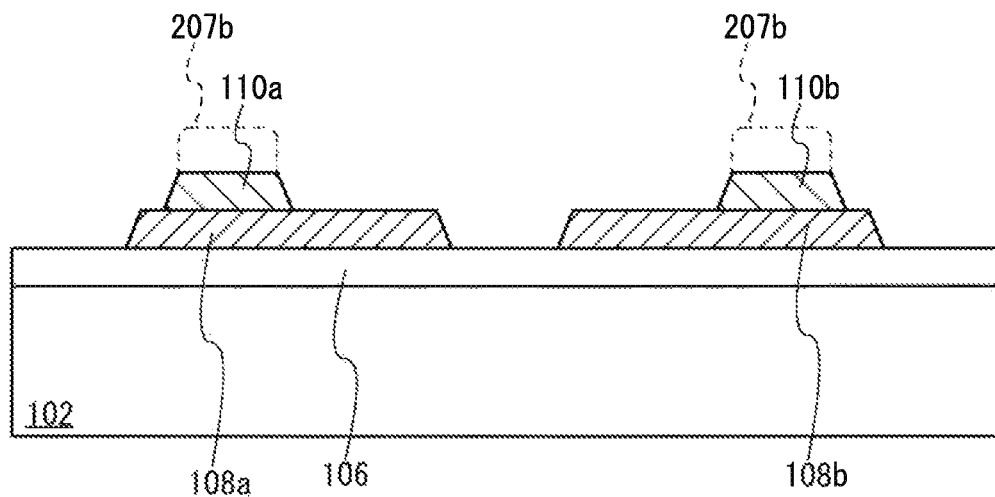
FIG. 6A shows the method for producing the transistor in an embodiment according to the present invention, and shows a stage of etching the third conductive film.

Next, etching is performed on the exposed regions of the third conductive film 109. This etching is wet-etching performed by use of, for example, a mixed acid etchant. The second conductive film 107, which is formed of a metal oxide material or the like, is not easily etched away by the mixed acid etchant as long as containing tin (Sn) at a content of at least 10 atm %, and thus the selection ratio is relatively high. Therefore, the shape of the first oxide conductive layer 108a and the second oxide conductive layer 108b below the third conductive film 109 is kept unchanged. FIG. 6A shows a stage where the first line 110a and the second line 110b are formed as a result of the etching performed on the third conductive film 109. After the third conductive film 109 is etched, the resist mask 207b is removed by a resist releasing solution or ashing.

Surfaces of the first oxide conductive layer 108a and the second oxide conductive layer 108b already formed are exposed to oxygen plasma by the resist releasing solution or the ashing process. However, titanium (Ti), tantalum (Ta), hafnium (Hf) or zirconium (Zr) contained as a component of the first oxide conductive layer 108a and the second oxide conductive layer 108b does not generate any defect, that traps the carriers (electrons), even when being oxidized and becomes an n-type oxide semiconductor without expressing the role of a carrier (electron) killer. Therefore, even though being exposed to oxygen plasma, the first oxide conductive layer 108a and the second oxide conductive layer 108b form a good contact with the oxide semiconductor layer 112 formed in a later step.

Figure 6B:
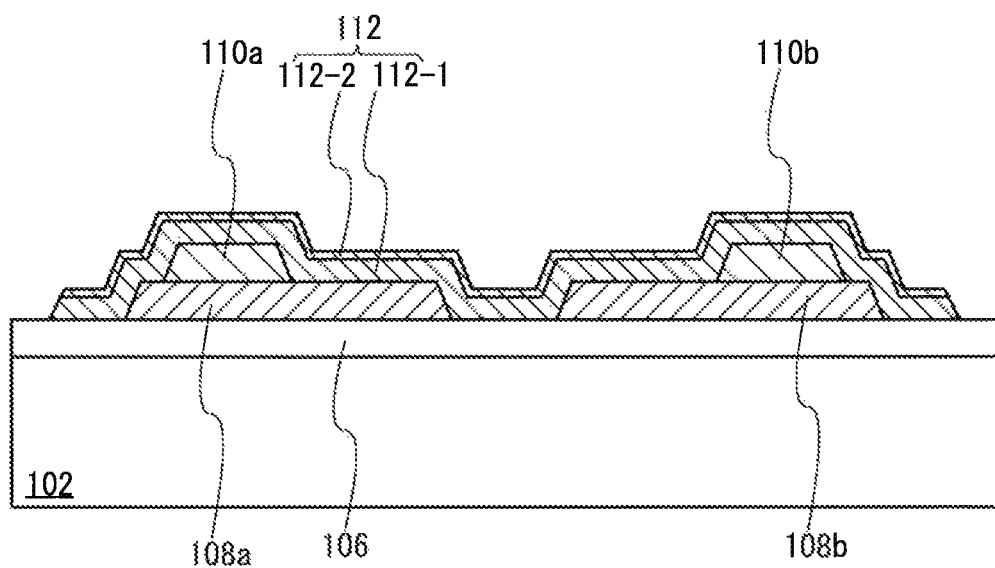
FIG. 6B shows the method for producing the transistor in an embodiment according to the present invention, and shows a stage of forming an oxide semiconductor layer.

FIG. 6B show a stage of forming the oxide semiconductor layer 112. The oxide semiconductor layer 112 is formed on substantially the entirety of the transistor 100a to cover the first oxide conductive layer 108a, the second oxide conductive layer 108b, the first line 110a, and the second line 110b. The oxide semiconductor layer 112 is formed by sputtering. As a sputtering target, a sintered oxide semiconductor material is used. The oxide semiconductor layer 112 is formed to have a thickness of 20 nm to 100 nm, for example, 30 nm to 60 nm.

The oxide semiconductor layer 112 may be formed by use of, for example, a sputtering target compatible to any of the four-component oxide materials, the three-component oxide materials, the two-component oxide materials and the one-component oxide materials. The first region 112-1 of the oxide semiconductor layer 112 may be formed by use of, as sputtering gas, noble gas such as argon (Ar), xenon (Xe) or the like. The second region 112-2 of the oxide semiconductor layer 112 may be formed by use of mixed gas of noble gas and oxygen ($O_2$). The partial pressure of oxygen used to form the second region 112-2 of the oxide semiconductor layer 112 is adjusted to be higher than the partial pressure of oxygen used to form the first region 112-1. It is preferred that the partial pressure of oxygen used to form the second region 112-2 of the oxide semiconductor layer 112 is, for example, 10% to 50%. It is more preferred that the partial pressure of oxygen used to form the second region 112-2 of the oxide semiconductor layer 112 is 15% to 30%. The second region 112-2 may be formed by use of mixed gas containing noble gas (Ar gas), oxygen ($O_2$) and nitrogen ($N_2$) or nitrous oxide ($N_2O$). Specifically, at the stage of finishing the film formation of the first region 112-1, oxygen gas, in addition to noble bas (Ar gas), is introduced into the film formation chamber while the glow discharge is maintained. At this point, the air discharge rate may be increased to decrease the pressure in the film formation chamber and thus to decrease the film formation rate. With such a control, the second region 112-2 can be form with a higher density.

The first region 112-1 and the second region 112-2 of the oxide semiconductor layer 112 in this embodiment may be formed continuously by controlling the partial pressure of oxygen in this manner, so that the productivity thereof is improved. The partial pressure of oxygen used to form the second region 112-2 of the oxide semiconductor layer 112 is increased to increase the crystallization ratio of the film of the second region 112-2. Thus, the second region 112-2 is not easily reduced even if being exposed to plasma during the formation of the first insulating layer 114 by plasma CVD. This allows the substrate temperature during the formation of the first insulating layer 114 to be raised to 250° C. or higher, and thus the resultant $SiO_2$ film is of a high quality. This improves the reliability of the transistor 100a.

In one example, the first region 112-1 and the second region 112-2 of the oxide semiconductor layer 112 in this embodiment are formed continuously by using the same sputtering target and controlling the partial pressure of oxygen of the sputtering gas. The method of forming the first region 112-1 and the second region 112-2 is not limited to this. For example, the entirety of the oxide semiconductor layer 112 may be formed under the same conditions for the first region 112-1, and the second region 112-2 may be formed by a water vapor process or an $N_2O$ plasma oxidation process. The water vapor process may be performed at a temperature of 350° C. to 500° C. at a partial pressure of water vapor of 10% to 50% in a nitrogen atmosphere. The second region 112-2 may be formed by a fluorine doping process by use of $NF_3$ gas or $SiF_4$ gas, an Sn doping process, an Si doping process, a W doping process, instead of by using different partial pressures of oxygen at the time of forming the oxide semiconductor layer 112. The second region 112-2, in the case of being formed in such a manner, also has a carrier concentration lower than that of the first region 112-1. Alternatively, for example, the first region 112-1 may be formed of an In—Ga—Sn—O-based oxide material and the second region 112-2 may be formed of a $Ga_2O_3$-based oxide material, so that two regions containing different elements are formed. With such a method, in this embodiment, the second region 112-2 of the oxide semiconductor layer 112 has a carrier concentration lower than that of the first region 112-1.

Then, the oxide semiconductor layer 112 including the first region 112-1 and the second region 112-2 is patterned by etching. Therefore, as shown in FIG. 6B, an end of the first region 112-1 of the oxide semiconductor layer 112 is exposed. The oxide semiconductor layer 112 is not limited to this. For example, the second region 112-2 may be formed after the first region 112-1 of the oxide semiconductor layer 112 is formed and patterned. In this case, the end of the first region 112-1 may be covered with the second region 112-2. Such a structure further improves the physical characteristics of the oxide semiconductor layer 112.

Figure 7A:
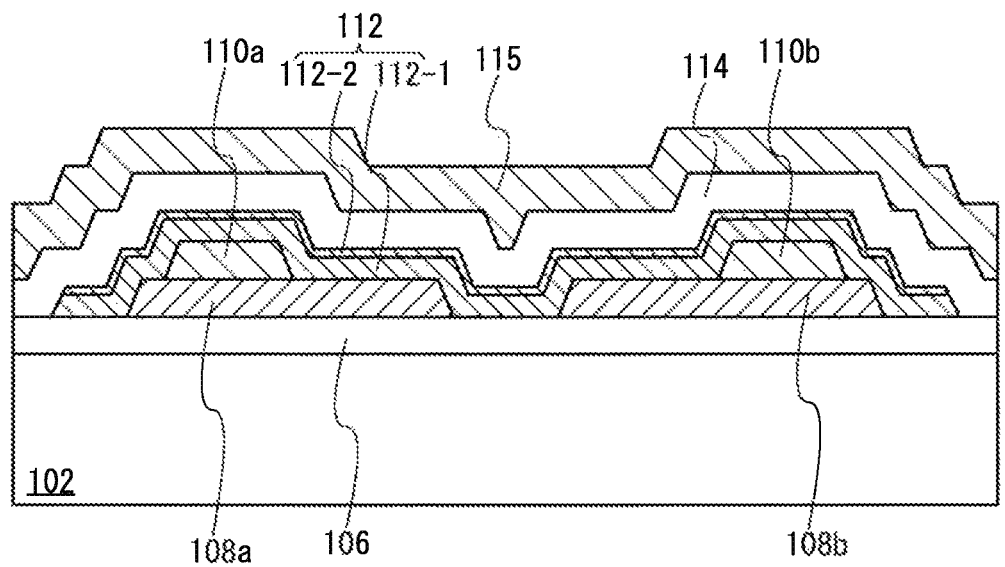
FIG. 7A shows the method for producing the transistor in an embodiment according to the present invention, and shows a stage of forming a first insulating layer and a fourth conductive film.

FIG. 7A shows a stage of forming the first insulating layer 114 and a fourth conductive film 115 on the oxide semiconductor layer 112. The first insulating layer 114 is formed in substantially the same manner as the second insulating layer 106. The fourth conductive film 115 is formed in substantially the same manner as the first conductive film 103. Then, the fourth conductive film 115 is etched to form the first gate electrode 116. Thus, the transistor 110a shown in FIG. 7B is manufactured.

According to the method of manufacturing the transistor 100a in this embodiment, a multi-gradation photomask is used to decrease the number of photomasks required to manufacture the transistor 100a. The use of the multi-gradation photomask allows a plurality patterns (the first oxide conductive layer 108a, the second oxide conductive layer 108b, the first line 110a and the second line 110b) to be formed by performing exposure merely once. This increases the productivity of integrated circuit elements each including the transistor 100a and also decreases the production cost.

Figure 7B:
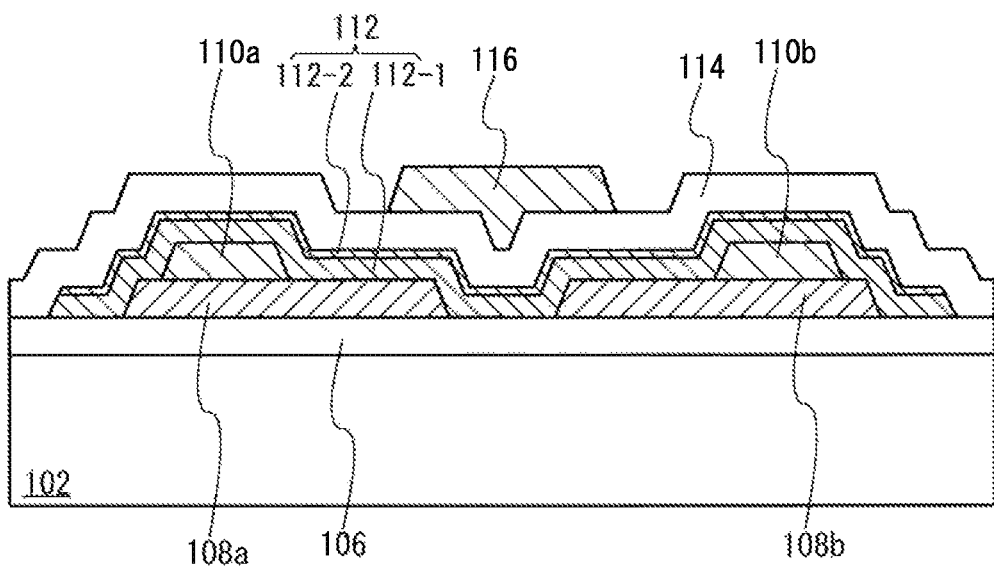
FIG. 7B shows the method for producing the transistor in an embodiment according to the present invention, and shows a structure of a transistor.

As shown in FIG. 7A and FIG. 7B, neither the first line 110a nor the second line 110b overlaps the first gate electrode 116. The first line 110a and the second line 110b are located as far as possible from the channel region of the transistor 100a (region where the first gate electrode 116 overlaps the oxide semiconductor layer 112), so that the channel region is prevented from being contaminated with a metal element. For example, copper (Cu), which may be used as a material of the first line 110a and the second line 110b, is a killer impurity to the oxide semiconductor, which is an n-type semiconductor (impurity that deteriorates the characteristics of the oxide semiconductor and destroys the oxide semiconductor). In this embodiment, the first line 110a and the second line 110b are located as far as possible from the channel region of the transistor 110a. Therefore, even if the first line 110a and the second line 110b contain copper (Cu), the oxide semiconductor layer 112 is suppressed from being contaminated with copper (Cu).

With the method of manufacturing the transistor 100a in this embodiment, the first region 112-1 and the second region 112-2 of the oxide semiconductor layer 112 are formed continuously by using the same sputtering target and controlling the partial pressure of the sputtering gas. This improves the productivity.

Embodiment 2

Figure 8:
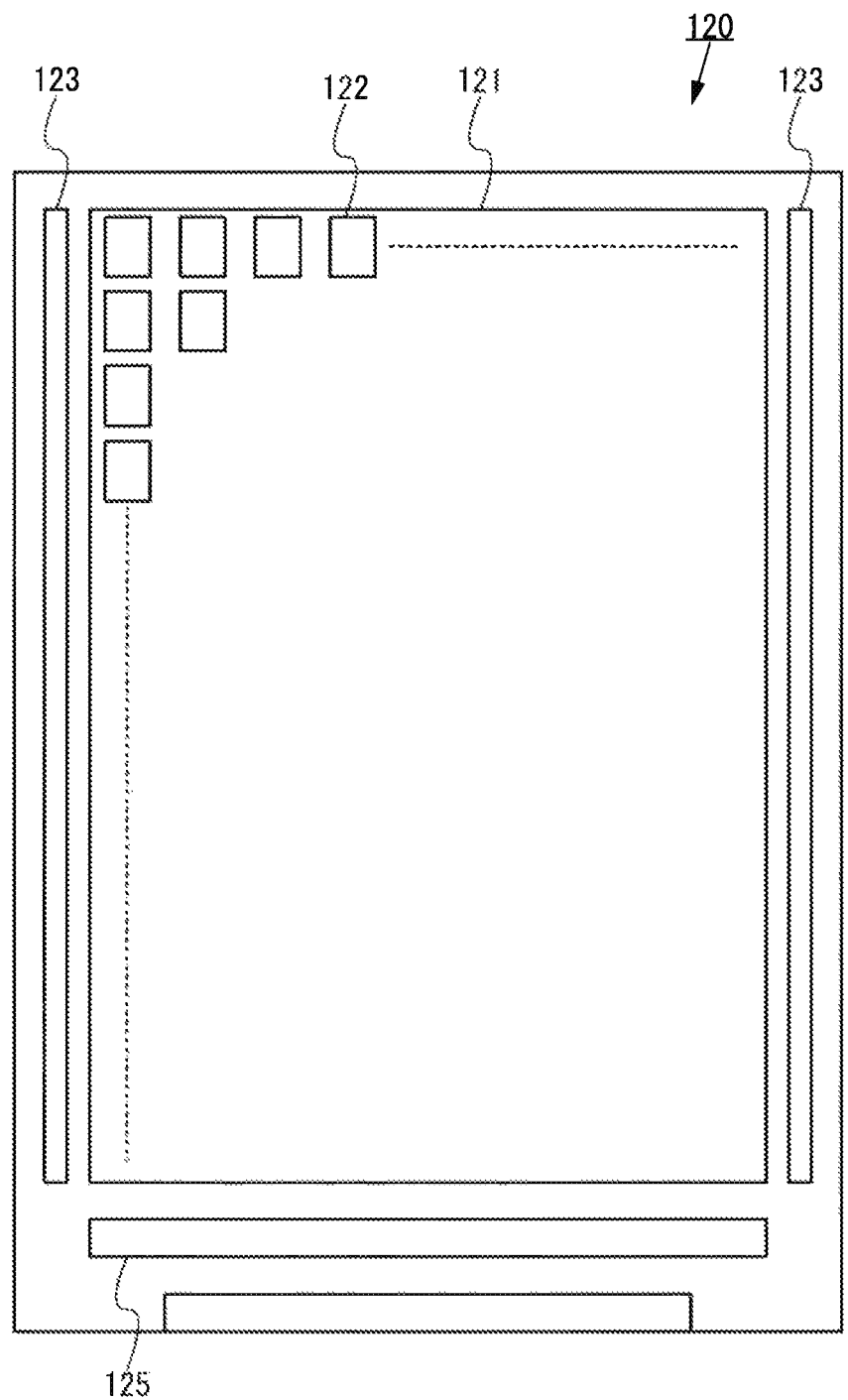
FIG. 8 is a plan view showing a structure of a display device in an embodiment according to the present invention.

In embodiment 2, an example of display device including transistors having substantially the same structure as that of the transistor described in embodiment 1 will be described. As shown in FIG. 8, a display device 120 includes a display region 121 including a plurality of pixels 122, a scanning line driving circuit 123, and a data line driving circuit 125. Although not shown in FIG. 8, the plurality of pixels 122 each include an organic EL element as a display element and a transistor driving the organic EL element.

2-1. Equivalent Circuit

Figure 9:
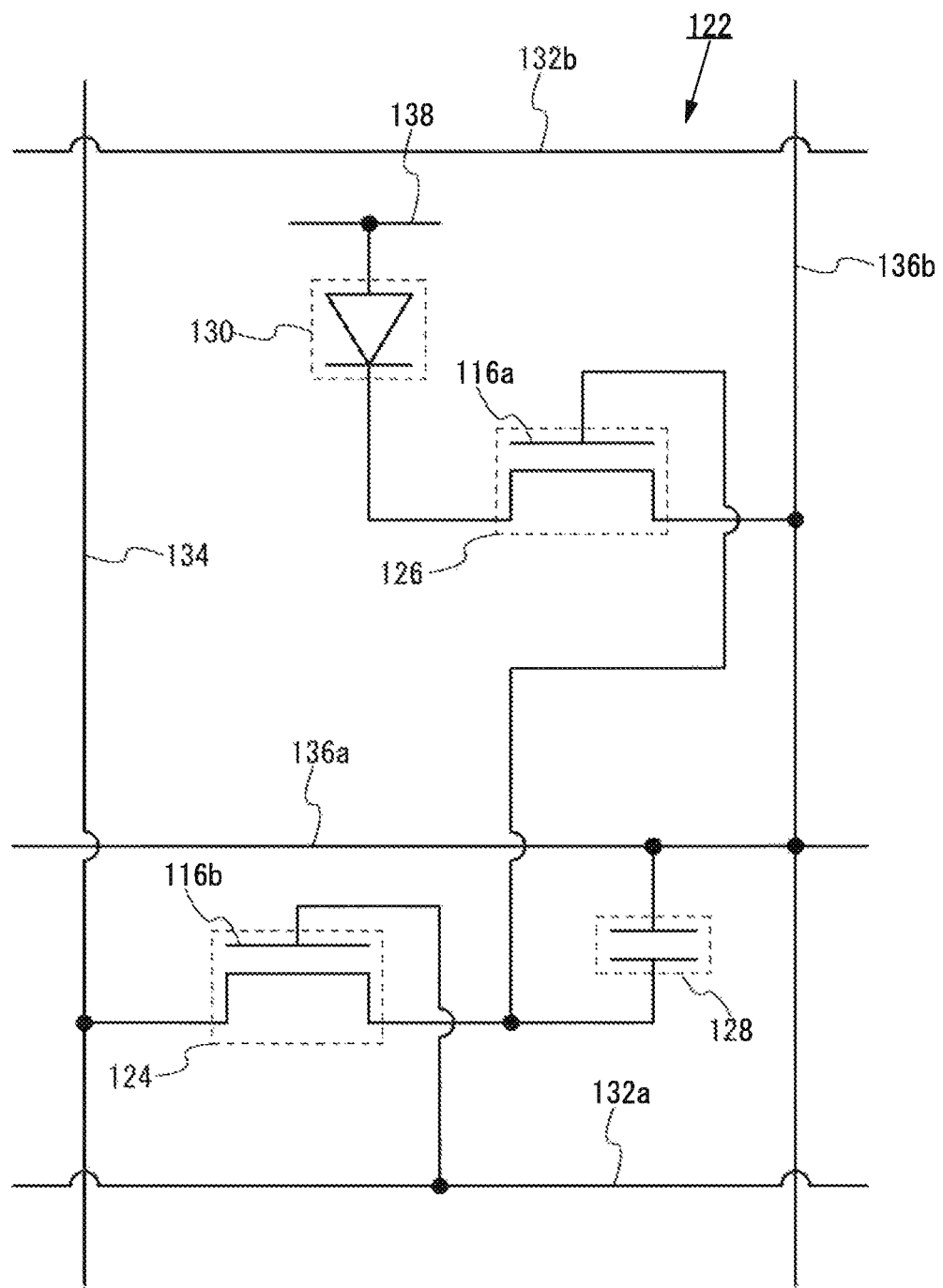
FIG. 9 shows an equivalent circuit of a pixel in the display device in an embodiment according to the present invention.

FIG. 9 is an equivalent circuit diagram of each of the pixels 122 included in the display device 120 in this embodiment. The pixel 122 includes a selection transistor 124, a driving transistor 126, a capacitance element 128, and an organic EL element 130. The selection transistor 124 and the driving transistor 126 each have substantially the same structure as that of the transistor 100a described in embodiment 1. Namely, FIG. 9 shows the transistors of a top-gate structure. The selection transistor 124 includes a first gate electrode 116b, and the driving transistor 126 includes a first gate electrode 116a.

In this embodiment, the selection transistor 124 and the driving transistor 126 are each of an n-channel type. The first gate electrode 116b of the selection transistor 124 is connected with a gate signal line 132a. One of input/output terminals (source and drain) of the selection transistor 124 is connected with a data signal line 134, and the other of the input/output terminals is connected with the first gate electrode 116a of the driving transistor 126. The first gate electrode 116a of the driving transistor 126 is connected with the other of the input/output terminals of the selection transistor 124. A drain of the driving transistor 126 is connected with the organic EL element 130, and a source of the driving transistor 126 is connected with a second common line 136b. One of two terminals of the capacitance element 128 is connected with the other of the input/output terminals (source and drain) of the selection transistor 124. The other of the two terminals of the capacitance element 128 is connected with a first common line 136a. The first common line 136a and the second common line 136b are supplied with, for example, a ground potential.

One of two terminals of the organic EL element 130 is connected with the drain of the driving transistor 126, and the other of the two terminals of the organic EL element 130 is connected with a power supply line 138. The power supply line 138 is supplied with a power supply potential VDD, which is higher than the potential of each of the common lines 136a and 136b. In this embodiment, the terminal of the organic EL element 130 that is connected with the drain of the driving transistor 126 is a cathode electrode, and the terminal of the organic EL element 130 that is connected with the power supply line 138 is an anode electrode.

2-2. Pixel Structure

Figure 10:
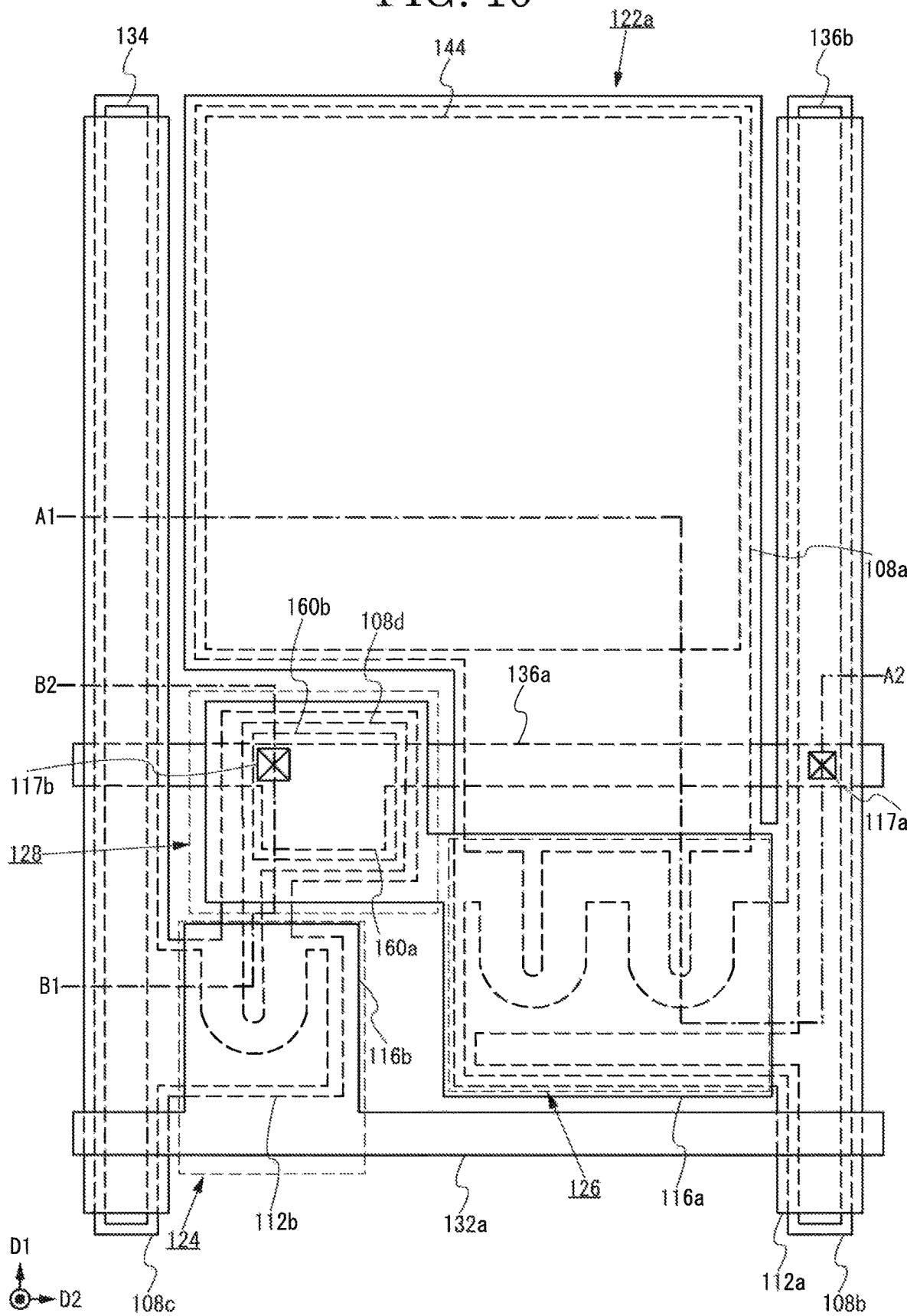
FIG. 10 is a plan view showing a structure of a pixel in the display device in an embodiment according to the present invention.
Figure 11A:
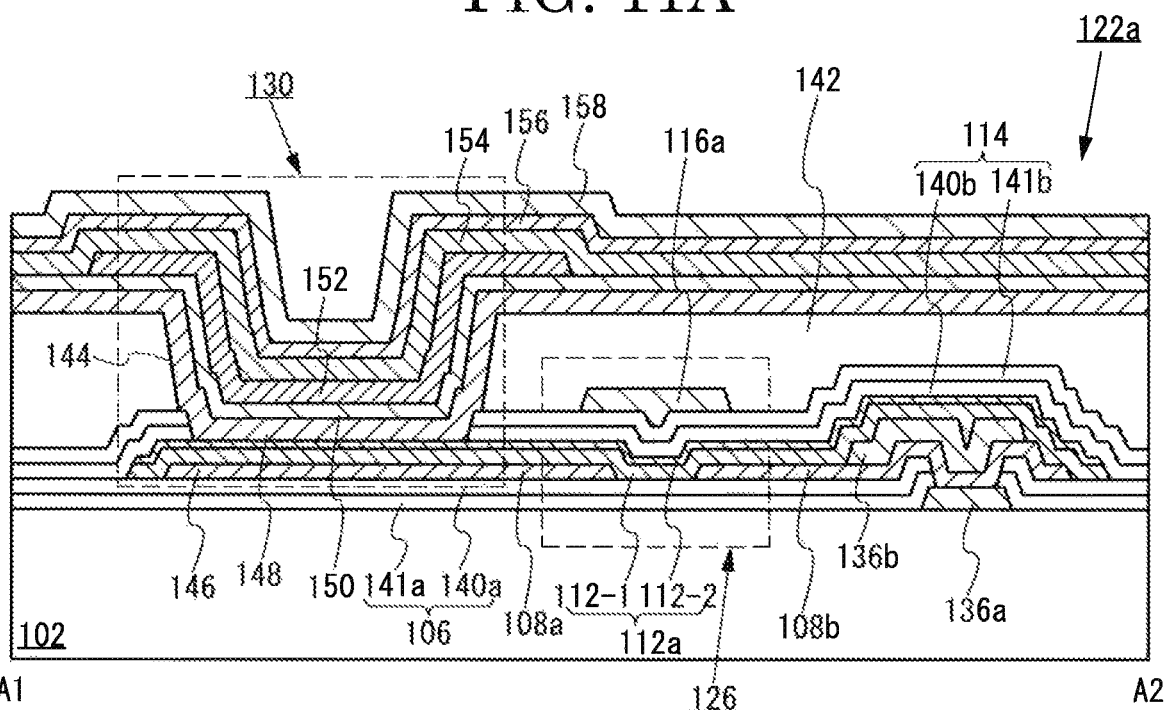
FIG. 11A is a cross-sectional view showing the structure of the pixel in the display device in an embodiment according to the present invention, taken along line A1-A2 in FIG. 10.
Figure 11B:
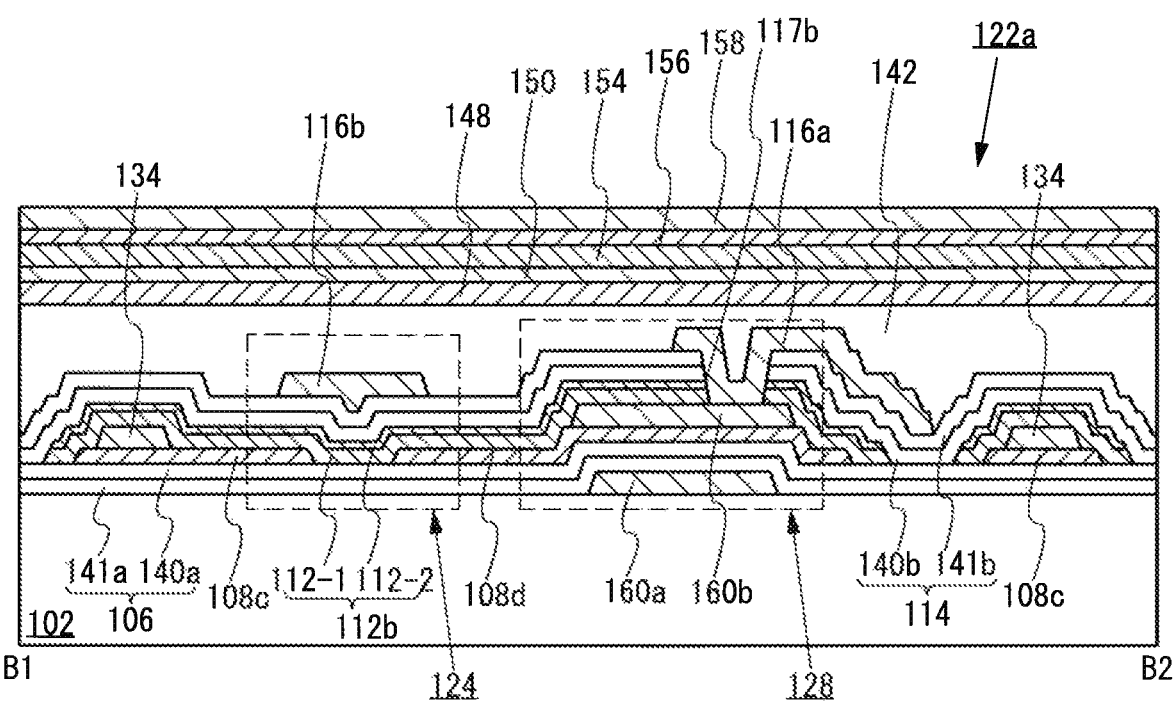
FIG. 11B is a cross-sectional view showing the structure of the pixel in the display device in an embodiment according to the present invention, taken along line B1-B2 in FIG. 10.

FIG. 10 shows an example of planar structure of a pixel 122a corresponding to the equivalent circuit shown in FIG. 9. FIG. 11A shows a cross-sectional structure taken along line A1-A2 in FIG. 10, and FIG. 11B shows a cross-sectional structure taken along line B1-B2 in FIG. 10. FIG. 11A shows a cross-sectional structure of the driving transistor 126 and the organic EL element 130. FIG. 11B shows a cross-sectional structure of the selection transistor 124 and the capacitance element 128. The following description will be made with reference to FIG. 10, FIG. 11A and FIG. 11B optionally. In the plan view of the pixel 122a shown in FIG. 10, the structure of the organic EL element 130 is omitted.

2-2-1. Driving Transistor

The driving transistor 126 has substantially the same structure as that of the transistor 100a described in embodiment 1. Specifically, the driving transistor 126 includes the second insulating layer 106, a first oxide semiconductor layer 112a (the first region 112-1 and the second region 112-2), the first insulating layer 114, and the first gate electrode 116a, which are stacked. The first gate electrode 116a is provided on a top surface of the first insulating layer 114 (surface opposite to the surface facing the substrate 102).

The first oxide conductive layer 108a and the second oxide conductive layer 108b are provided between the second insulating layer 106 and the first oxide semiconductor layer 112a. The first oxide conductive layer 108a and the second oxide conductive layer 108b are provided in contact with the first region 112-1 of the first oxide semiconductor layer 112a.

The first oxide conductive layer 108a and the second oxide conductive layer 108b are provided to partially overlap the first gate electrode 116a and to hold the first gate electrode 116a from both of two sides as seen in a plan view. The second oxide conductive layer 108b includes patterns curved in a U shape (U-shaped curved patterns) as seen in a plan view in at least a region thereof overlapping the first gate electrode 116a. The first oxide conductive layer 108a includes linear patterns extending inward of the U-shaped curved patterns of the second oxide conductive layer 108b. The cross-sectional view of the transistor 100a shown in FIG. 1 shows a unit structure from the first oxide conductive layer 108a to the second oxide conductive layer 108b. A cross-sectional view of the driving transistor 126 shown in FIG. 10 taken along a second direction (D2 direction) includes a repetition of the cross-sectional view shown in FIG. 1.

The linear patterns of the first oxide conductive layer 108a each have a width preferably in the range of 1.0 μm to 5 μm, and more preferably in the range of 1.5 μm to 3 μm. The first oxide conductive layer 108a and the second oxide conductive layer 108b in the region overlapping the first gate electrode 116a have a shortest distance therebetween that is preferably in the range of 1.5 μm to 10 μm, and is more preferably in the range of 2 μm to 5 μm. A structure in which the shortest distance between the first oxide conductive layer 108a and the second oxide conductive layer 108b is longer than, or equal to, the width of the linear pattern of the first oxide conductive layer 108a may be adopted, so that the leak current caused when the driving transistor 126 is turned off is suppressed from being increased. With such a structure of the first oxide conductive layer 108a and the second oxide conductive layer 108b, the gate-drain capacitance is suppressed from being fluctuated even if the first oxide conductive layer 108a and the second oxide conductive layer 108b is positionally shifted from the first gate electrode 116a. Therefore, the display non-uniformity is suppressed to improve the yield.

In the driving transistor 126, the first oxide conductive layer 108a, or a region of the first oxide conductive layer 108a in contact with the first oxide semiconductor layer 112a, is a drain region. The second oxide conductive layer 108b, or a region of the second oxide conductive layer 108b in contact with the first oxide semiconductor layer 112a, is a source region.

The second oxide conductive layer 108b of the driving transistor 126 is electrically connected with the first oxide semiconductor layer 112a, the first common line 136a and the second common line 136b. The second common line 136b is provided in the same layer structure as that of the data signal line 134 provided between the oxide conductive layer 108c and the oxide semiconductor layer 112b. The first common line 136a and the second oxide conductive layer 108b are electrically connected with each other via a first contact hole 117a formed in the second insulating layer 106. The second common line 136b is in direct contact with a top surface of the second oxide conductive layer 108b.

The second insulating layer 106 includes, for example, a first silicon nitride film 141a and a first silicon oxide film 140a stacked in this order from the substrate 102 side. The first insulating layer 114 includes a second silicon oxide film 140b and a second silicon nitride film 141b stacked in this order from the first oxide semiconductor layer 112a side.

A channel of the driving transistor 126 is formed in a region where the first oxide semiconductor layer 112a overlaps the first gate electrode 116a. Therefore, the first oxide semiconductor layer 112a is provided in contact with the silicon oxide films 140a and 140b in the region where the channel is formed. The first oxide semiconductor layer 112a is provided in contact with the insulating oxide films, and thus generation of oxygen deficiency in the first oxide semiconductor layer 112a is suppressed. It is desired that the silicon oxide films 140a and 140b do not have oxygen deficiency so as not to draw out oxygen from the first oxide semiconductor layer 112a. Rather, it is preferred that the silicon oxide films 140a and 140b contain an excessive amount of oxygen. A reason for this is that the silicon oxide films 140a and 140b, in the case of containing an excessive amount of oxygen, may be a source of oxygen for the first oxide semiconductor layer 112a. The "silicon oxide film containing an excessive amount of oxygen" encompasses a silicon oxide film containing an excessive amount of oxygen with respect to the chemical stoichiometric composition, and also encompasses a silicon oxide film containing an excessive amount of oxygen in a lattice thereof. The second insulating layer 106 and the first insulating layer 114 may be formed of silicon oxide nitride or aluminum oxide instead of silicon oxide.

The driving transistor 126 is covered with a flattening layer 142. The flattening layer 142 is formed of an organic resin material such as, for example, an acrylic resin, a polyimide resin, an epoxy resin, a polyamide resin or the like. The flattening layer 142 is formed as follows. A composition containing a precursor of an organic resin material is applied, and a surface of the film formed by the composition is flattened by a levelling action of the film.

An opening 144 is provided in the flattening layer 142 and the first insulating layer 114. A first electrode 146, which is the cathode electrode of the organic EL element 130, is located to overlap the opening 144. The organic EL element 130 is formed of a plurality of layers stacked in the region of the opening 144.

In this embodiment, as described above with reference to FIG. 1, in the driving transistor 126, the oxide semiconductor layer 112 includes the first region 112-1 and the second region 112-2. The second region 112-2 has a carrier concentration lower than that of the first region 112-1. With such a structure, the driving transistor 126 includes a channel formed in the first region 112-1, of the oxide semiconductor layer 112, separated from the first insulating layer 114. In one embodiment according to the present invention, such a buried channel may be formed in order to manufacture a TFT operating in a normally-off mode (enhancement mode).

If the oxide semiconductor layer 112 does not include a region corresponding to the second region 112-2, a region of a poor quality (having a low density and having many defects) that is formed on the final stage of formation of the oxide semiconductor layer 112 is in direct contact with the first insulating layer 114. With such a structure, the channel region is formed to include the poor-quality region of the oxide semiconductor layer 112. Therefore, the field effect mobility is decreased. The poor-quality region is easily reduced during the formation of the first insulating layer 114. This significantly fluctuates the threshold voltage.

By contrast, in the driving transistor 126 in this embodiment, the oxide semiconductor layer 112 includes the second region 112-2 provided between the first region 112-1 and the first insulating layer 114. With such a structure, the field effect mobility is increased. In addition, the threshold voltage of the driving transistor 126 is suppressed from being fluctuated, and thus the driving transistor 126 has a higher reliability because of stable electric characteristics.

2-2-2. Selection Transistor

The selection transistor 124 has substantially the same structure as that of the transistor 100a described in embodiment 1. Specifically, the selection transistor 124 includes the second insulating layer 106, a second oxide semiconductor layer 112b (the first region 112-1 and the second region 112-2), the first insulating layer 114, and the first gate electrode 116b, which are stacked. A channel of the second transistor 124 is formed in a region where the second oxide semiconductor layer 112b overlaps the first gate electrode 116b.

A third oxide conductive layer 108c and a fourth oxide conductive layer 108d are provided between the second insulating layer 106 and the second oxide semiconductor layer 112b. The third oxide conductive layer 108c and the fourth oxide conductive layer 108d are provided in contact with the first region 112-1 of the second oxide semiconductor layer 112b, and thus act as a source region and a drain region.

The third oxide conductive layer 108c and the fourth oxide conductive layer 108d are provided to partially overlap the first gate electrode 116b and to hold the first gate electrode 116b from both of two sides as seen in a plan view. The third oxide conductive layer 108c includes a U-shaped curved pattern as seen in a plan view in at least a region thereof overlapping the first gate electrode 116b. The fourth oxide conductive layer 108d includes a linear pattern extending inward of the U-shaped curved pattern of the third oxide conductive layer 108c. The cross-sectional view of the transistor 100a shown in FIG. 1 shows a unit structure from the first oxide conductive layer 108a to the second oxide conductive layer 108b. A cross-sectional view of the selection transistor 124 shown in FIG. 10 taken along the second direction (D2 direction) includes a repetition of the cross-sectional view shown in FIG. 1.

The linear pattern of the fourth oxide conductive layer 108d has a width preferably in the range of 1.0 μm to 5 μm, and more preferably in the range of 1.5 μm to 3 μm. The third oxide conductive layer 108c and the fourth oxide conductive layer 108d in the region overlapping the first gate electrode 116b have a shortest distance therebetween that is preferably in the range of 1.5 μm to 10 μm, and is more preferably in the range of 2 μm to 5 μm. A structure in which the shortest distance between the third oxide conductive layer 108c and the fourth oxide conductive layer 108d is longer than, or equal to, the width of the linear pattern of the fourth oxide conductive layer 108d may be adopted, so that the leak current caused when the selection transistor 124 is turned off is suppressed from being increased. With such a structure of the third oxide conductive layer 108c and the fourth oxide conductive layer 108d, the gate-drain capacitance is suppressed from being fluctuated even if the third oxide conductive layer 108c and the fourth oxide conductive layer 108d are positionally shifted from the first gate electrode 116b. Therefore, the display non-uniformity is suppressed to improve the yield.

The third oxide conductive layer 108c is electrically connected with the data signal line 134. The data signal line 134 is provided in the same layer structure as that of the line layer 110 provided between the oxide conductive layer 108 and the oxide semiconductor layer 112 described in the embodiment 1. The data signal line 134 is in direct contact with a top surface of the third oxide conductive layer 108c. The second oxide semiconductor layer 112b extends to a region where the data signal line 134 is located and covers the data signal line 134. The data signal line 134 is in direct contact with the third oxide conductive layer 108c and thus has a larger contact area size than in the case where the data signal line 134 is connected with the third oxide conductive layer 108c via a contact hole. Therefore, the contact resistance is decreased. A top surface and side surfaces of the data signal line 134 are covered with the second oxide semiconductor layer 112b, and thus the data signal line 134 is not exposed to an oxidizing atmosphere or a reducing atmosphere during the production of the display device 120. Therefore, the data signal line 134 suppresses the resistance at a surface thereof from being increased.

2-2-3. Capacitance Element

The capacitance element 128 includes a first capacitance electrode 160a, the second insulating layer 106, the fourth oxide conductive layer 108d, and a second capacitance electrode 160b. The second capacitance electrode 160b is provided in the same layer structure as that of the data signal line 134. The fourth oxide conductive layer 108d is electrically connected with the second capacitance electrode 160b, and thus substantially acts as the electrode of the capacitance element 128.

The second oxide semiconductor layer 112b and the first insulating layer 114 are provided above the second capacitance electrode 160b. The second capacitance electrode 160b is electrically connected with the first gate electrode 116a via a second contact hole 117b running through the first insulating layer 114 and the second oxide semiconductor layer 112b.

2-2-4. Organic EL Element

The organic EL element 130 includes the first electrode 146 corresponding to the cathode electrode, the first oxide semiconductor layer 112a (the first region 112-1 and the second region 112-2), an electron transfer layer 148, an electron injection layer 150, a light emitting layer 152, a hole transfer layer 154, a hole injection layer 156, and a second electrode 158 corresponding to the anode electrode, which are stacked from the substrate 102 side. A structure of an organic EL element in which a hole transfer layer, a light emitting layer, an electron transfer layer, and a cathode electrode are stacked in this order from the side of the anode electrode close to the substrate is referred to as a "normal stack structure". In the organic EL element 130 in this embodiment, the electron transfer layer 148, the light emitting layer 152, the hole transfer layer 154 and the like are stacked in this order from the side of the cathode electrode close to the substrate 102. This structure is referred to as an "inverted stack structure".

In this embodiment, the electron transfer layer 148, the second region 112-2 of the first oxide semiconductor layer 112a, the first region 112-1 of the first oxide semiconductor layer 112a and the first electrode 146 have energy levels decreasing in this order. Such a structure decreases the difference in the energy level. Thus, the electron injection efficiency is improved to improve the light emission efficiency of the organic EL element 130. In this embodiment, the driving transistor 126 is of an n-channel type. Therefore, if the organic EL element has a normal stack structure, the source is connected with the anode electrode. In this case, there is a problem that the level of drain current of the driving transistor is changed in accordance with the change in the characteristics of the organic EL element. However, in the case where the organic EL element 130 has an inverted stack structure as in this embodiment, the drain of the n-channel type driving transistor 126 is connected with the cathode of the organic EL element 130. Therefore, a circuit configuration in which the drain current is not much influenced by the change in the characteristics of the organic EL element 130 is provided.

On a top surface of the flattening layer 142 and in the opening 144 provided in the flattening layer 142 and the first insulating layer 114, the electron transfer layer 148, the electron injection layer 150, the light emitting layer 152, the hole transfer layer 154, the hole injection layer 156, and the second electrode 158 acting as the anode electrode are stacked. A region where a stacked body including these elements overlaps the first electrode 146 corresponding to the cathode electrode is a light emitting region of the organic EL element 130.

The organic EL element 130 in this embodiment is of a so-called bottom emission type, which outputs light toward the substrate 102. Hereinafter, each of the layers included in the organic EL element 130 will be described in detail.

2-2-4-1. Cathode Electrode

As a material of a cathode electrode of an organic EL element, an aluminum-lithium alloy (AlLi), a magnesium-silver alloy (MgAg) or the like is conventionally used. However, these materials are easily deteriorated by the influence of oxygen or moisture in the air, and thus are difficult to handle. These materials for the cathode electrode are metal materials, and thus are not suitable to an organic EL element that has an inverted stack structure and is of a bottom emission type.

In the organic EL element 130 in this embodiment, the first electrode 146, which is a cathode electrode, is formed of a transparent conductive material, and thus a bottom emission type structure is realized for the organic EL element 130. Specifically, the first oxide conductive layer 108a of the driving transistor 126 extends to the region of the organic EL element 130 to act as the first electrode 146, which is a cathode electrode. With such an arrangement, the driving transistor 126 and the organic EL element 130 are electrically connected with each other with a simple structure. For example, in the case where an interlayer insulating layer is provided between the driving transistor and the organic EL element, a contact hole needs to be provided to connect the driving transistor and the organic EL element. By contrast, the structure of the first pixel 122a in this embodiment does not require a contact hole.

The first electrode 146 as the cathode electrode is formed of the same conductive film as that of the first oxide conductive layer 108a. The first oxide conductive layer 108a is formed of a metal oxide material, a metal nitride material, or a metal oxide nitride material, all of which are conductive. A conductive film formed of such a material has a bandgap of 2.8 eV or larger, preferably of 3.0 eV or larger, and therefore transmits almost all of light of a visible region. Therefore, such a material is usable for an electrode on the light output side of the organic EL element 130.

On a top surface of the first electrode 146 corresponding to the cathode electrode, the first oxide semiconductor layer 112a extending from the driving transistor 126 may be provided. The first oxide semiconductor layer 112a has a bandgap of 3 eV or larger, and thus is visible light-transmissive. As described below, in this embodiment, the electron transfer layer 148 is formed of a metal oxide. The first oxide semiconductor layer 112a formed of the same material, or the same type of material, as the electron transfer layer 148 is located between the electron transfer layer 148 and the first electrode 146 corresponding to the cathode electrode, so that formation of an electron injection barrier is prevented. In other words, the first oxide semiconductor layer 112a extending from the channel region of the driving transistor 126 may be used as a part of the electron transfer layer 148 in contact with the first electrode 146 corresponding to the cathode electrode.

2-2-4-2. Electron Transfer Layer

The electron transfer layer 148 is formed of a metal oxide material. Examples of the metal oxide material usable for the electron transfer layer 148 include substantially the same materials described in embodiment 1, specifically, a four-component oxide material, a three-component oxide material, a two-component oxide material, and a one-component oxide material. These metal oxide materials may be in an amorphous state, a crystalline state or a mixed phase of an amorphous state and a crystalline state. The electron transfer layer 148 is formed of, for example, one or a plurality of materials selected from an oxide of indium, an oxide of zinc, an oxide of gallium (Ga), and an oxide of tin (Sn). Such a metal oxide material should not absorb visible light and needs to be transparent, and thus is required to have a bandgap of 3.0 eV or larger. The electron transfer layer 148 may have a maximum possible thickness to prevent short circuiting between the anode electrode and the cathode electrode. This significantly improves the yield of the organic EL panel. A representative material of the electron transfer layer 148 is $ZnSiO_x$. ZnO is doped with $SiO_2$ at 10 atm % to 15 atm % to provide physical properties suitable for the electron transfer layer 148, namely, a bandgap of 3.5 eV and a work function of 3.5 eV. An $MgZnO_x$-based oxide semiconductor containing Mg at 20 atm % and Zn at 80 atm % may also provide substantially the same physical properties. The electron transfer layer 148 having such a composition may be formed by sputtering, vacuum vapor deposition, coating or the like. The electron transfer layer 148 is formed by such a method to have a thickness of 50 nm to 1000 nm.

It is preferred that the electron transfer layer 148 has a carrier concentration that is 1/10 or less, preferably 1/100 or less, of the average carrier concentration of the first oxide semiconductor layer 112a. In other words, the average carrier concentration of the first oxide semiconductor layer 112a is at least 10 times, preferably 100 times, the carrier concentration of the electron transfer layer 148. Specifically, the carrier concentration of the electron transfer layer 148 is $10^{13}/cm^3$ to $10^{17}/cm^3$, whereas the carrier concentration of the first region 112-1 of the first oxide semiconductor layer 112a is $1 \times 10^{15}/cm^3$ to $1 \times 10^{19}/cm^3$. The difference between the carrier concentrations of the electron transfer layer 148 and the first region 112-1 of the first oxide semiconductor layer 112a may be at least one digit, preferably at least two digits. The first region 112-1 of the first oxide semiconductor layer 112a has a carrier concentration of is $10^{15}/cm^3$ to $10^{19}/cm^3$, and thus decreases the resistance loss in the electric connection between the driving transistor 126 and the organic EL element 130, and suppresses the driving voltage from being increased. In the case where the carrier concentration of the electron transfer layer 148 is $10^{20}/cm^3$ or higher, the excited state in the light emitting layer 152 is deactivated and the light emission efficiency is decreased. By contrast, in the case where the carrier concentration of the electron transfer layer 148 is $10^{13}/cm^3$ or lower the number of carriers supplied to the light emitting layer 152 is decreased and thus a sufficient level of luminance is not provided. As described above, the first oxide conductive layer 108a and the first oxide semiconductor layer 112a extending from the driving transistor 126 are provided to stack on, and to be in contact with, the electron transfer layer 148, and the carrier concentrations of the three layers are made different from each other. With such a structure, the driving voltage is prevented from being increased, and the electron injection efficiency is improved. As a result, the light emission efficiency of the organic EL element 130 is improved.

2-2-4-3. Electron Injection Layer

In an organic EL element, an electron injection layer is used in order to decrease the energy barrier and thus to inject the electrons from the cathode electrode into an electron transfer material. In this embodiment, the electron injection layer 150 is used in order to allow the electrons to be injected easily from the electron transfer layer 148 formed of an oxide semiconductor into the light emitting layer 152. Thus, the electron injection layer 150 is provided between the electron transfer layer 148 and the light emitting layer 152.

It is desired that the electron injection layer 150 is formed of a material having a small work function in order to allow the electrons to be injected easily into the light emitting layer 150 formed of an organic material. The electron injection layer 150 is formed of an oxide of calcium (Ca) and an oxide of aluminum (Al). The electron injection layer 150 is preferably formed of, for example, C12A7 ($12CaO \cdot 7Al_2O_3$) electride. C12A7 ($12CaO \cdot 7Al_2O_3$) electride has semiconductor characteristics, is controllable to have a desired level of resistance from a high resistance to a low resistance, and has a work function of 2.4 eV to 3.2 eV, which is about the same as that of an alkaline metal. For these reasons, C12A7 ($12CaO \cdot 7Al_2O_3$) electride is preferably usable for the electron injection layer 150.

The electron injection layer 150 of C12A7 electride is formed by sputtering by use of a polycrystal of C12A7 electride as a target. C12A7 electride has semiconductor characteristics, and thus the electron injection layer 150 may be formed to have a thickness of 1 nm to 100 nm. Regarding C12A7 electride, it is preferred that the molar ratio of Ca:Al is in the range of 13:13 to 11:16. C12A7 electride is formed by sputtering and thus is preferably amorphous. Alternatively, C12A7 electride may be crystalline.

C12A7 electride is stable in the atmosphere, and thus has an advantage of being easier to handle than an alkaline metal compound conventionally used for an electron injection layer such as lithium fluoride (LiF), lithium oxide ($Li_2O$), sodium chloride (NaCl), potassium chloride (KCl), or the like. Use of C12A7 electride makes it unnecessary to work in dry air or inactive gas during the formation of the organic EL element 130. The conditions for the formation of the organic EL element 130 are alleviated.

C12A7 electride has a large ionization potential. Therefore, the electron injection layer 150, when being located to face the hole transfer layer 154 while having the light emitting layer 152 between the electron injection layer 150 and the hole injection layer 154 therebetween, acts as a hole block layer. Namely, the electron injection layer 150 formed of C12A7 electride is provided between the electron transfer layer 148 and the light emitting layer 152, so that holes injected into the light emitting layer 152 are suppressed from running to the first 146 as the cathode electrode, and thus the light emission efficiency is improved. $MgZnO_x$ (containing Mg at 30 atm % and Zn at 70 atm %) is also usable for the electron injection layer 150.

2-2-4-4. Light Emitting Layer

The light emitting layer 152 may be formed of any of various materials. For example, the light emitting layer 152 may be formed of a fluorescent compound emitting fluorescence or phosphorescent compound emitting phosphorescence.

Examples of light emitting material emitting blue light usable for the light emitting layer 152 include N,N'-bis[4-(9H-carbazole-9-yl)phenyl-N,N'-diphenylstilbene-4,4'-diamine (YGAS2S), 4-(9H-carbazole-9-yl)-4'-(10-phenyl-9-anthryl)triphenylamine (YGAPA), and the like. Examples of light emitting material emitting green light usable for the light emitting layer 152 include N-(9,10-diphenyl-2-anthryl)-N,9-diphenyl-9H-carbazole-3-amine (2PCAPA), N-[9,10-bis(1,1'-biphenyl-2-yl)-2-anthryl]-N,9-diphenyl-9H-carbazole-3-amine (2PCABPhA), N-(9,10-diphenyl-2-anthryl)-N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), N-[9,10-bis(1,1'-biphenyl-2-yl)]-N-[4-(9H-carbazole-9-yl)phenyl]-N-phenylanthracene-2-amine (2YGABPhA), N,N,9-triphenylanthracene-9-amine (DPhAPhA), and the like. Examples of light emitting material emitting red light usable for the light emitting layer 152 include N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-diamine (p-mPhAFD), and the like. A phosphorescent material such as bis[2-(2'-benzo[4,5-α]thienyl)pyridinatho-N,$C^3$]iridium(III)acetylacetonate ($Ir(btp)_2$(acac)) or the like is also usable.

The light emitting layer 152 may be formed of any of various known materials other than the above-listed materials. The light emitting layer 152 may be formed by vapor deposition, transfer, spin-coating, spray-coting, gravure printing, or the like. The light emitting layer 152 may have an optionally selected thickness, and has a thickness of, for example, 10 nm to 100 nm.

2-2-4-5. Hole Transfer Layer

The hole transfer layer 154 is formed of a material having hole transferability. The hole transfer layer 154 is formed of, for example, an arylamine-based compound, an amine compound containing a carbozole group, an amine compound containing a fluorene derivative, or the like. Examples of materials usable for the hole transfer layer 154 include organic materials such as 4,4'-bis[N-(naphtyl)-N-phenyl-amino]biphenyl (α-NPD), N,N'-bis(3-methylphenyl)-(1,1'-biphenyl)-4,4'-diamine (TPD), 2-TNANA, 4,4',4"-tris(N-(3-methylphenyl)N-phenylamino)triphenylamine (MTDATA), 4,4'-N,N'-dicarbazolebiphenyl (CBP), 4,4'-bis[N-(9,9-dimethylfluorene-2-yl)-N-phenylamino]biphenyl (DFLDPBi), 4,4'bis[N-(spiro-9,9'-bifluorene-2-yl)-N-phenylamino]biphenyl (BSPB), spiro-NPD, spiro-TPD, apiro-TAD, TNB, and the like.

The hole transfer layer 154 is formed of a common film formation method such as vacuum vapor deposition, coating or the like. The hole transfer layer 154 is formed by such a method to have a thickness of 10 nm to 500 nm. The hole transfer layer 154 may be omitted.

2-2-4-6. Hole Injection Layer

The hole injection layer 156 is formed of a material having a high capability of injecting holes into an organic layer. Examples of materials having a high capability of injecting holes and usable for the hole injection layer 156 include metal oxides such as an oxide of molybdenum, an oxide of vanadium, an oxide of ruthenium, an oxide of tungsten, an oxide of manganese and the like. Examples of materials having a high capability of injecting holes and usable for the hole injection layer 156 also include organic compounds such as phthalocyanine ($H_2Pc$), copper (II) phthalocyanine (CuPc), vanadylphthalocyanine (VoPc), 4,4',4"-tris(N,N-diphenylamino)triphenylamine (TDATA), 4,4',4"-tris(N-(3-methylphenyl)-N-phenylamino]triphenylamine (MTDATA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino) biphenyl (DNPTD), 1,3,5-tris[N-(4-diphenylaminophenyl)-N- phenylamino]benzene (DPA3B), 3-[N-(9-phenylcarbozole-3-yl)-N-phenylamino]-9-phenylcarbazole (PCzPCA1), 3,6-bis[N-(9-phenylcarbazole-3-yl)-N-phenylamino]-9-phenylcarbazole (PCzPCA2), 3-[N-(1-naphtyl)-N-(9-phenylcarbazole-3-yl)amino]-9-phenylcarbazole (PCzPCN1), 2,3,6,7,10,11-hexacyano-1,4,5,8,9,12-hexaazatriphenylene (HAT-CN), and the like.

The hole injection layer 156 is formed of a common film formation method such as vacuum vapor deposition, coating or the like. The hole injection layer 156 is formed by such a method to have a thickness of 1 nm to 100 nm.

2-2-4-7. Anode Electrode

The second electrode 158 corresponding to the anode electrode is formed of a metal material, an alloy or a conductive compound having a high work function (specifically, 4.0 eV or larger). The second electrode 158 corresponding to the anode electrode is formed of, for example, indium tin oxide (ITO), indium zinc oxide (IZO), indium oxide containing tungsten oxide and zinc oxide (IWZO), or the like. The second electrode 158 corresponding to the anode electrode of such a conductive metal oxide material is formed by vacuum vapor deposition or sputtering. In this embodiment, the organic EL element 130 is of a bottom emission type. Therefore, it is preferred that the second electrode 158 corresponding to the anode electrode is light reflective or has a light reflective surface. A film of a conductive metal oxide such as indium tin oxide (ITO), indium zinc oxide (IZO) or the like is light-transmissive. Therefore, the second electrode 158 may include a metal film of aluminum (Al), silver (Ag) or the like at a surface thereof that is opposite to a surface facing the hole injection layer 156. Although not shown in FIG. 10, FIG. 11A and FIG. 11B, a passivation layer blocking transmission of oxygen ($O_2$) or moisture ($H_2O$) may be provided on the second electrode 158 corresponding to the anode electrode in substantially the entirety of the display region 121.

As described above, in this embodiment, the pixel 122a in which the driving transistor 126 exhibiting n-channel type conductivity and the organic EL element 130 are electrically connected with each other is realized. In this case, the organic EL element 130 may have an inverted stack structure, in which the electron transfer layer 148, the electron injection layer 150, the light emitting layer 152, the hole transfer layer 154, the hole injection layer 156 and the like are stacked appropriately from the side of the first electrode 146, which is the cathode electrode. Since the first electrode 146, which is the cathode electrode, does not need to be formed of an alkaline metal material, the reliability of the display device 120 is improved. In addition, the electron transfer layer 148 and the electron injection layer 150, which are located in lower layers, are formed of an inorganic insulating material. Therefore, even if an organic layer is formed on these inorganic insulating layers, the characteristics are suppressed from decreasing by denaturing or the like. Thus, the characteristics of the organic EL element 130 are stabilized.

2-3. Transistor Structure

As shown in FIG. 11A and FIG. 11B, the pixel 122a in this embodiment has a structure in which the second electrode 158 covers the entire surfaces of the driving transistor 126 and the selection transistor 124. The driving transistor 126 and the selection transistor 124 each have a bottom-contact top-gate structure; specifically, the first oxide conductive layer 108a and the second oxide conductive layer 108b are located in contact with a bottom surface of the oxide semiconductor layer 112, and the first gate electrode 116 is located above the oxide semiconductor layer 112.

Figure 12A:
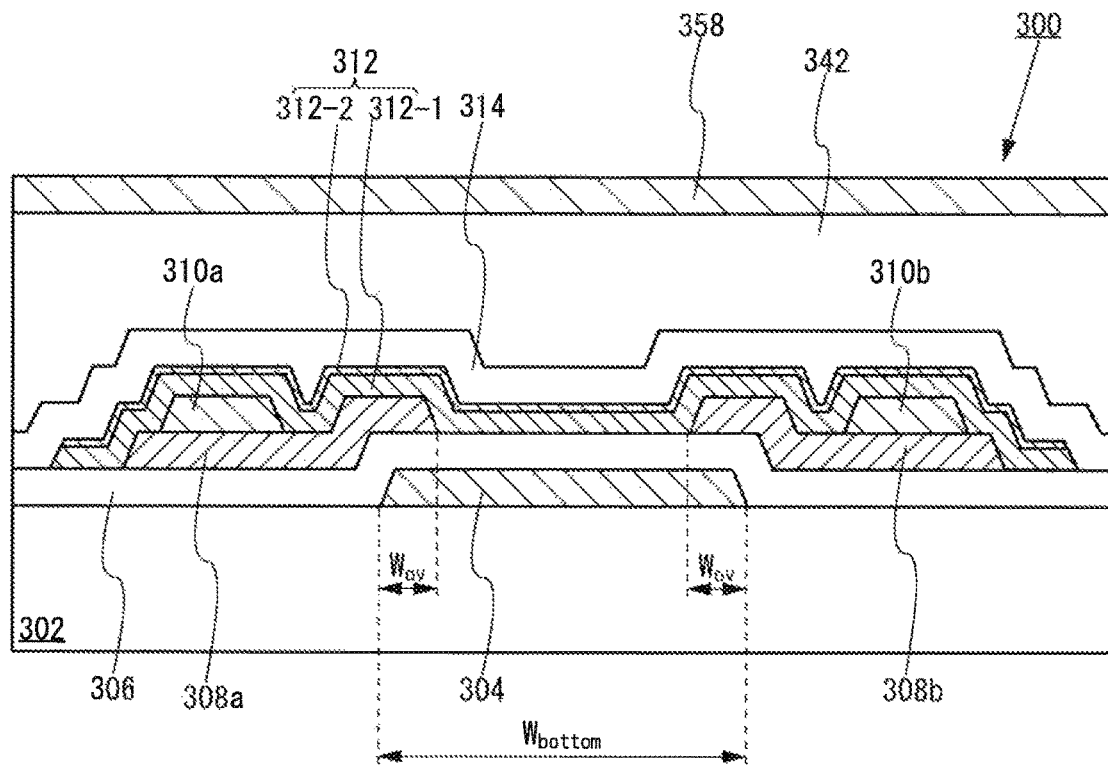
FIG. 12A shows a structure of a bottom contact bottom gate type transistor and an influence of charges during an operation of the display device.
Figure 12B:
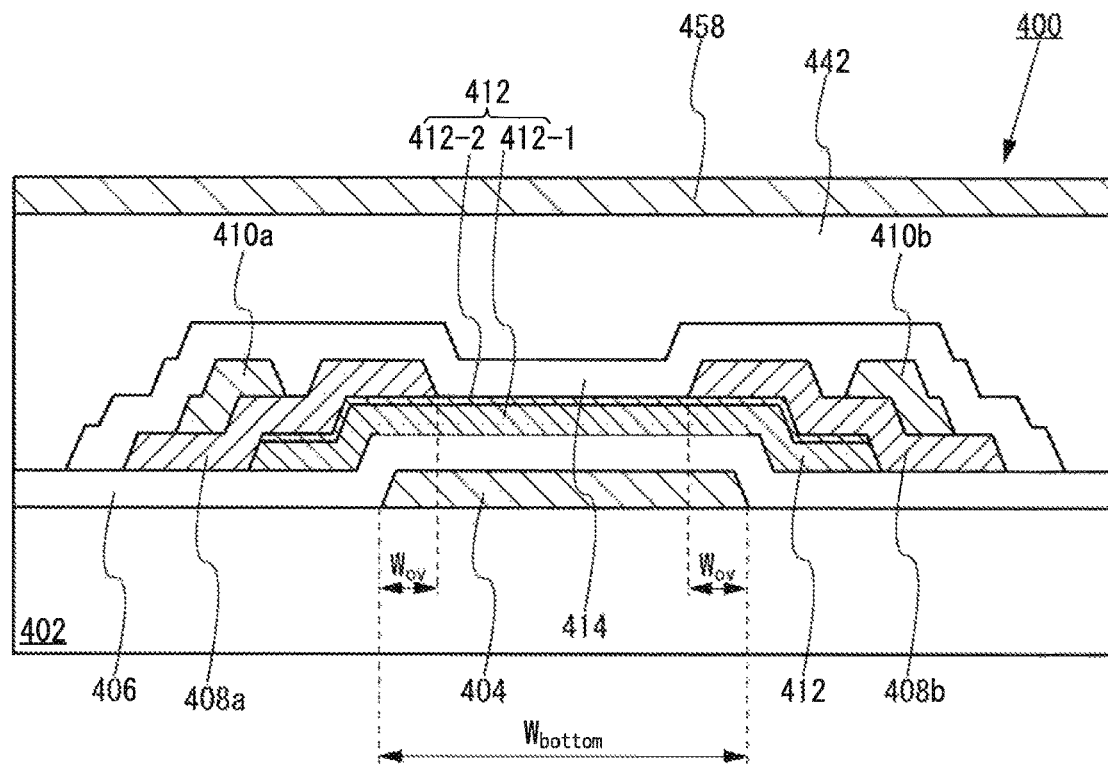
FIG. 12B shows a structure of a top contact bottom gate type transistor and an influence of charges during an operation of the display device.

FIG. 12A shows a bottom-contact bottom-gate type transistor 300 having the following cross-sectional structure. The transistor 300 includes a gate electrode 304, a second insulating layer 306, a first oxide conductive layer 308a, a second oxide conductive layer 308b, a first line 310a, a second line 310b, an oxide semiconductor layer 312, a first insulating layer 314, a flattening layer 342, and an anode electrode 358, which are stacked in this order on a substrate 302. FIG. 12B shows a top-contact bottom-gate type transistor 400 having the following cross-sectional structure. The transistor 400 includes a gate electrode 404, a second insulating layer 406, an oxide semiconductor layer 412, a first oxide conductive layer 408a, a second oxide conductive layer 408b, a first line 410a, a second line 410b, a first insulating layer 414, a flattening layer 442, and an anode electrode 458, which are stacked in this order on a substrate 402. In each of the bottom-gate type transistor 300 and the bottom-gate type transistor 400 having the above-described structures, an electric current flows in an area, of the first region 312-1 or 412-1 of the oxide semiconductor layer 312 or 412, that is closer to the first gate electrode 304 or 404 (area represented by the dashed line). Also in each of the bottom-gate type transistor 300 and the bottom-gate type transistor 400, the back channel side (the side of the oxide semiconductor layer 312 or 412 facing the anode electrode 358 or 458) is easily influenced by the anode electrode 358 or 458. Specifically, the anode electrode 358 or 458 has a positive potential, and an interface between the oxide semiconductor layer 312 or 412 and the second insulating layer 314 or 414 (back channel interface), and the anode electrode 358 or 458, are separated from each other by an interval of about 3 μm to about 5 μm. Therefore, positive charges are easily accumulated at the interface between the back channel side of the oxide semiconductor layer 312 or 412 and the first insulating layer 314 or 414. When the positive charges are accumulated at the interface between the back channel side and the first insulating layer 314 or 414, there occurs a problem that the threshold voltage of the transistor 300 or 400 is shifted to a negative side (the transistor 300 or 400 becomes a normally-off transistor).

In order to solve such a problem, it is preferred that gate electrode is provided above the oxide semiconductor layer 112 as in this embodiment. In this case, the first gate electrode 116 may be grounded to have a constant potential, so that the potential on the back channel side is stabilized.

Figure 13:
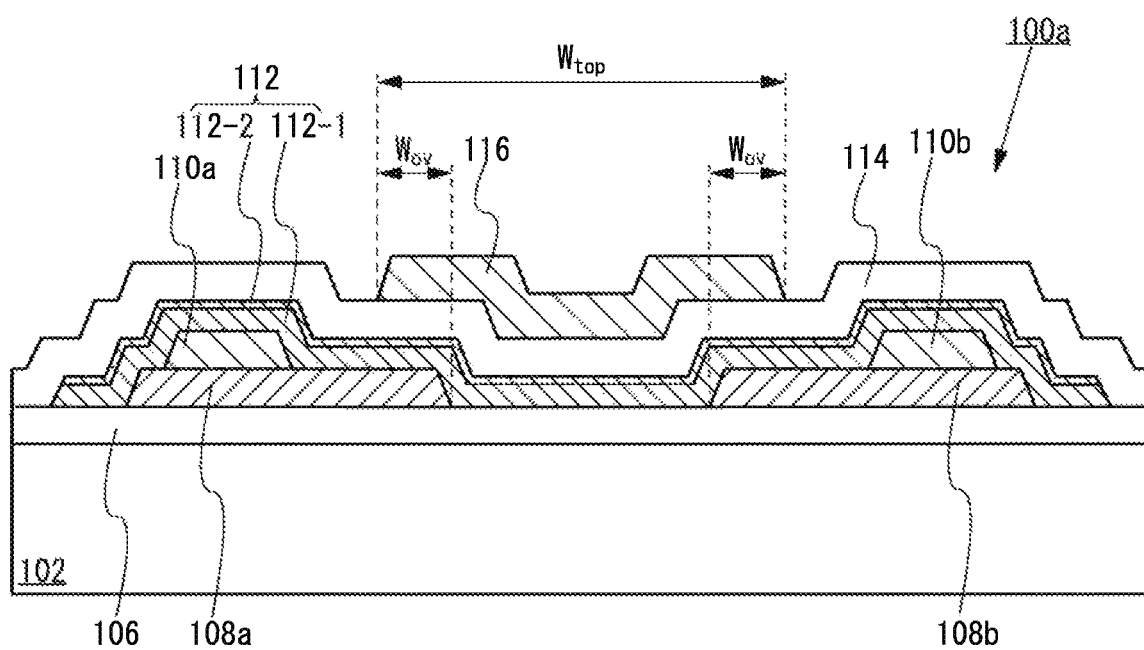
FIG. 13 shows a cross-sectional structure of a transistor in an embodiment according to the present invention.

FIG. 13 shows a bottom-contact top-gate structure of the transistor 100a in this embodiment. The first oxide conductive layer 108a and the second oxide conductive layer 108b are located in contact with the bottom surface of the oxide semiconductor layer 112, and the first gate electrode 116 is located above the oxide semiconductor layer 112. The first oxide conductive layer 108a and the second oxide conductive layer 108b are in contact with the first region 112-1 of the oxide semiconductor layer 112 having a carrier concentration higher than that of the second region 112-2, so that the contact resistance is decreased. With such a structure, the transistor 100a in this embodiment has a higher admittance and a higher level of drain current.

FIG. 13 shows an embodiment of the transistor 100a. In this embodiment, the transistor 100a has a structure in which the first gate electrode 116 above the oxide semiconductor layer 112 overlaps both of the first oxide conductive layer 108a and the second oxide conductive layer 108b, which correspond to the source and drain electrodes. The first gate electrode 116 having width $W_{top}$ in a channel length direction overlaps each of the first oxide conductive layer 108a and the second oxide conductive layer 108b by width $W_{ov}$.

Since the first gate electrode 116 partially overlaps both of the first oxide conductive layer 108*a* and the second oxide conductive layer 108*b*, the channel region in the oxide semiconductor layer 112 is substantially blocked against the electric field of the second electrode 158. Therefore, even if the second electrode 158 is located to cover the entire surface of the transistor 100*a*, the channel region is not influenced by the electric field of the second electrode 158. Thus, the threshold voltage of the transistor 100*a* is prevented from being fluctuated along with time.

2-4. Method of Manufacturing the Display Device

An example of method of manufacturing the display device 120 in an embodiment according to the present invention will be described. In the following description, the same explanations as those on the method of manufacturing the transistor 100*a* provided in embodiment 1 will be omitted, and only the differences will be provided.

Figure 14:
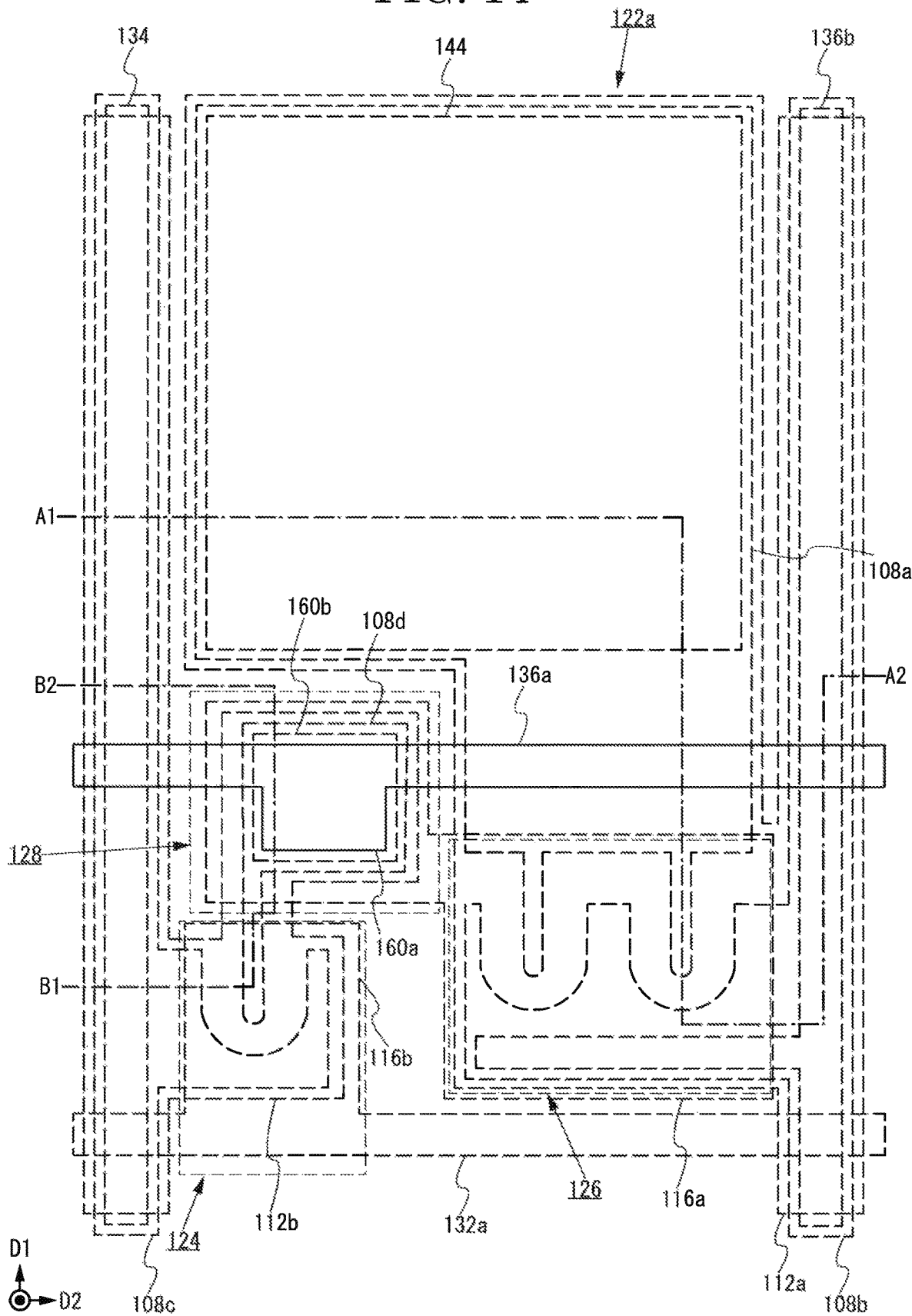
FIG. 14 is a plan view showing a method for producing the display device in an embodiment according to the present invention.
Figure 15A:
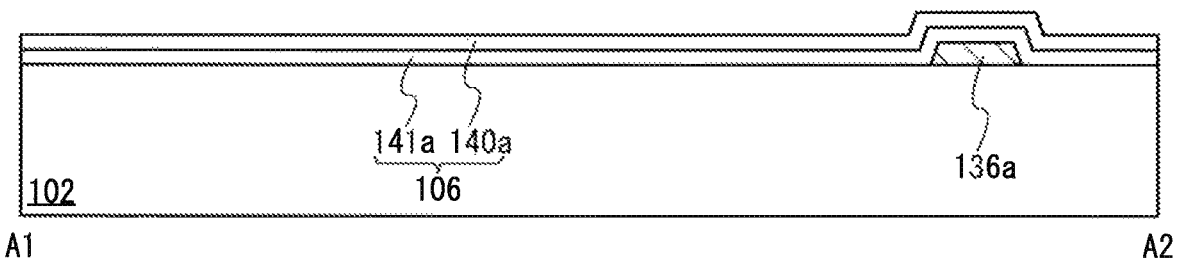
FIG. 15A is a cross-sectional view showing the method for producing the display device in an embodiment according to the present invention, taken along line A1-A2 in FIG. 14.
Figure 15B:
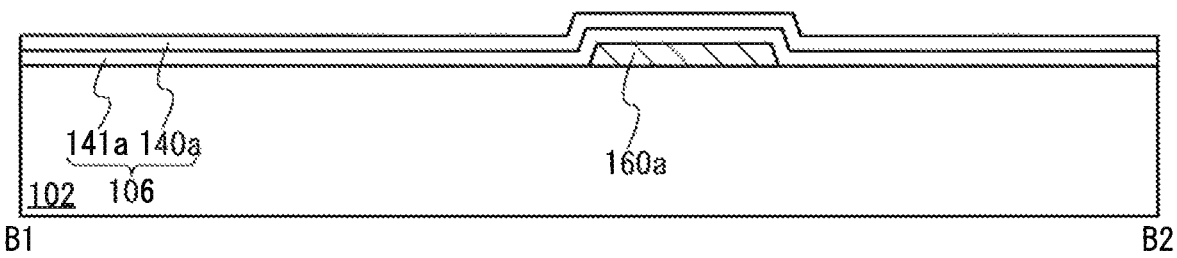
FIG. 15B is a cross-sectional view showing the method for producing the display device in an embodiment according to the present invention, taken along line B1-B2 in FIG. 14.

FIG. 14, FIG. 15A and FIG. 15B show a stage of forming the first capacitance electrode 160*a* and the first common line 136*a* on the substrate 102, and a stage of forming the second insulating layer 106. FIG. 14 is a plan view of a region corresponding to one pixel 122*a*. FIG. 15A is a cross-sectional view taken along line A1-A2 in FIG. 14, and FIG. 15B is a cross-sectional view taken along line B1-B2 in FIG. 14.

As shown in FIG. 14, FIG. 15A and FIG. 15B, the first common line 136*a* and the first capacitance electrode 160*a* are formed of the same conductive film as each other. Therefore, the first common line 136*a* and the first capacitance electrode 160*a* are formed as one continuous pattern formed of a conductive film in the same layer.

The second insulating layer 106 is formed on a top surface of the first common line 136*a* and the first capacitance electrode 160*a*. For example, the second insulating layer 106 is formed by stacking the first silicon nitride film 141*a* and the first silicon oxide film 140*a* from the substrate 102 side. The first silicon nitride film 141*a* is formed by ICP-CVD by use of gas such as $SiF_4$, $N_2$ or the like as source gas. The first silicon oxide film 140*a* is also formed by plasma CVD by use of tetraisocyanatesilane-based material, $N_2O$ or the like optionally. The second insulating layer 106 is formed on substantially the entire surface of the substrate 102.

Figure 16A:
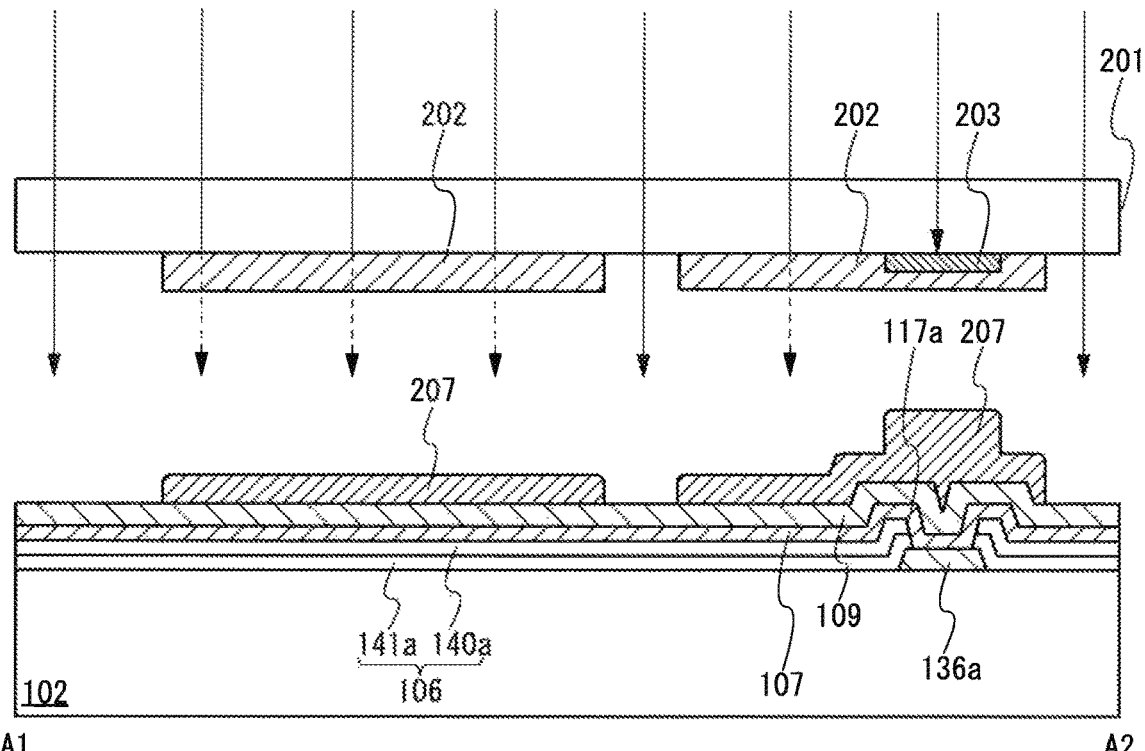
FIG. 16A is a cross-sectional view showing the method for producing the display device in an embodiment according to the present invention, taken along line A1-A2 in FIG. 14.
Figure 16B:
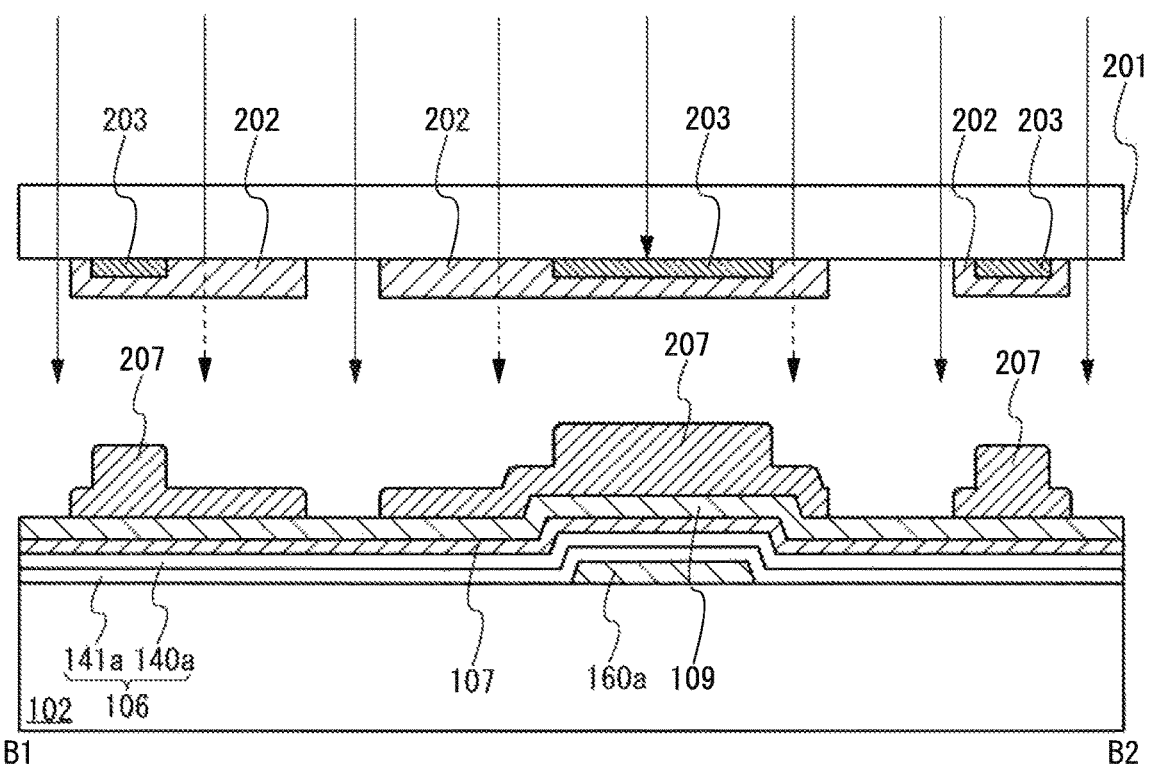
FIG. 16B is a cross-sectional view showing the method for producing the display device in an embodiment according to the present invention, taken along line B1-B2 in FIG. 14.

FIG. 16A and FIG. 16B show a stage where the second conductive film 107 and the third conductive film 109 are formed on a top surface of the second insulating layer 106, and a resist mask 207 is formed thereon by use of the multi-gradation photomask 201. The photoresist film 205 is exposed to light through the transmissive region, the semi-transmissive region 202 and the non-transmissive region 203 of the multi-gradation photomask 201. As a result, three types of portions, specifically, an exposed portion, a gradation-exposed portion, and a non-exposed portion are formed in the photoresist film 205. In correspondence with the pattern of the non-transmissive region 203 of the multi-gradation photomask 201, resist masks 207 are formed such that regions thereof corresponding to regions, of the third conductive film 109, that are to become the second common line 136*b* (FIG. 16A) and the data signal line 134 (FIG. 16B) are unexposed and thicker than the remaining region. The second conductive film 107 is formed of a transparent conductive material, and the third conductive film 109 is formed of a metal material. As shown in FIG. 16A, the first contact hole 117*a* is formed in advance in the second insulating layer 106 in order to expose the first common line 136*a*.

Figure 17:
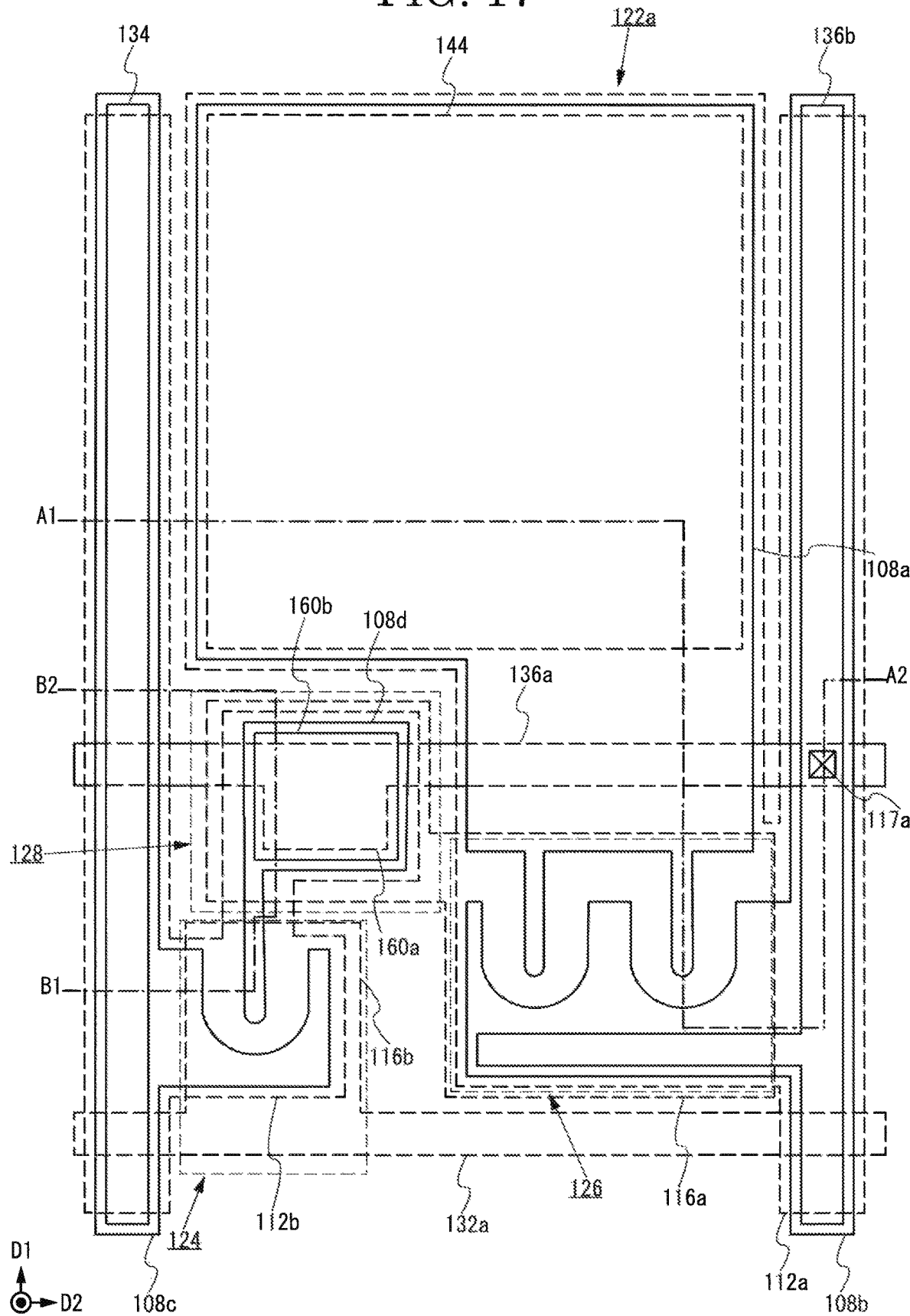
FIG. 17 is a plan view showing the method for producing the display device in an embodiment according to the present invention.
Figure 18A:
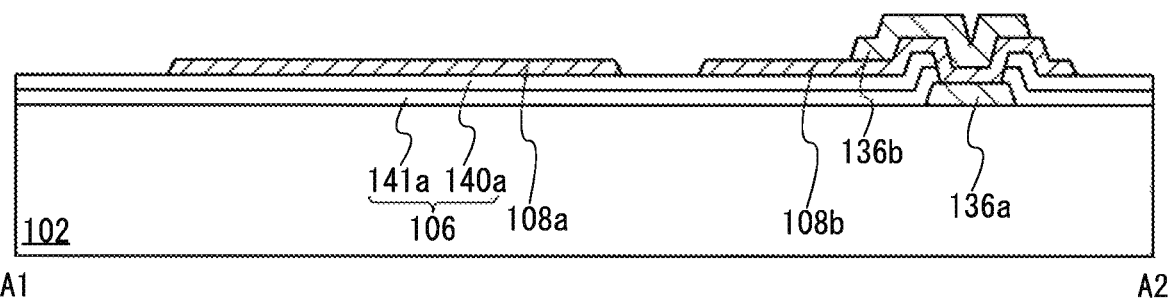
FIG. 18A is a cross-sectional view showing the method for producing the display device in an embodiment according to the present invention, taken along line A1-A2 in FIG. 17.
Figure 18B:
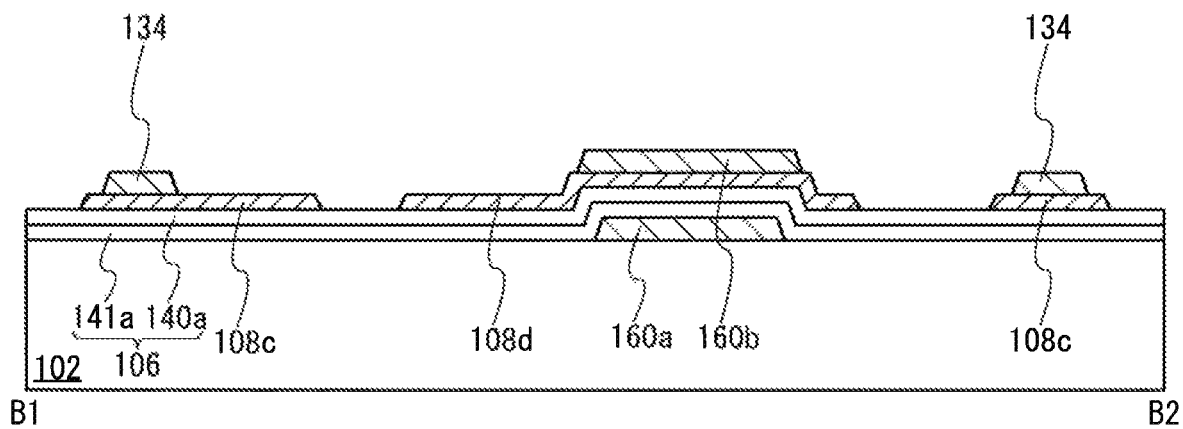
FIG. 18B is a cross-sectional view showing the method for producing the display device in an embodiment according to the present invention, taken along line B1-B2 in FIG. 17.

FIG. 17, FIG. 18A and FIG. 18B show a state where the third conductive film 109 and the second conductive film 107 are etched by use of the resist masks 207. FIG. 17 is a plan view of a region corresponding to one pixel 122*a*. FIG. 18A is a cross-sectional view taken along line A1-A2 in FIG. 17, and FIG. 18B is a cross-sectional view taken along line B1-B2 in FIG. 17.

The first oxide conductive layer 108*a*, the second oxide conductive layer 108*b*, the third oxide conductive layer 108*c* and the fourth oxide conductive layer 108*d* are formed of the second conductive film 107. The first oxide conductive layer 108*a*, the second oxide conductive layer 108*b*, the third oxide conductive layer 108*c* and the fourth oxide conductive layer 108*d* are formed on the second insulating layer 106. The second common line 136*b*, the second capacitance electrode 160*b* and the data signal line 134 are formed of the third conductive film 109. The second common line 136*b* is formed on the second oxide conductive layer 108*b*. The second common line 136*b* is formed in contact with the top surface of the second oxide conductive layer 108*b*. In this state, the first common line 136*a*, the second oxide conductive layer 108*b* and the second common layer 136*b* are electrically connected with each other.

The second capacitance electrode 160*b* is formed in contact with a top surface of the fourth oxide conductive layer 108*d*. The second capacitance electrode 160*b* is located to at least partially overlap the first capacitance electrode 160*a* while having the fourth oxide conductive layer 108*d* and the second insulating layer 106 between the second capacitance electrode 160*b* and the first capacitance electrode 160*a*. The capacitance element 128 is formed in a region where the first capacitance electrode 160*a* and the second capacitance electrode 160*b* overlap each other while having the second insulating layer 106 therebetween.

The data signal line 134 is formed in contact with the top surface of the third oxide conductive layer 108*c*. In this state, the third oxide conductive layer 108*c* and the data signal line 134 are electrically connected with each other. The third oxide conductive layer 108*c* is provided along the data signal line 134, and thus is electrically connected with the data signal line 134 with certainty.

An end of the second common line 136*b* is located inner to an end of the second oxide conductive layer 108*b*. With such an arrangement, even though the second oxide conductive layer 108*b* and the second common line 136*b* are stacked on each other, the ends thereof form a stepped portion. Therefore, the step coverage of the oxide semiconductor layer 112 and the first insulating layer 114 formed in a later stage is in a good state. Similarly, an end of the data signal line 134 is located inner to an end of the third oxide conductive layer 108*c*, and an end of the second capacitance electrode 160*b* is located inner to an end of the fourth oxide conductive layer 108*d*. Therefore, the step coverage of the oxide semiconductor layer 112 and the first insulating layer 114, which are to be formed on these ends in a later stage, are in a good state.

Figure 19:
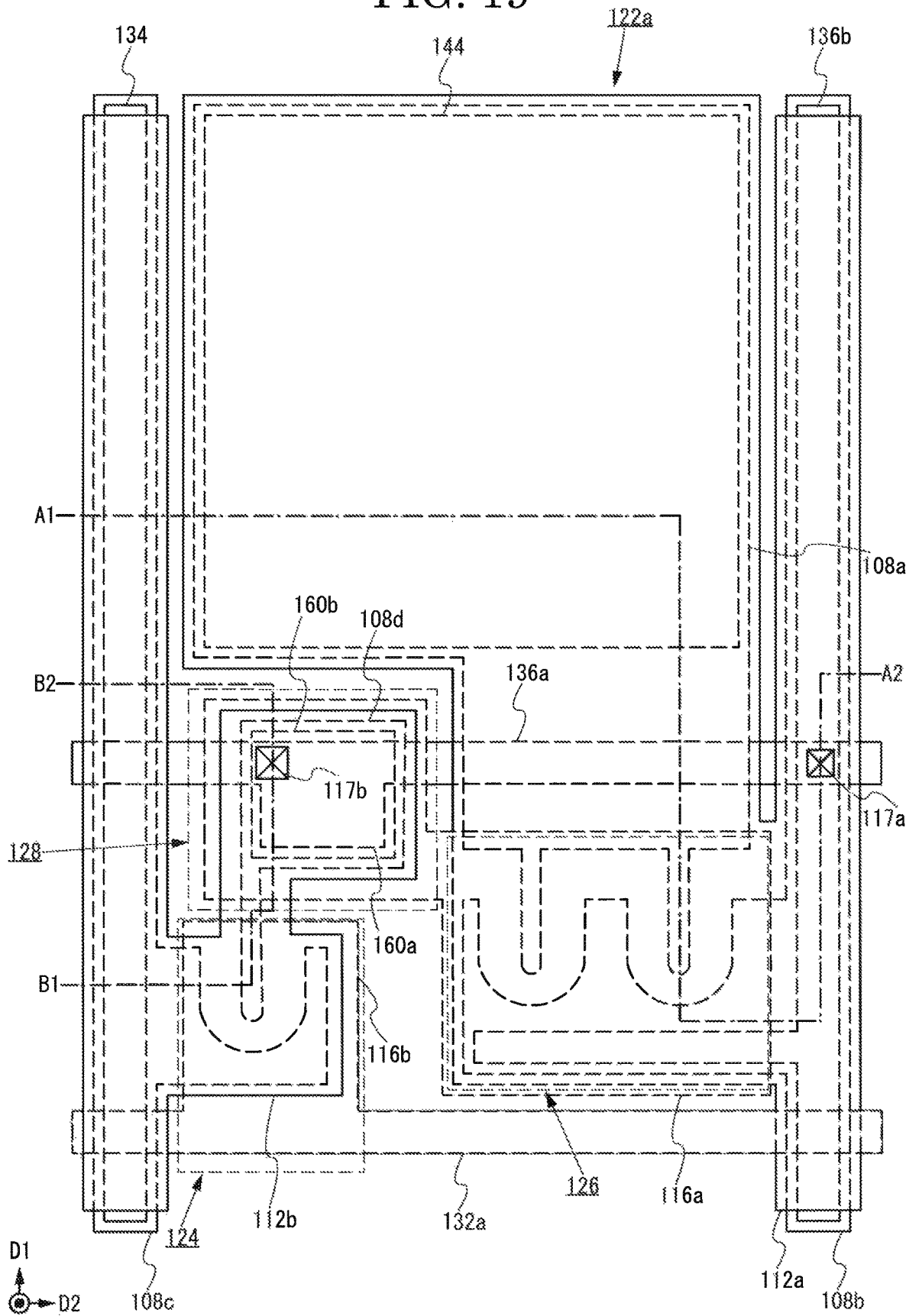
FIG. 19 is a plan view showing a method for producing the display device in an embodiment according to the present invention.
Figure 20A:
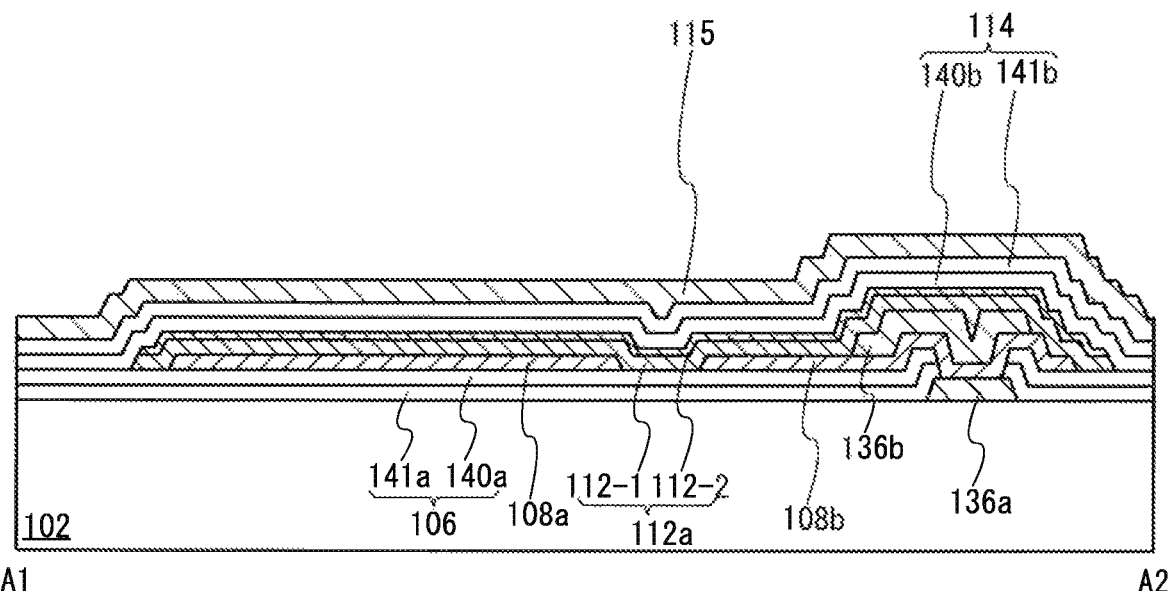
FIG. 20A is a cross-sectional view showing the method for producing the display device in an embodiment according to the present invention, taken along line A1-A2 in FIG. 19.
Figure 20B:
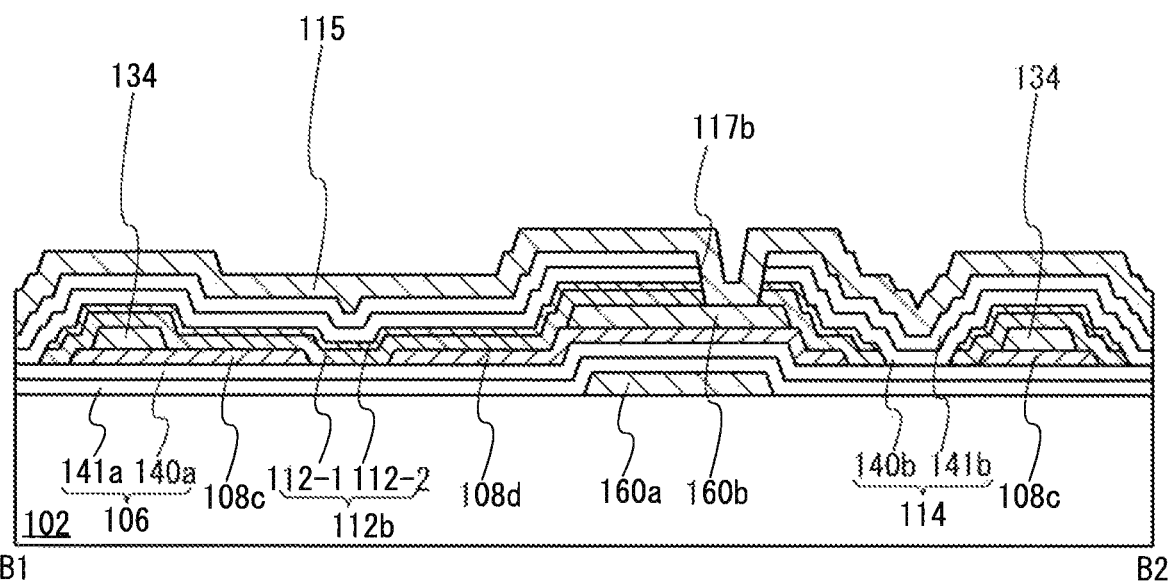
FIG. 20B is a cross-sectional view showing the method for producing the display device in an embodiment according to the present invention, taken along line B1-B2 in FIG. 19.

FIG. 19, FIG. 20A and FIG. 20B show a stage of forming the oxide semiconductor layer 112, the first insulating layer 114 and the fourth conductive film 115. FIG. 19 is a plan view of a region corresponding to one pixel 122*a*. FIG. 20A is a cross-sectional view taken along line A1-A2 in FIG. 19, and FIG. 20B is a cross-sectional view taken along line B1-B2 in FIG. 19.

The first oxide semiconductor layer 112*a* is formed to cover substantially the entire surfaces of the first oxide conductive layer 108*a* and the second oxide conductive layer 108*b*. The second oxide semiconductor layer 112*b* is formed to cover substantially the entire surfaces of the third oxide conductive layer 108*c* and the fourth oxide conductive layer 108d. The first oxide semiconductor layer 112a and the second oxide semiconductor layer 112b each have a stack structure including the first region 112-1 and the second region 112-2. The first oxide semiconductor layer 112a and the second oxide semiconductor layer 112b are formed as follows. The first region 112-1 and the second region 112-2 are formed in this order by sputtering by use of an oxide semiconductor as a target, and are subjected to a lithography step. As a result, the first oxide semiconductor layer 112a and the second oxide semiconductor layer 112b having a predetermined shape described above are formed. The first region 112-1 of the first oxide semiconductor layer 112a is formed in contact with, and thus is electrically connected with, the first oxide conductive layer 108a and the second oxide conductive layer 108b. The first region 112-1 of the second oxide semiconductor layer 112b is formed in contact with, and thus is electrically connected with, the third oxide conductive layer 108c and the fourth oxide conductive layer 108d.

The first insulating layer 114 is formed on a top surface of the first oxide semiconductor layer 112a and the second oxide semiconductor layer 112b. The first insulating layer 114 is formed by, for example, stacking the second silicon oxide film 140b and the second silicon nitride film 141b in this order from the oxide semiconductor layer 112 side. As a result, the first silicon oxide film 140a is formed below the oxide semiconductor layer 112, and the second silicon oxide film 140b is formed above the oxide semiconductor layer 112. The oxide semiconductor layer 112 is held between the oxide insulating films, and thus is suppressed from having a defect (donor level) caused thereto by oxygen deficiency.

It is desired that the silicon oxide films 140a and 140b do not have oxygen deficiency so as not to draw out oxygen from the first oxide semiconductor layer 112a. Rather, it is even preferred that the first silicon oxide films 140a and 140b contain an excessive amount of oxygen. The first insulating layer 114, after being formed, is heat-treated at a temperature of 250° C. to 400° C., and thus oxygen is diffused from the first silicon oxide film 140a and the second silicon oxide film 140b to the first oxide semiconductor 112a and the second oxide semiconductor layer 112b. Since such heat treatment is performed, even if the oxide semiconductor layer 112 includes oxygen deficiency, the oxygen deficiency is compensated for by oxygen diffused from the silicon oxide films 140, and the defect, which would become a donor level, is extinguished. Therefore, the resistance is increased.

In the second layer 114, the second contact hole 117b is formed in a region overlapping the second capacitance electrode 160b. Then, the fourth conductive film 115 is formed. The fourth conductive film 114 is formed in substantially the same manner as the first conductive film 103.

Figure 21:
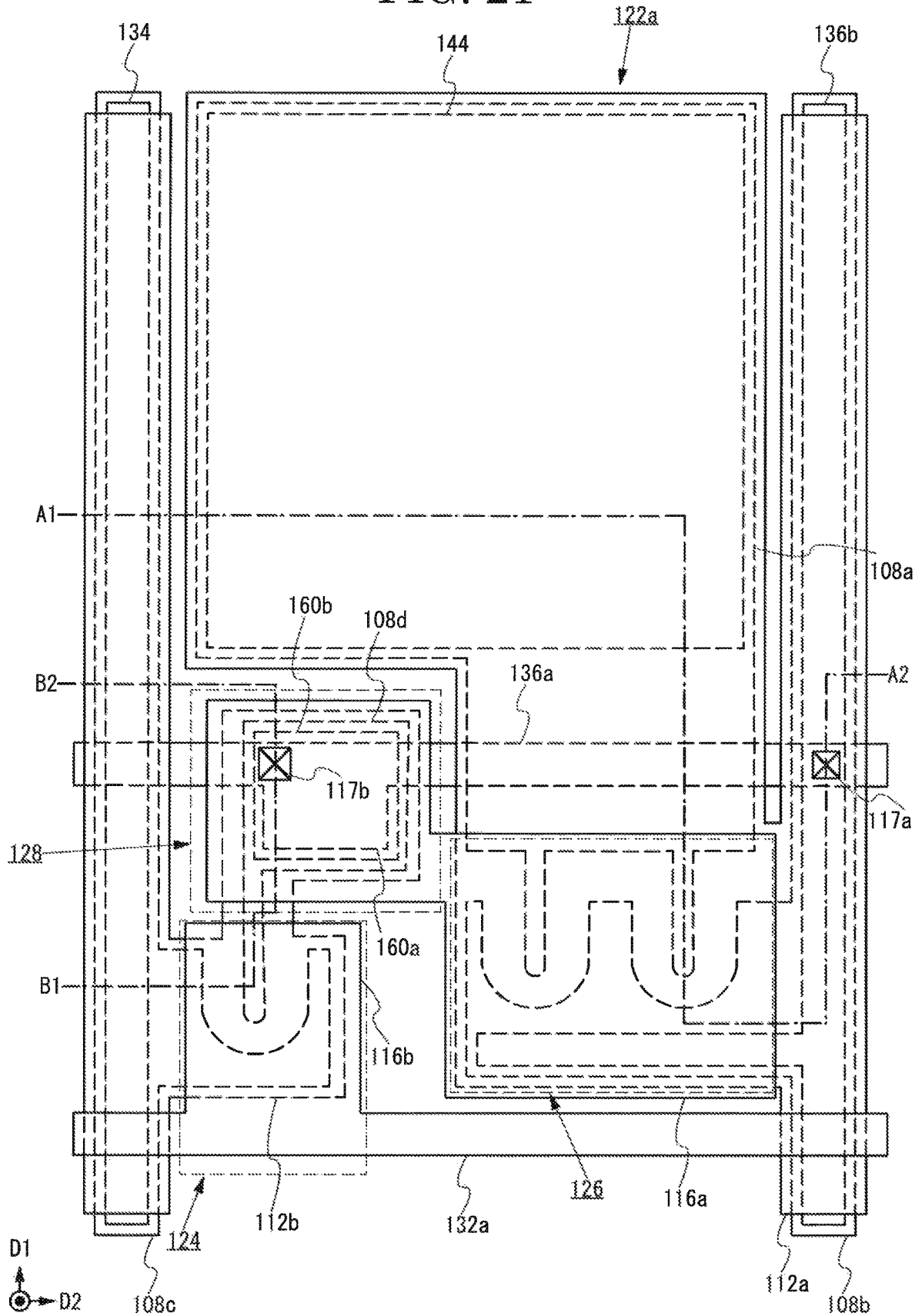
FIG. 21 is a plan view showing the method for producing the display device in an embodiment according to the present invention.
Figure 22A:
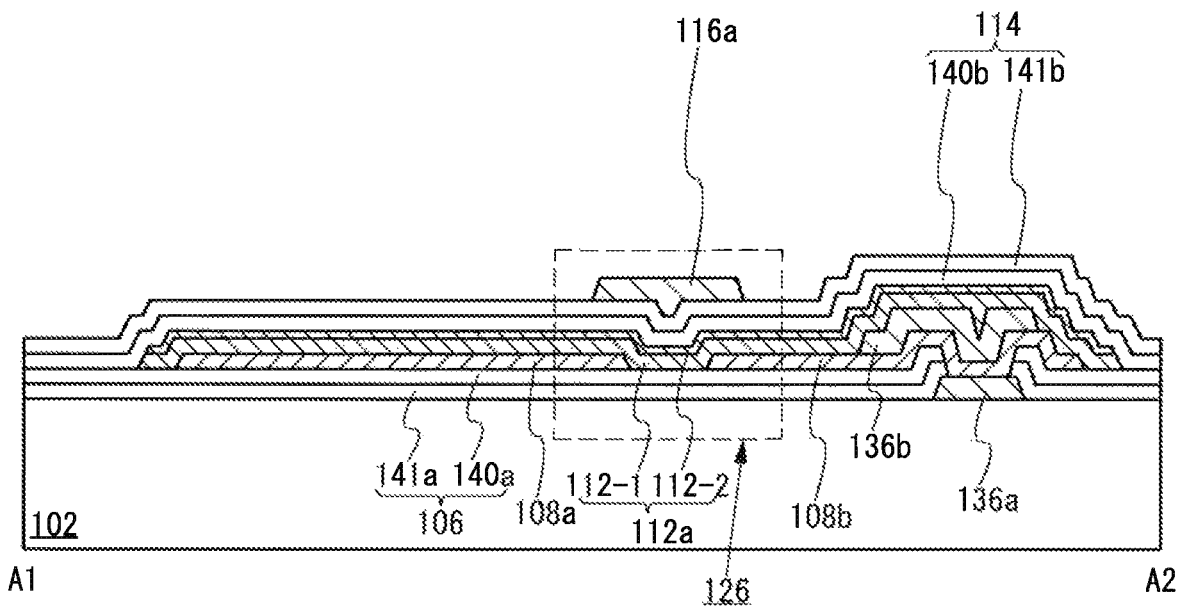
FIG. 22A is a cross-sectional view showing the method for producing the display device in an embodiment according to the present invention, taken along line A1-A2 in FIG. 21.
Figure 22B:
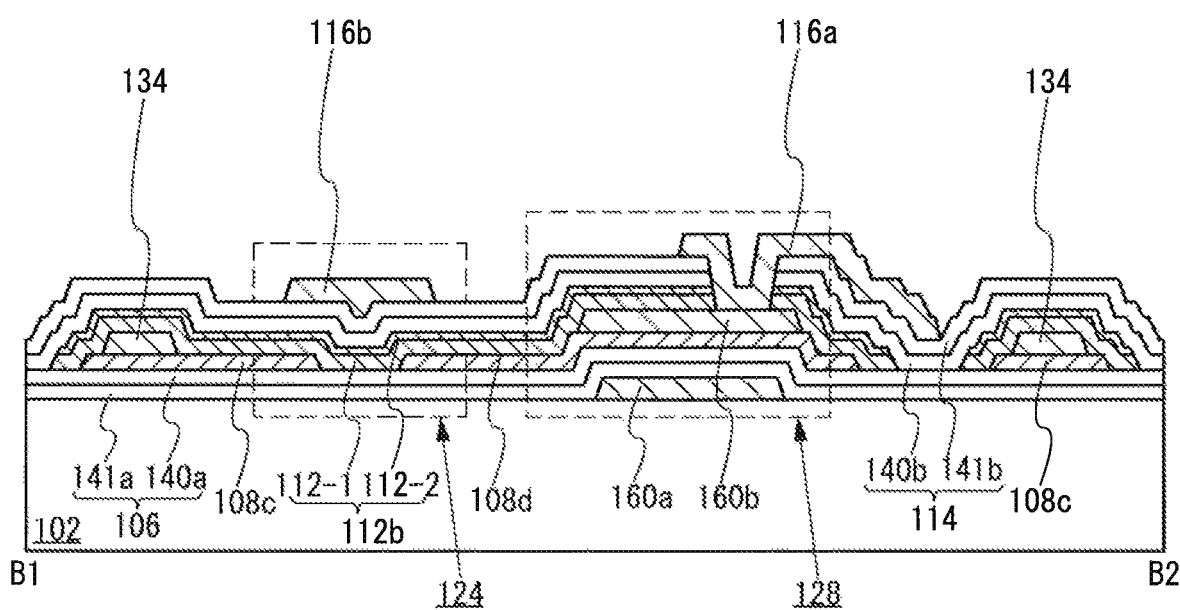
FIG. 22B is a cross-sectional view showing the method for producing the display device in an embodiment according to the present invention, taken along line B1-B2 in FIG. 21.

FIG. 21, FIG. 22A and FIG. 22B show a stage of forming the first gate electrode 116. FIG. 21 is a plan view of a region corresponding to one pixel 122a. FIG. 22A is a cross-sectional view taken along line A1-A2 in FIG. 21, and FIG. 22B is a cross-sectional view taken along line B1-B2 in FIG. 21.

The first gate electrode 116 is formed by a lithography step and an etching step performed on the fourth conductive film 115. The first gate electrode 116a is formed to include a region overlapping an end part of each of the first oxide conductive layer 108a and the second oxide conductive layer 108b, with the first insulating layer 114 being provided between the first gate electrode 116a and the first oxide conductive layer 108a/the second oxide conductive layer 108b. The first gate electrode 116b is formed to include a region overlapping an end part of each of the third oxide conductive layer 108c and the fourth oxide conductive layer 108d, with the first insulating layer 114 being provided between the first gate electrode 116a and the third oxide conductive layer 108c/the fourth oxide conductive layer 108d. As a result, the driving transistor 126 and the selection transistor 124 are formed. The capacitance element 128 is electrically connected with the first gate electrode 116a via the contact hole 117b.

Figure 23A:
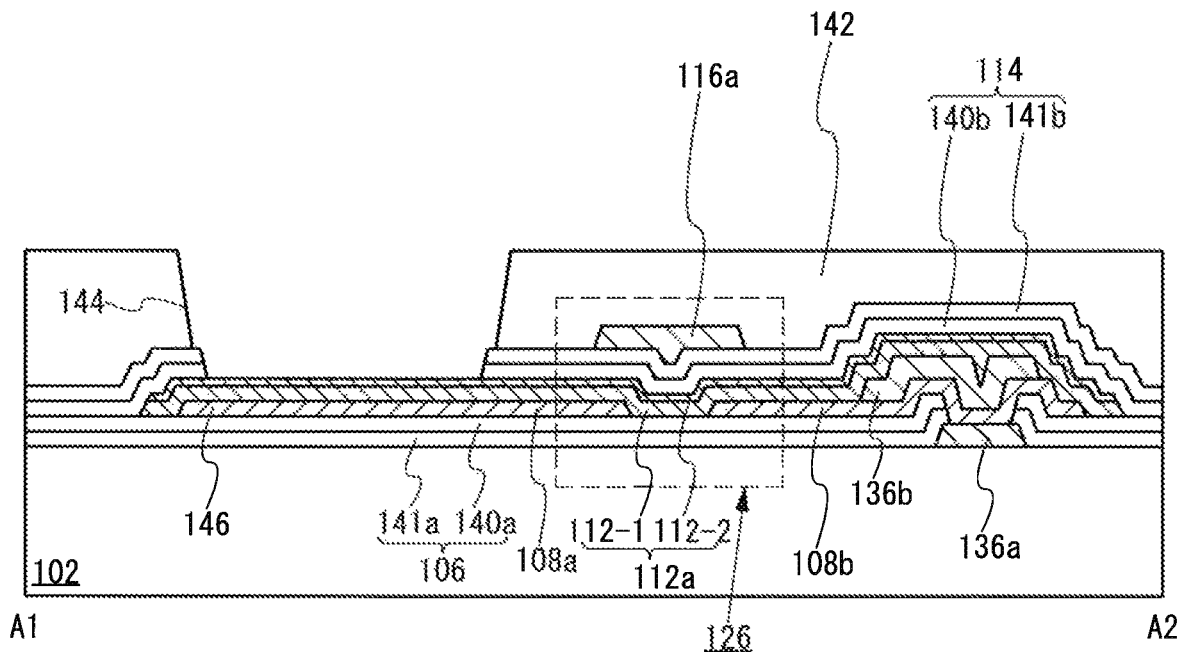
FIG. 23A is a cross-sectional view showing the method for producing the display device in an embodiment according to the present invention, taken along line A1-A2 in FIG. 21.
Figure 23B:
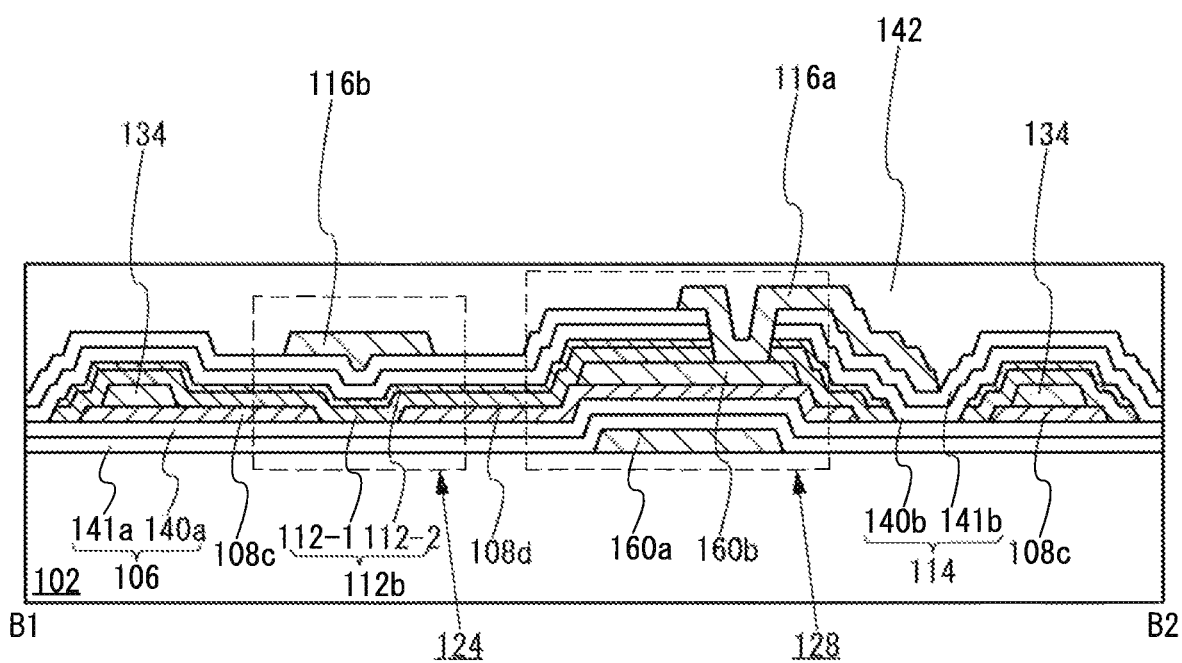
FIG. 23B is a cross-sectional view showing the method for producing the display device in an embodiment according to the present invention, taken along line B1-B2 in FIG. 21.

As shown in FIG. 23A and FIG. 23B, the flattening layer 142 is formed to bury the selection transistor 124, the driving transistor 126 and the capacitance element 128. The flattening layer 142 is formed of an organic resin material such as, for example, an acrylic resin, a polyimide resin, an epoxy resin, a polyamide resin or the like. In the flattening layer 142, the opening 144 is formed in a region overlapping the first electrode 146, which is the cathode electrode, in order to expose the first oxide semiconductor layer 112a. In the case where the flattening layer 142 is formed of a photosensitive resin material, the opening 144 is formed by exposure to light by use of a photomask. Before the flattening layer 142 is formed, an opening is formed in advance in the first insulating layer 114 in a region corresponding to the opening 144. Alternatively, an opening that exposes the first oxide semiconductor layer 112a may be formed in the first insulating layer 114 in the step of forming the opening 144 in the flattening layer 142. It is preferred that the opening 144 in the flattening layer 142 has a tapered inner wall in order to allow the organic EL element 130 to be formed easily.

Figure 24A:
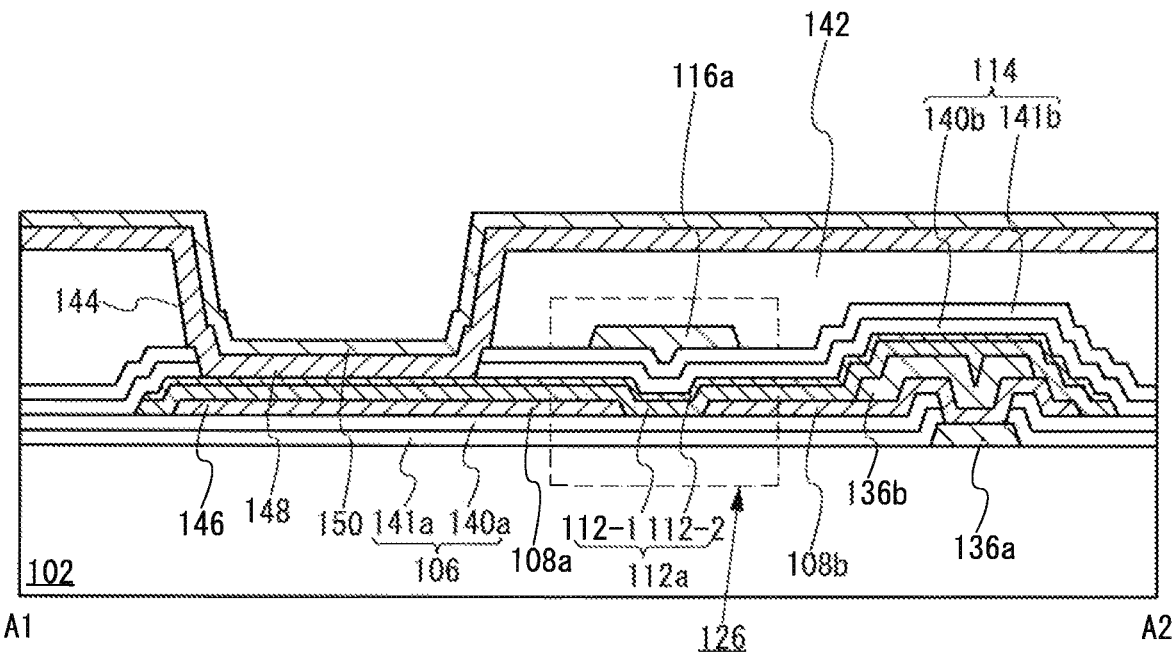
FIG. 24A is a cross-sectional view showing the method for producing the display device in an embodiment according to the present invention, taken along line A1-A2 in FIG. 21.
Figure 24B:
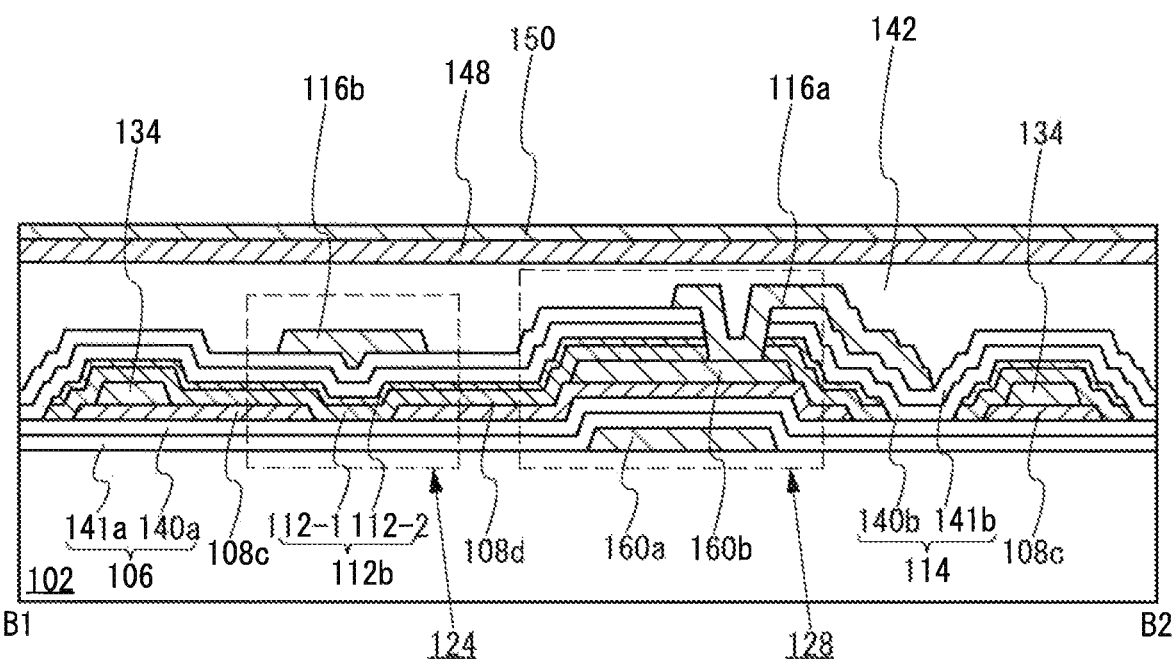
FIG. 24B is a cross-sectional view showing the method for producing the display device in an embodiment according to the present invention, taken along line B1-B2 in FIG. 21.

FIG. 24A and FIG. 24B show a stage of forming the electron transfer layer 148 and the electron injection layer 150. The electron transfer layer 148 is formed of a metal oxide material. Examples of the metal oxide material usable for the electron transfer layer 148 include substantially the same materials described in embodiment 1, specifically, a four-component oxide material, a three-component oxide material, a two-component oxide material, and a one-component oxide material. The electron transfer layer 148 is formed by sputtering by use of any of the above-listed materials as a sputtering target. The electron injection layer 150 is formed of C12A7 electride. The electron injection layer 150 may be formed by sputtering by use of C12A7 electride as a sputtering target. In this case, the sputtering may be performed by use of at least one type of gas selected from the group consisting of He (helium), Ne (neon), $N_2$ (nitrogen), Ar (argon), NO (nitrogen monoxide), Kr (krypton), and Xe (xenon). The electron transfer layer 148 and the electron injection layer 150 are used commonly in a plurality of the pixels 122a, and therefore are formed on substantially the entirety of a region where the pixels 122a are located.

Then, the light emitting layer 152, the hole transfer layer 154, the hole injection layer 156 and the second electrode 158 as the anode electrode are formed. As a result, the pixel shown in FIG. 11A and FIG. 11B is formed. The light emitting layer 152 is formed of different light emitting materials for red pixels, green pixels and blue pixels. In the case where light emitted from the light emitting layer 152 has a white light emission spectrum, the light emitting layer 152 may be formed in substantially the entirety of the display region 121 as a layer common to all the pixels 122a. The hole transfer layer 154 and the hole injection layer 156 are each formed on substantially the entirety of the region where the pixels 122a are located, as layers common to all the pixels 122a. The second electrode 158 as the anode electrode is used as a common electrode to the pixels 122a, and therefore is formed on substantially the entirety of the region where the pixels 122a.

Figure 25A:
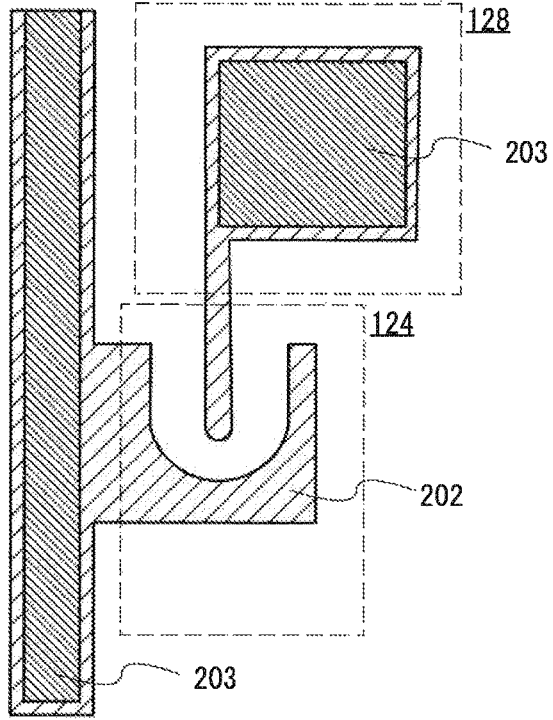
FIG. 25A is a plan view of showing a photomask used for manufacturing a display device in an embodiment according to the present invention.
Figure 25B:
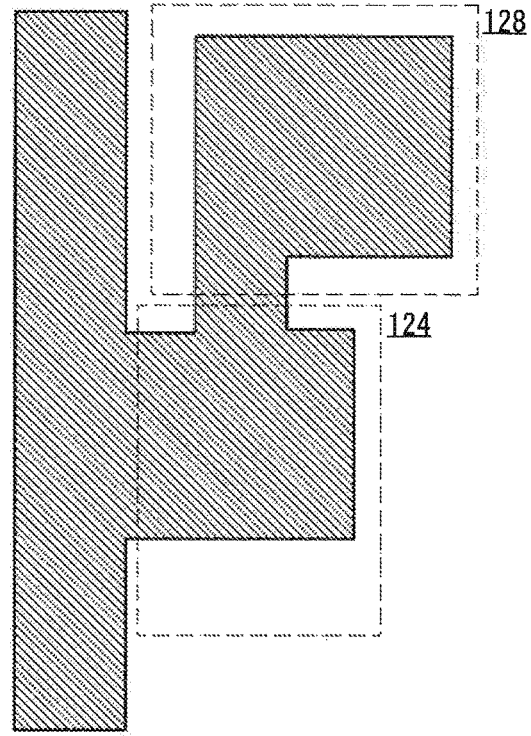
FIG. 25B is a plan view of showing a photomask used for manufacturing a display device in an embodiment according to the present invention.
Figure 25C:
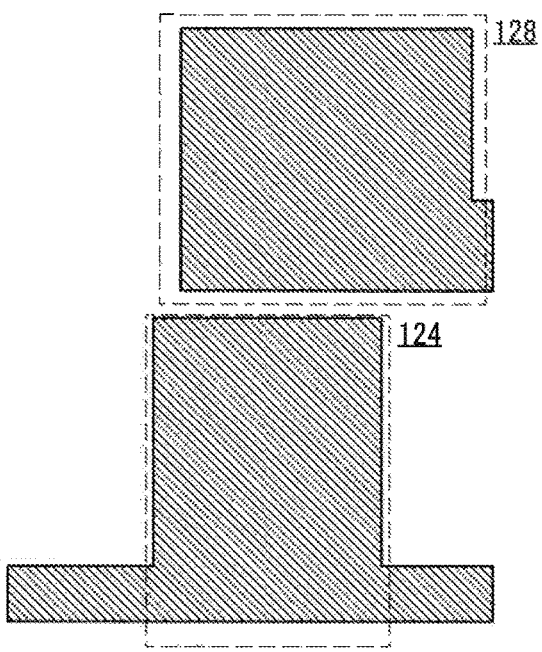
FIG. 25C is a plan view of showing a photomask used for manufacturing a display device in an embodiment according to the present invention.

According to the method of manufacturing the display device 120 in this embodiment, the multi-gradation photomask 201 is used to decrease the number of photomasks required to manufacture the display device 120. FIG. 25A to FIG. 25C each show a pattern of a photomask usable to manufacture the display device 120, more specifically, a part of the photomask in the vicinity of the capacitance element 128 and the selection transistor 124. FIG. 25A shows the multi-gradation photomask 201 usable to form the third oxide conductive layer 108c, the fourth oxide conductive layer 108d, the data signal line 134 and the second capacitance electrode 160b. The non-transmissive regions 203 of the multi-gradation photomask 201 correspond to the regions where the data signal 134 and the second capacitance electrode 160b are to be formed. The semi-transmissive region 202 corresponds to the regions where the third oxide conductive layer 108c and the fourth oxide conductive layer 108d are to be formed. By use of the multi-gradation photomask 201 having such a pattern, a plurality of patterns (the first oxide conductive layer 108a, the second oxide conductive layer 108b, the third oxide conductive layer 108c, the fourth oxide conductive layer 108d, the data signal line 134, the second common line 136b, the second capacitance electrode 160b, and the like) are formed by one cycle of exposure. FIG. 25B shows a photomask usable to form the second oxide semiconductor layer 112b. By use of the photomask having such a pattern, a plurality of patterns (the first oxide semiconductor layer 112a and the second oxide semiconductor layer 112b) are formed by one cycle of exposure. FIG. 25C shows a photomask usable to form the first gate electrode 116. By use of the photomask having such a pattern, a plurality of patterns (the first gate electrode 116a and the first gate electrode 116b) are formed by one cycle of exposure. As a result, the productivity of the display device 120 is improved, and the production cost is decreased. In this embodiment, the transistors are described as thin film transistors of an organic EL display device. The selection transistor 124 is also applicable to a liquid crystal display device. The photomasks shown in FIG. 25A to FIG. 25C may be modified to form a selection transistor for a liquid crystal display device.

In this embodiment, the selection transistor 124 and the driving transistor 126 are both of a top-gate type. The present invention is not limited to this. For example, the selection transistor 124 and the driving transistor 126 may each be a dual-gate transistor, in which a bottom gate is located in a region overlapping the first gate electrode 116 as described below. The pixel circuit is not limited to the circuit shown in FIG. 9. The transistors and the organic EL element in this embodiment are applicable to a pixel circuit including three or more transistors in one pixel.

Embodiment 3

In embodiment 3, a transistor having a structure different from that in embodiment 1 will be described. In embodiment 3, unlike in embodiment 1, a second gate electrode 104 is located to face one surface of the oxide semiconductor layer 112 (surface facing the substrate 102). Components that are the same as those in embodiments 1 and 2 will bear the same reference signs, and the descriptions thereof will not be repeated.

3-1. Transistor Structure

Figure 26:
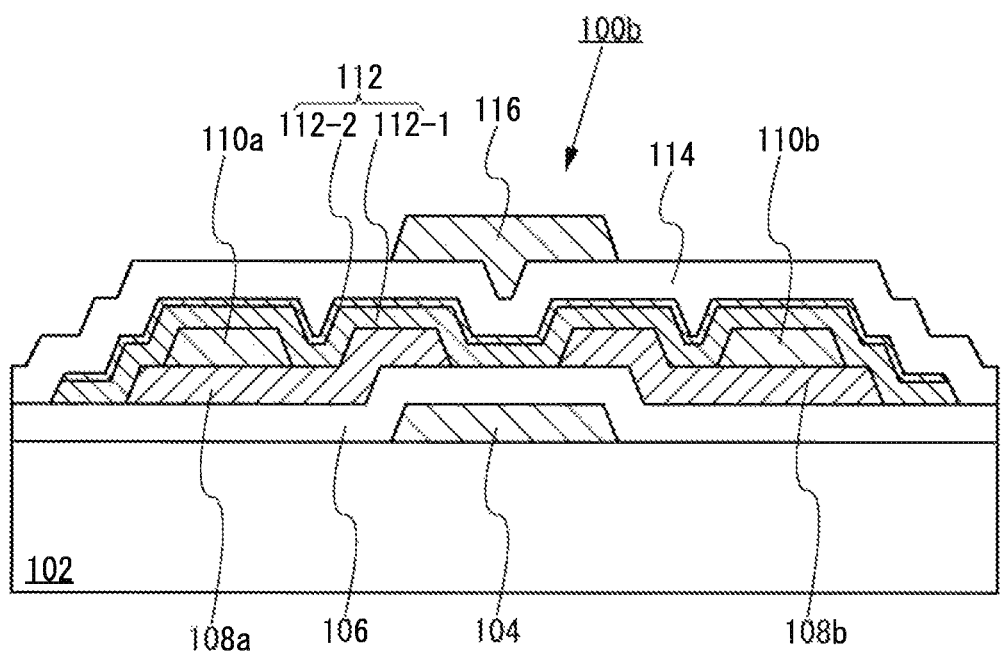
FIG. 26 is a cross-sectional view showing a structure of a transistor in an embodiment according to the present invention.

FIG. 26 is a cross-sectional view showing a structure of a transistor 100b in an embodiment according to the present invention. The transistor 100b includes the second gate electrode 104, the second insulating layer 106, the oxide semiconductor layer 112, the first insulating layer 114, and the first gate electrode 116, which are provided on the substrate 102 having an insulating surface. The oxide semiconductor layer 112 includes the first region 112-1 and the second region 112-2 stacked from the substrate 102 side.

The second gate electrode 104 is located to face one surface of the oxide semiconductor layer 112 (surface facing the substrate 102). The second insulating layer 106 is located between the oxide semiconductor layer 112 and the second gate electrode 104. The first gate electrode 116 is located to face the other surface of the oxide semiconductor layer 112 (surface opposite to the surface facing the substrate 102). The first insulating layer 114 is located between the oxide semiconductor layer 112 and the first gate electrode 116. The second gate electrode 104 and the first gate electrode 116 are located to partially overlap each other while having the second insulating layer 106, the oxide semiconductor layer 112 and the first insulating layer 114 between the second gate electrode 104 and the first gate electrode 116. In the transistor 100b, a channel is formed in a region where the oxide semiconductor layer 112 overlaps the second gate electrode 104 and the first gate electrode 116. The second insulating layer 106 acts as a gate insulating film in a region where the oxide semiconductor layer 112 and the second gate electrode 104 overlap each other. The first insulating layer 114 acts as a gate insulating film in a region where the oxide semiconductor layer 112 and the first gate electrode 116 overlap each other.

The second insulating layer 106 is located between the oxide semiconductor layer 112 and the second gate electrode 104. The first oxide conductive layer 108a and the second oxide conductive layer 108b are located between the oxide semiconductor layer 112 and the second insulating layer 106. The first oxide conductive layer 108a and the second oxide conductive layer 108b are provided in contact with the oxide semiconductor layer 112. The first oxide conductive layer 108a and the second oxide conductive layer 108b are located such that one end part of the first oxide conductive layer 108a and one end part of the second oxide conductive layer 108b overlap each of the second gate electrode 104 and the first gate electrode 116. One of the first oxide conductive layer 108a and the second oxide conductive layer 108b acts as a source region, and the other of the first oxide conductive layer 108a and the second oxide conductive layer 108b acts as a drain region. With the structure shown in FIG. 26, the first oxide conductive layer 108a and the second oxide conductive layer 108b are located such that one end part of the first oxide conductive layer 108a and one end part of the second oxide conductive layer 108b overlap each of the second gate electrode 104 and the first gate electrode 116. Therefore, the oxide semiconductor layer 112 does not include any offset region (region having a high resistance). Thus, the level of on-current is increased.

The first line 110a is provided in contact with the first oxide conductive layer 108a, and the second line 110b is provided in contact with the second oxide conductive layer 108b. The first line 110a is located between the first oxide conductive layer 108a and the oxide semiconductor layer 112, and the second line 110b is located between the second oxide conductive layer 108b and the oxide semiconductor layer 112. The first line 110a and the second line 110b are respectively located in contact with the first oxide conductive layer 108a and the second oxide conductive layer 108b. This decreases the number of photolithography steps 3-2. Operations and Functions of the Transistor In the transistor 100b, the second gate electrode 104 is located to face one surface of the oxide semiconductor layer 112 (surface facing the substrate 102), and the first gate electrode 116 is located to face the other surface of the oxide semiconductor layer 112 (surface opposite to the surface facing the substrate 102). A channel is formed in the region where the oxide semiconductor layer 112 overlaps the second gate electrode 104 and the first gate electrode 116. The second region 112-2 included in the oxide semiconductor layer 112 has a carrier concentration lower than that of the first region 112-1. Therefore, the transistor 100b forms the channel in the first region 112-1 of the oxide semiconductor layer 112. An electric current flows in an area, of the first region 112-1 of the oxide semiconductor layer 112, that is closer to the second region 112-2 (on the first gate electrode 116 side), and also in an area, of the first region 112-1, that is closer to the second insulating layer 106; namely, the electric current flows at both of the upper interface and the lower interface of the first region 112-1. Therefore, the field effect mobility of the transistor 100b is increased. In addition, the threshold voltage of the transistor 100b is suppressed from being fluctuated, and thus the transistor 100b has a higher reliability because of stable electric characteristics.

One of the second gate electrode 104 and the first gate electrode 116 may be supplied with a constant potential (fixed potential) to act as a back gate. In the case where the transistor 100b is of an n-channel type, one of the second gate electrode 104 and the first gate electrode 116 may be supplied with, for example, a potential lower than the source potential to act as a back gate electrode. As a result, the threshold voltage of the transistor 100b is suppressed from being fluctuated. Alternatively, the second gate electrode 104 and the first gate electrode 116 of the transistor 100b may be supplied with the same gate voltage to act as dual-gates. As a result, the transistor 100b has an increased on-current and improved frequency characteristics.

In the transistor 100b, the first oxide conductive layer 108a and the second oxide conductive layer 108b are located on one surface of the oxide semiconductor layer 112 (surface facing the substrate 102). The first oxide conductive layer 108a and the second oxide conductive layer 108b are in contact with the first region 112-1 of the oxide semiconductor layer 112. The first region 112-1 of the oxide semiconductor layer 112 has a conductivity higher than that of the second region 112-2. Therefore, the contact resistance between the first oxide conductive layer 108a and the first region 112-1 of the oxide semiconductor layer 112, and the contact resistance between the second oxide conductive layer 108b and the first region 112-1 of the oxide semiconductor layer 112, are decreased. In other words, the first oxide conductive layer 108a and the second oxide conductive layer 108b are in contact with the surface, of the oxide semiconductor layer 112, that faces the substrate 102, so that the contact resistance is decreased. The carrier concentration of the oxide conductive layer 108 is preferably $1 \times 10^{20}/cm^3$ or higher, and more preferably $1 \times 10^{21}/cm^3$ or higher. The conductivity of the oxide conductive layer 108 is preferably $1 \times 10^2$ S/cm or higher, and more preferably $1 \times 10^3$ S/cm or higher. The carrier concentration and the conductivity of the first region 112-1, of the oxide semiconductor layer 112, in contact with the oxide conductive layer 108 are both lower than those of the oxide conductive layer 108 by at least two digits. The carrier concentration and the conductivity of the second region 112-2, of the oxide semiconductor layer 112, in contact with the first region 112-1 of the oxide semiconductor layer 112 are both lower than those of the first region 112-1 by at least two digits. The carrier mobility of the second region 112-2 of the oxide semiconductor layer 112 is lower than that of the first region 112-1 of the oxide semiconductor layer 112.

3-3. Manufacturing Method

The method of manufacturing the transistor 100b is the same as the method of manufacturing the transistor in embodiment 1 except that the second gate electrode 104 is formed on one surface of the substrate 102 and that the second insulating layer 106, the second conductive film 107 and the third conductive film 109 are formed on the second gate electrode 104. In this section, only the stage of forming the second gate electrode 104 on the substrate 102 will be described. The second gate electrode 104 may be formed of a metal material same as the material used to form the first gate electrode 116.

First, a first conductive film is formed on one surface of the substrate 102. Then, a resist mask is formed on the first conductive film by a photolithography step, and the second gate electrode 104 is formed by an etching step. The first conductive film is not limited to having any specific thickness, but is formed to have a thickness of, for example, about 100 nm to about 2000 nm. It is preferred that the second gate electrode 104 has tapered ends as seen in a cross-sectional view. The second gate electrode 104 has tapered ends and thus is covered with the second insulating layer 106 with certainty. Therefore, in the etching step of forming the second gate electrode 104, it is preferred to perform anisotropic etching on the first conductive film while chemically milling the resist mask; namely, to perform so-called taper etching. The resist mask that is left after the formation of the second gate electrode 104 is removed by use of a releasing solution or by an ashing process.

Like in embodiment 1, with the method of manufacturing the transistor 100b in this embodiment, the first region 112-1 and the second region 112-2 of the oxide semiconductor layer 112 are formed continuously by using the same sputtering target and controlling the partial pressure of oxygen of the sputtering gas. This improves the productivity.

Embodiment 4

In embodiment 4, an example of display device including transistors having substantially the same structure as that of the transistor described in embodiment 3 will be described. Components that are the same as those in embodiments 1, 2 and 3 will bear the same reference signs, and the descriptions thereof will not be repeated.

4-1. Equivalent Circuit

Figure 27:
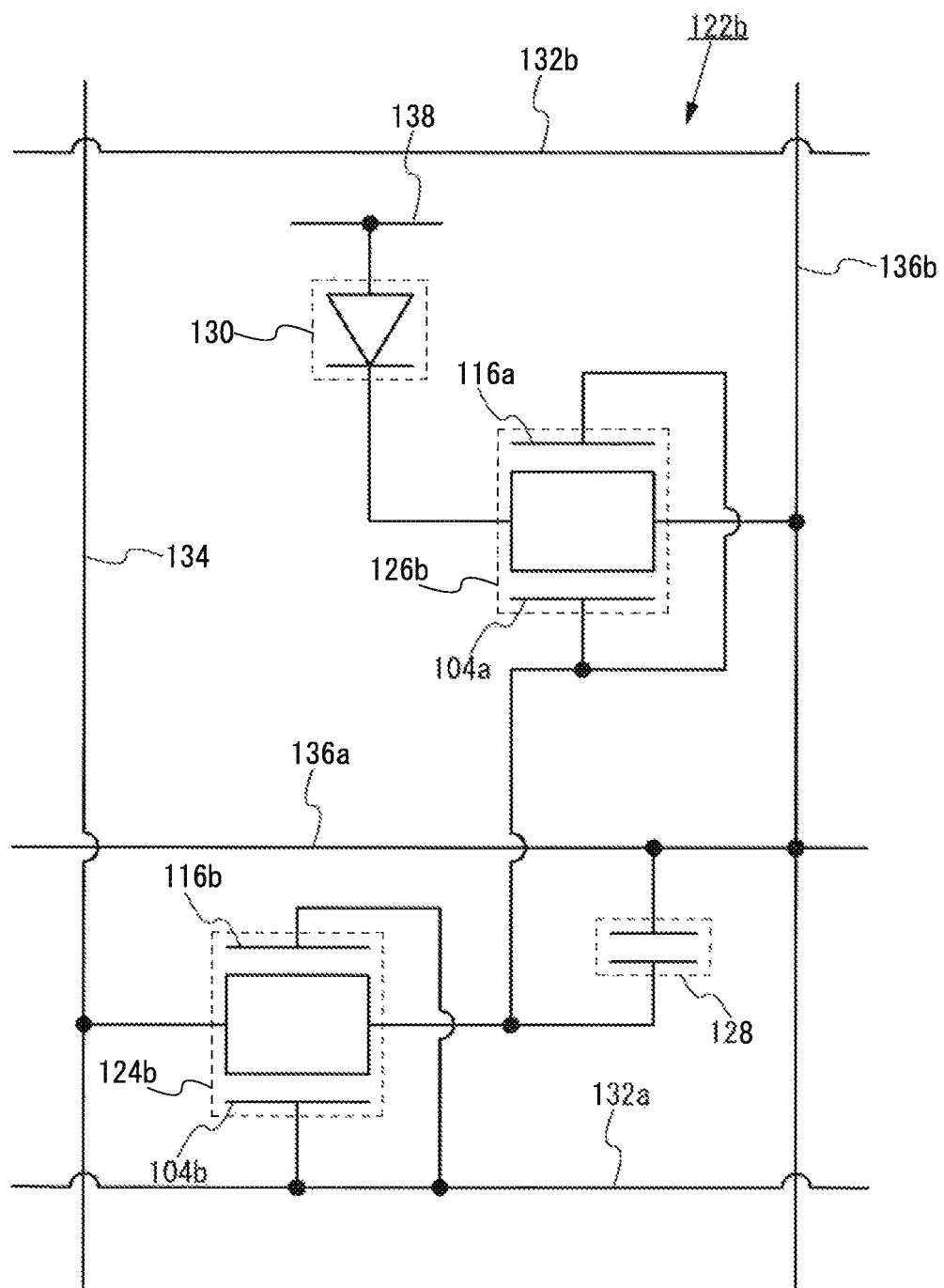
FIG. 27 shows an equivalent circuit of a pixel in the display device in an embodiment according to the present invention.

FIG. 27 is an equivalent circuit diagram of a pixel 122b included in the display device in this embodiment. The pixel 122b includes a selection transistor 124b, a driving transistor 126b, the capacitance element 128, and the organic EL element 130. The selection transistor 124b and the driving transistor 126b each have substantially the same structure as that of the transistor 100b described in embodiment 3. Namely, FIG. 27 shows the transistors of a dual-gate structure. The selection transistor 124b includes a second gate electrode 104b and the first gate electrode 116b, and the driving transistor 126b includes a second gate electrode 104a the first gate electrode 116a.

In this embodiment, the selection transistor 124b and the driving transistor 126b are each of an n-channel type. Gates of the selection transistor 124b (the second gate electrode 104b and the first gate electrode 116b) are connected with the gate signal line 132a. One of input/output terminals (source and drain) of the selection transistor 124*b* is connected with the data signal line 134, and the other of the input/output terminals is connected with gates of the driving transistor 126*b* (the second gate electrode 104*a* and the first gate electrode 116*a*). The gates of the driving transistor 126*b* (the second gate electrode 104*a* and the first gate electrode 116*a*) are connected with the other of the input/output terminals of the selection transistor 124*b*. A drain of the driving transistor 126*b* is connected with the organic EL element 130, and a source of the driving transistor 126*b* is connected with the second common line 136*b*. One of the two terminals of the capacitance element 128 is connected with the other of the input/output terminals (source and drain) of the selection transistor 124*b*. The other of the two terminals of the capacitance element 128 is connected with the first common line 136*a*. The first common line 136*a* and the second common line 136*b* are supplied with, for example, a ground potential.

One of the two terminals of the organic EL element 130 is connected with the drain of the driving transistor 126*b*, and the other of the two terminals of the organic EL element 130 is connected with the power supply line 138. The power supply line 138 is supplied with a power supply potential VDD, which is higher than the potential of the common line 136. In this embodiment, the terminal of the organic EL element 130 that is connected with the drain of the driving transistor 126*b* is a cathode electrode, and the terminal of the organic EL element 130 that is connected with the power supply line 138 is an anode electrode.

4-2. Pixel Structure

Figure 28:
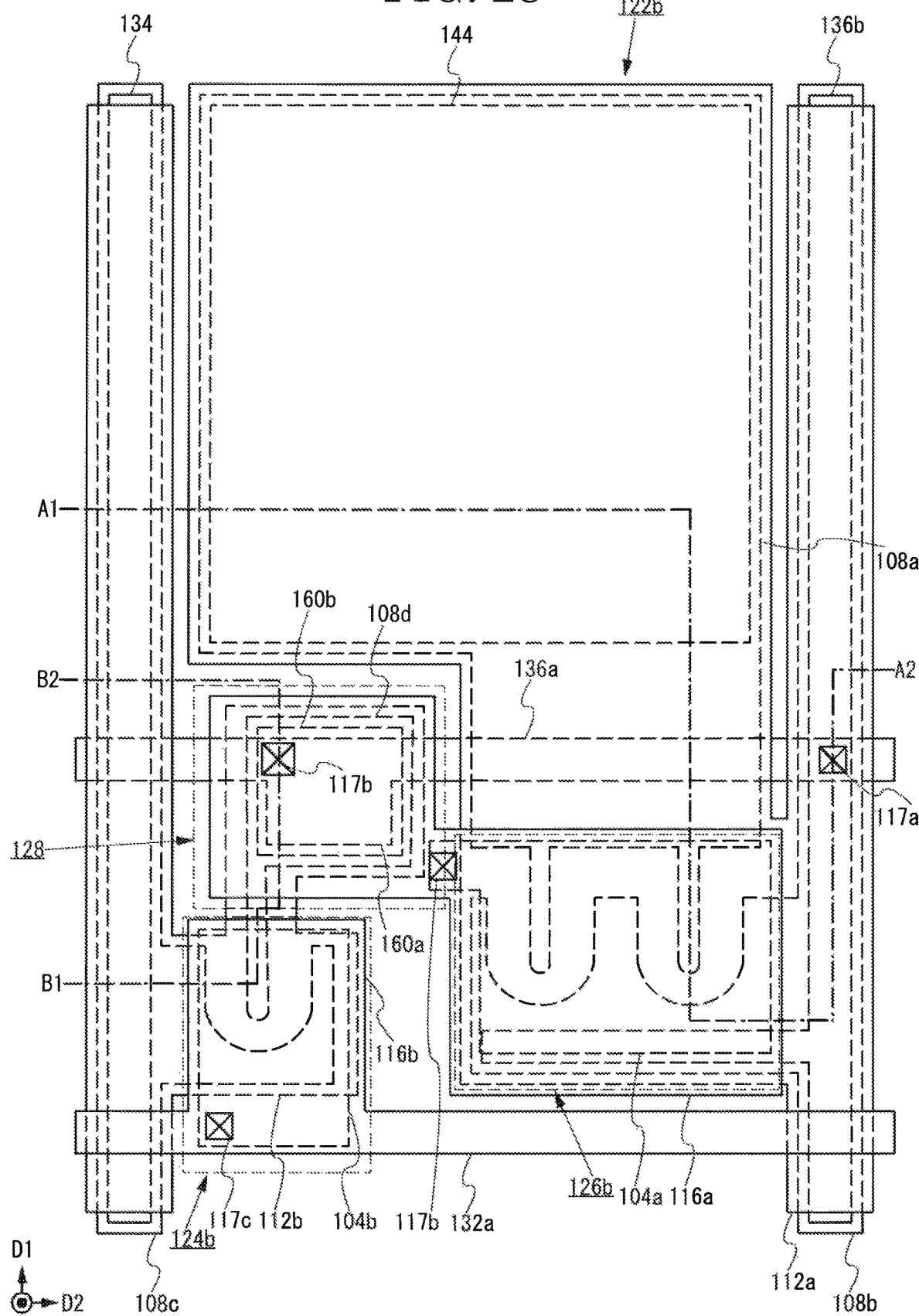
FIG. 28 is a plan view showing a structure of a pixel in the display device in an embodiment according to the present invention.
Figure 29A:
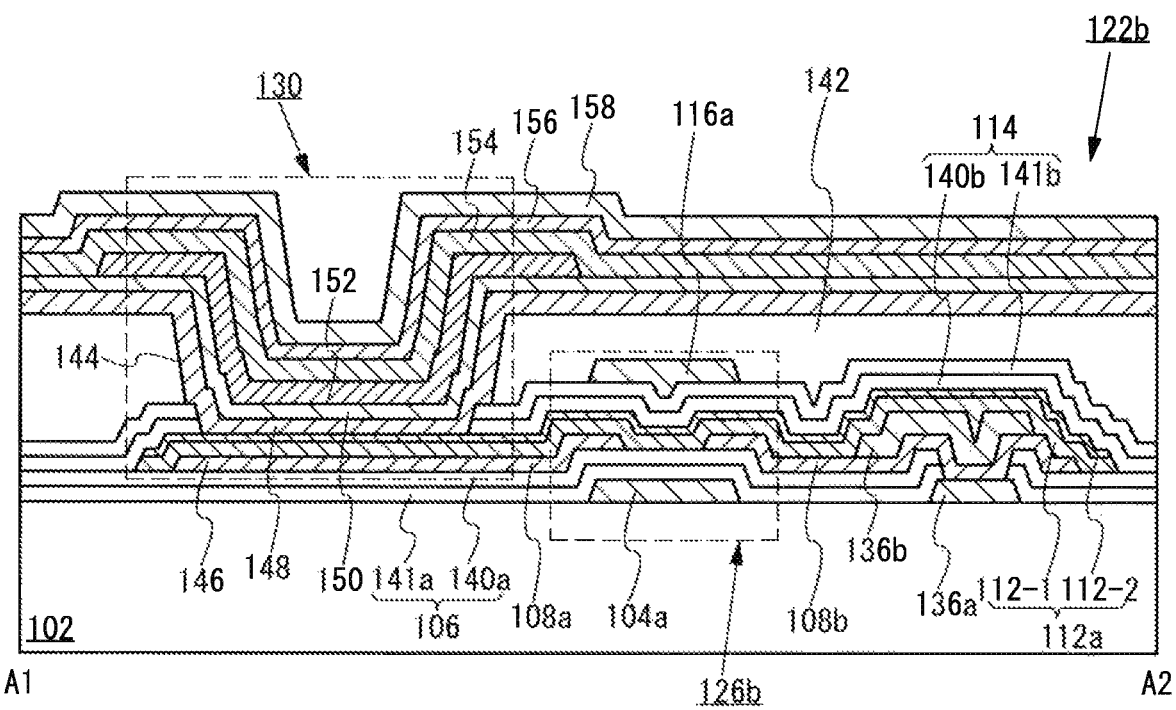
FIG. 29A is a cross-sectional view showing the structure of the pixel in the display device in an embodiment according to the present invention, taken along line A1-A2 in FIG. 28.
Figure 29B:
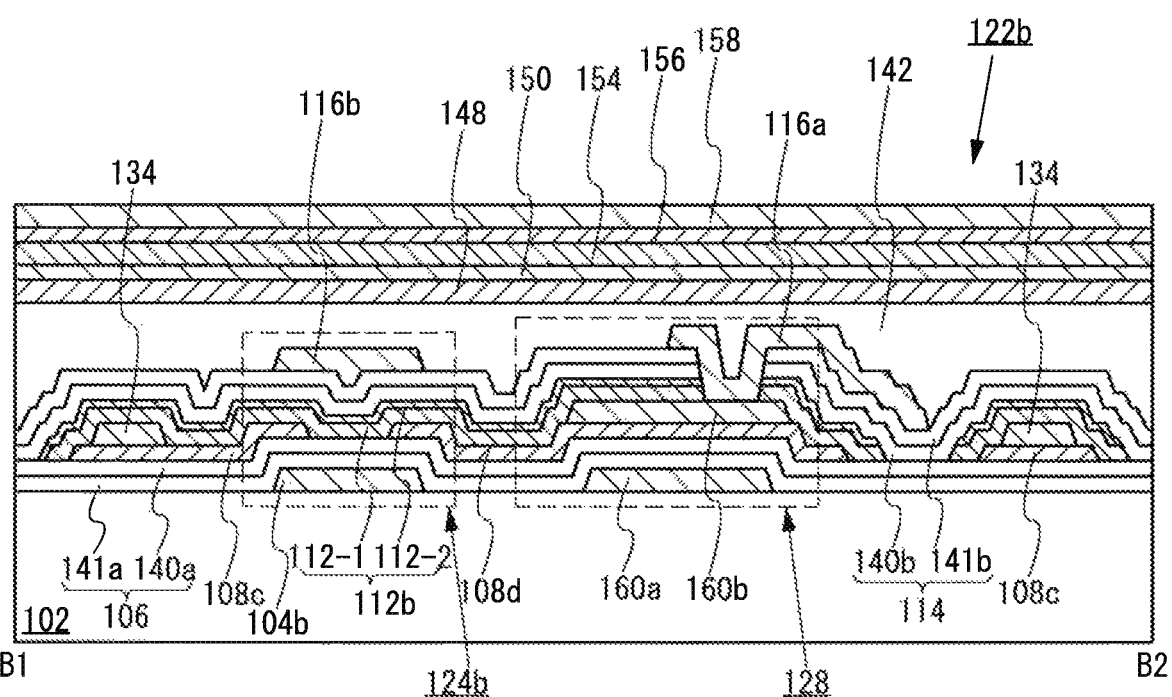
FIG. 29B is a cross-sectional view showing the structure of the pixel in the display device in an embodiment according to the present invention, taken along line B1-B2 in FIG. 28.

FIG. 28 shows an example of planar structure of one pixel 122*b* corresponding to the equivalent circuit shown in FIG. 27. FIG. 29A shows a cross-sectional structure taken along line A1-A2 in FIG. 28, and FIG. 29B shows a cross-sectional structure taken along line B1-B2 in FIG. 28. FIG. 29A shows a cross-sectional structure of the driving transistor 126*b* and the organic EL element 130. FIG. 29B shows a cross-sectional structure of the selection transistor 124*b* and the capacitance element 128. The following description will be made with reference to FIG. 28, FIG. 29A and FIG. 29B optionally. In the plan view of the pixel 122*b* shown in FIG. 28, the structure of the organic EL element 130 is omitted.

4-2-1. Driving Transistor

The driving transistor 126*b* has substantially the same structure as that of the transistor 100*b* described in embodiment 3. Specifically, the driving transistor 126*b* includes the second gate electrode 104*a*, the second insulating layer 106, the first oxide semiconductor layer 112*a*, the first insulating layer 114, and the first gate electrode 116*a*, which are stacked. The second gate electrode 104*a* is provided between the substrate 102 and the second insulating layer 106. The first gate electrode 116*a* is provided on the top surface of the first insulating layer 114 (surface opposite to the surface facing the substrate 102).

The first oxide conductive layer 108*a* and the second oxide conductive layer 108*b* are provided between the second insulating layer 106 and the first oxide semiconductor layer 112*a*. The first oxide conductive layer 108*a* and the second oxide conductive layer 108*b* are provided in contact with the first oxide semiconductor layer 112*a* to act as a source region and a drain region.

The first oxide conductive layer 108*a* and the second oxide conductive layer 108*b* are provided to partially overlap the second gate electrode 104*a* and the first gate electrode 116*a* and to hold the second gate electrode 104*a* and the first gate electrode 116*a* from both of two sides as seen in a plan view. The second oxide conductive layer 108*b* includes U-shaped curved patterns as seen in a plan view in at least a region thereof overlapping the second gate electrode 104*a* and the first gate electrode 116*a*. The first oxide conductive layer 108*a* includes linear patterns extending inward of the U-shaped curved patterns of the second oxide conductive layer 108*b*. The cross-sectional view of the transistor 100*b* shown in FIG. 26 shows a unit structure from the first oxide conductive layer 108*a* to the second oxide conductive layer 108*b*. A cross-sectional view of the driving transistor 126*b* shown in FIG. 28 taken along the second direction (D2 direction) includes a repetition of the cross-sectional view shown in FIG. 26. The second gate electrode 104*a* is provided in the same layer structure as that of the first common line 136*a*.

In the driving transistor 126*b* in this embodiment, the oxide semiconductor layer 112 includes the first region 112-1 and the second region 112-2. The second region 112-2 has a carrier concentration lower than that of the first region 112-1. With such a structure, the driving transistor 126*b* includes a channel in the first region 112-1, of the oxide semiconductor layer 112, separated from the first insulating layer 114. In the driving transistor 126*b* in this embodiment, the oxide semiconductor layer 112 includes the second region 112-2 provided between the first region 112-1 and the first insulating layer 114. This improves the field effect mobility. In addition, the threshold voltage of the driving transistor 126*b* is suppressed from being fluctuated, and thus the driving transistor 126*b* has a higher reliability because of stable electric characteristics. The driving transistor 126*b* has a dual-gate structure, and thus has an improved current driving capability. Therefore, the driving transistor 126*b* provides a sufficient level of current to drive the organic EL element 130 even if the voltage of the second voltage 158 acting as an anode electrode is decreased. Even if the operating point of the organic EL element 130 is changed, the driving transistor 126*b* provides constant current driving in accordance with the change in the operating point. The driving transistor 126*b* adopts the dual-gate structure, and therefore, consumes less power. Therefore, the problem of heat generation, which is made conspicuous in a large-scale organic EL display device, is solved. This is effective to extend the life of the organic EL element.

4-2-2. Selection Transistor

The selection transistor 124*b* has substantially the same structure as that of the transistor 100*b* described in embodiment 3. Specifically, the selection transistor 124*b* includes the second gate electrode 104*b*, the second insulating layer 106, the second oxide semiconductor layer 112*b*, the first insulating layer 114, and the first gate electrode 116*b*, which are stacked. A channel of the second transistor 124*b* is formed in a region where the second oxide semiconductor layer 112*b* overlaps the second gate electrode 104*b* and the first gate electrode 116*b*.

The third oxide conductive layer 108*c* and the fourth oxide conductive layer 108*d* are provided between the second insulating layer 106 and the second oxide semiconductor layer 112*b*. The third oxide conductive layer 108*c* and the fourth oxide conductive layer 108*d* are provided in contact with the second oxide semiconductor layer 112*b*, and thus act as a source region and a drain region.

The third oxide conductive layer 108*c* and the fourth oxide conductive layer 108*d* are provided to partially overlap the second gate electrode 104*b* and the first gate electrode 116*b* and to hold the second gate electrode 104*b* and the first gate electrode 116*b* from both of two sides as seen in a plan view. The third oxide conductive layer 108*c* includes a U-shaped curved pattern as seen in a plan view in at least a region thereof overlapping the second gate electrode 104b and the first gate electrode 116b. The fourth oxide conductive layer 108d includes a linear pattern extending inward of the U-shaped curved pattern of the third oxide conductive layer 108c. The cross-sectional view of the transistor 100b shown in FIG. 26 shows a unit structure from the first oxide conductive layer 108a to the second oxide conductive layer 108b. A cross-sectional view of the selection transistor 124 shown in FIG. 28 taken along the second direction (D2 direction) includes a repetition of the cross-sectional view shown in FIG. 26. The second gate electrode 104b is provided in the same layer structure as that of the first capacitance electrode 160a.

4-3. Transistor Structure

As shown in FIG. 29A and FIG. 29B, the pixel 122b in this embodiment has a structure in which the second electrode 158 covers the entire surfaces of the driving transistor 126b and the selection transistor 124b. The driving transistor 126b and the selection transistor 124b each have a bottom-contact dual-gate structure; specifically, the first oxide conductive layer 108a and the second oxide conductive layer 108b are located in contact with the bottom surface of the oxide semiconductor layer 112 where a channel is formed, the second gate electrode 104 is located below the oxide semiconductor layer 112, and the first gate electrode 116 is located above the oxide semiconductor layer 112.

Figure 30A:
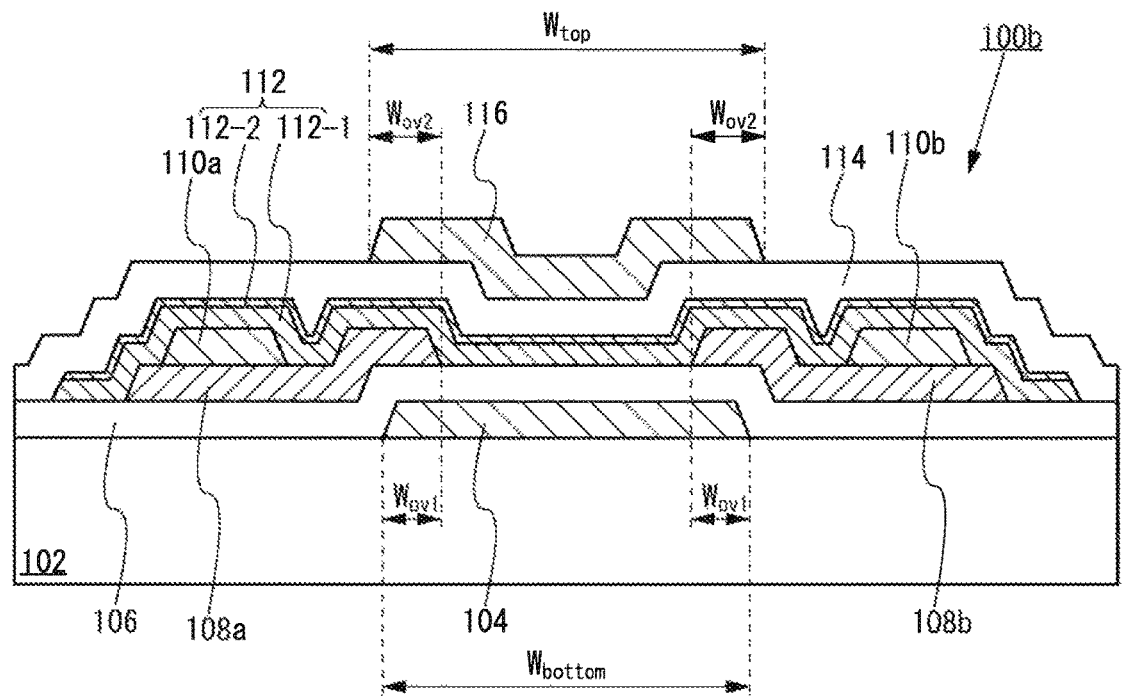
FIG. 30A is a cross-sectional view showing a structure of a transistor in an embodiment according to the present invention.
Figure 30B:
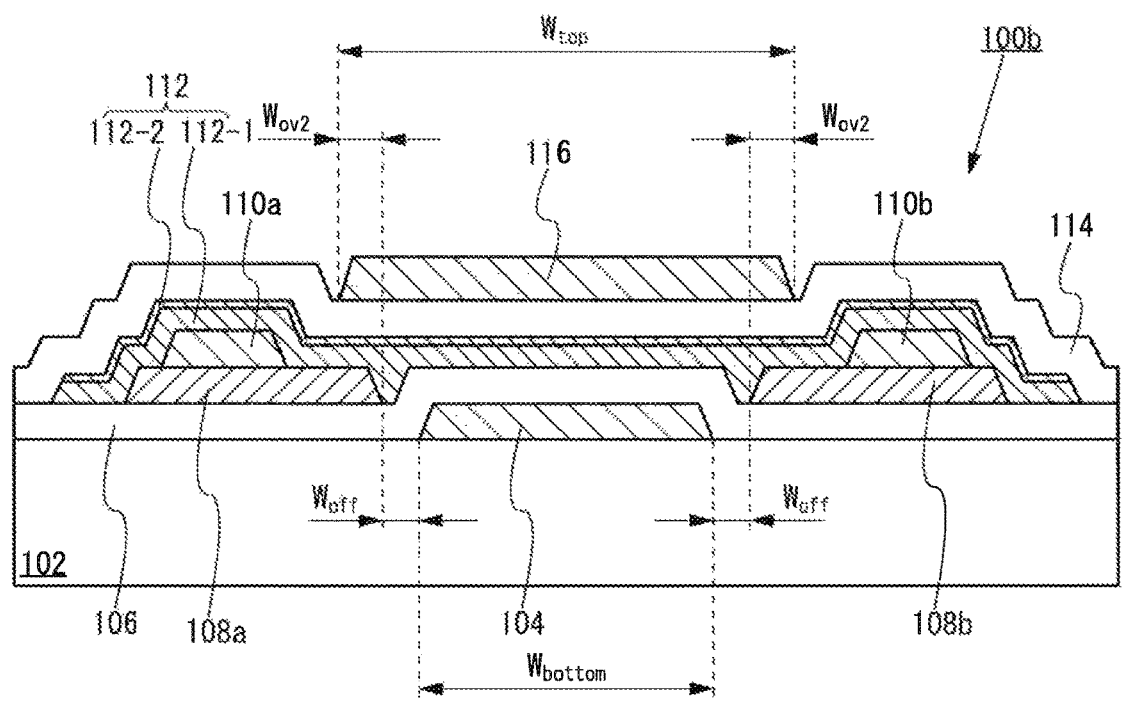
FIG. 30B is a cross-sectional view showing a structure of a transistor in an embodiment according to the present invention.

FIG. 30A and FIG. 30B each show a bottom-contact dual-gate structure of the transistor 100b in this embodiment. The first oxide conductive layer 108a and the second oxide conductive layer 108b are located in contact with the bottom surface of the oxide semiconductor layer 112, the first gate electrode 116 is located above the oxide semiconductor layer 112, and the second gate electrode 104 is located below the oxide semiconductor layer 112. The first region 112-1 of the oxide semiconductor layer 112 has a carrier concentration higher than that of the second region 112-2. Therefore, in the transistor 100b in this embodiment, the electric current flows in an area, in the first region 112-1 of the oxide semiconductor layer 112, that is closer to the second region 112-2 (on the first gate electrode 116 side), so that the field effect mobility is improved. In addition, the first oxide conductive layer 108a and the second oxide conductive layer 108b are in contact with the first region 112-1, of the oxide semiconductor layer 112, having a high conductivity. Therefore, the contact resistance between the first oxide conductive layer 108a and the first region 112-1 of the oxide semiconductor layer 112, and the contact resistance between the second oxide conductive layer 108b and the first region 112-1 of the oxide semiconductor layer 112, are decreased.

As shown in this embodiment, with a structure in which the gate electrode is provided below and above the oxide semiconductor layer 112, the positive charges are suppressed from being accumulated on the back channel side of the oxide semiconductor layer 112. In this case, the second gate electrode 104 may be grounded to have a constant potential, or may be supplied with a voltage same as that of the first gate electrode 116, so that potential on the back channel side is stabilized.

FIG. 30A shows an embodiment of the transistor 100b. In this embodiment, the transistor 100b has a structure in which the second gate electrode 104 in a lower layer and the first gate electrode 116 in an upper layer each overlap both of the first oxide conductive layer 108a and the second oxide conductive layer 108b, which correspond to the source and drain electrodes. The second gate electrode 104 having width $W_{bottom}$ in a channel length direction overlaps each of the first oxide conductive layer 108a and the second oxide conductive layer 108b by width $W_{ov1}$. The first gate electrode 116 having width $W_{top}$ in the channel length direction overlaps each of the first oxide conductive layer 108a and the second oxide conductive layer 108b by width $W_{ov2}$. Since the second gate electrode 104 and the first gate electrode 116 each partially overlap both of the first oxide conductive layer 108a and the second oxide conductive layer 108b, the channel region in the oxide semiconductor layer 112 is substantially blocked against the external electric field. Therefore, even if the second electrode 158 is located to cover the entire surface of the transistor 100b, the transistor 100b is not influenced by the electric field of the second electrode 158. Thus, the threshold voltage of the transistor 100b is prevented from being changed along with time.

FIG. 30B shows an embodiment of the transistor 100b. In this embodiment, the transistor 100b has a structure in which the first gate electrode 116 in an upper layer overlaps both of the first oxide conductive layer 108a and the second oxide conductive layer 108b corresponding to the source and drain electrodes, and the second gate electrode 104 overlaps neither the first oxide conductive layer 108a nor the second oxide conductive layer 108b. The first gate electrode 116 having width $W_{top}$ in the channel length direction overlaps each of the first oxide conductive layer 108a and the second oxide conductive layer 108b by width $W_{ov2}$. By contrast, width $W_{bottom}$ of the second gate electrode 104 in the channel length direction is narrower than the interval between the first oxide conductive layer 108a and the second oxide conductive layer 108b, and the second gate electrode 104 is offset by width $W_{off}$ from the first oxide conductive layer 108a and the second oxide conductive layer 108b. Since at least the first gate electrode 116 partially overlaps both of the first oxide conductive layer 108a and the second oxide conductive layer 108b, the channel region in the oxide semiconductor layer 112 is substantially blocked against the electric field of the second electrode 158. Therefore, the threshold voltage of the transistor 100b is prevented from being changed along with time. Specifically, the area size of the region where the first gate electrode 116 overlaps the oxide semiconductor layer 112 is larger than the area size of the region where the second gate electrode 104 overlaps the oxide semiconductor layer 112. For this reason, the influence of the charges that may be accumulated on the back channel side is blocked. In other words, the second gate electrode 104 and the first gate electrode 116 overlap each other as seen in a plan view, and the first gate electrode 116 covers the second gate electrode 104, and therefore, the influence of the charges that may be accumulated on the back channel side is blocked.

In consideration of the alignment precision of a photomask in a lithography step, it is preferable that width $W_{top}$ of the first gate electrode 116 is larger than width $W_{bottom}$ of the second gate electrode 104 ($W_{top} > W_{bottom}$). The width of the first gate electrode 116 is made larger than the width of the second gate electrode 104, so that there is a margin for the alignment precision of the photomask in the lithography step. Therefore, the channel region formed in the oxide semiconductor layer 112 is covered with the first gate electrode 116 with certainty.

4-4. Method of Manufacturing the Display Device

An example of method of manufacturing the display device 120 in an embodiment according to the present invention will be described. The method of manufacturing the display device 120 is the same as the method of manufacturing the display device in embodiment 1 except that the second gate electrode 104 is formed on one surface of the substrate 102 and that the second insulating layer 106, the second conductive film 107 and the third conductive film 109 are formed on the second gate electrode 104. In this section, only the stage of forming the second gate electrode 104 on the substrate 102 will be described.

The second gate electrode 104a, 104b, the first capacitance electrode 160a and the first common line 136a are formed on one surface of the substrate 102. The first common line 136a and the first capacitance electrode 160a are formed of the same conductive film as the second gate electrode 104a, 104b. Therefore, the second gate electrode 104a and the gate signal line 132a are formed as one continuous pattern formed of a conductive film in the same layer. The first common line 136a and the first capacitance electrode 160a are formed as one continuous pattern formed of a conductive film in the same layer.

Figure 31A:
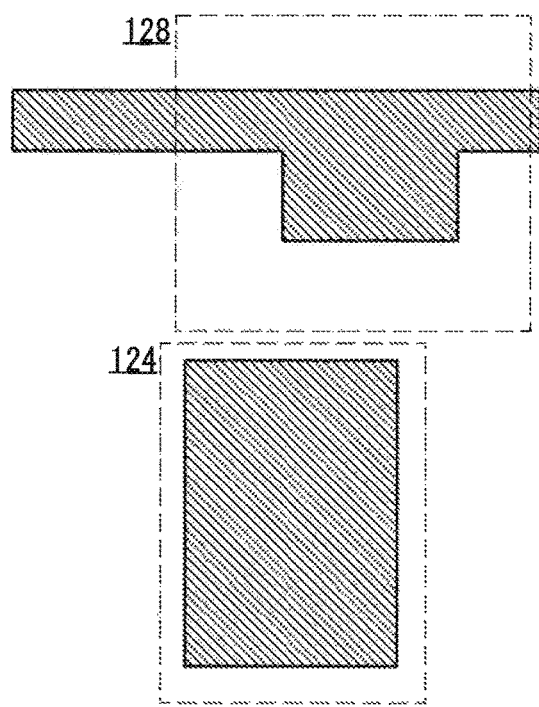
FIG. 31A is a plan view of showing a photomask used for manufacturing a display device in an embodiment according to the present invention.
Figure 31B:
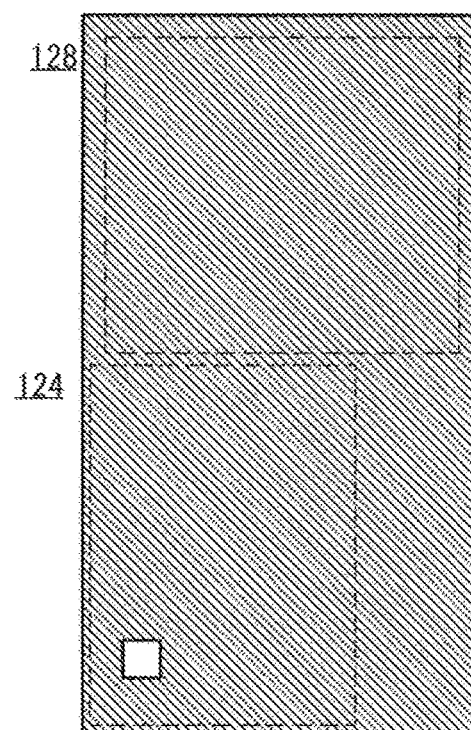
FIG. 31B is a plan view of showing a photomask used for manufacturing a display device in an embodiment according to the present invention.

Like in embodiment 1, with the method of manufacturing the display device 120 in this embodiment, the multi-gradation photomask 201 is used to decrease the number of photomasks required to manufacture the display device 120. FIG. 31A and FIG. 31B each show a pattern of a photomask usable to manufacture the display device 120, more specifically, a part of the photomask in the vicinity of the capacitance element 128 and the selection transistor 124. FIG. 31A shows the multi-gradation photomask usable to form the second gate electrode 104b, the first capacitance electrode 160a and the first common line 136a. By use of the multi-gradation photomask 201 having such a pattern, a plurality of patterns (the second gate electrode 104a, 104b, the second capacitance electrode 160a, the first common line 136a) are formed by one cycle of exposure. FIG. 31B shows a photomask usable to form the third contact hole 117c that connects the second gate electrode 104b and the first gate electrode 116. By using such a photomask in addition to the photomask used in the method for manufacturing the display device 120 according to the first embodiment, the reliability of the display device 120 can be improved and the power consumption can be reduced.

Like in embodiment 1, with the method of manufacturing the transistor 100b in this embodiment, the first region 112-1 and the second region 112-2 of the oxide semiconductor layer 112 are formed continuously by using the same sputtering target and controlling the partial pressure of oxygen of the sputtering gas. This improves the productivity.

In this embodiment, both of the selection transistor 124b and the driving transistor 126b are of a dual gate type. The present invention is not limited to this. For example, the selection transistor 124b or the driving transistor 126b may be a top gate type transistor with no second gate electrode 104b. The pixel circuit is not limited to having a configuration shown in FIG. 27. The transistors and the organic EL element in this embodiment are applicable to a pixel circuit including three or more transistors for one pixel.

Embodiment 5

In embodiment 5, a transistor having a structure different from that in embodiment 1 will be described. In embodiment 5, unlike in embodiment 1, the first line 110a is located between the first oxide conductive layer 108a and the second insulating layer 106, and the second line 110b is located between the second oxide conductive layer 108b and the second insulating layer 106. Components that are the same as those in embodiment 1 will bear the same reference signs, and the descriptions thereof will not be repeated.

5-1. Transistor Structure

Figure 32:
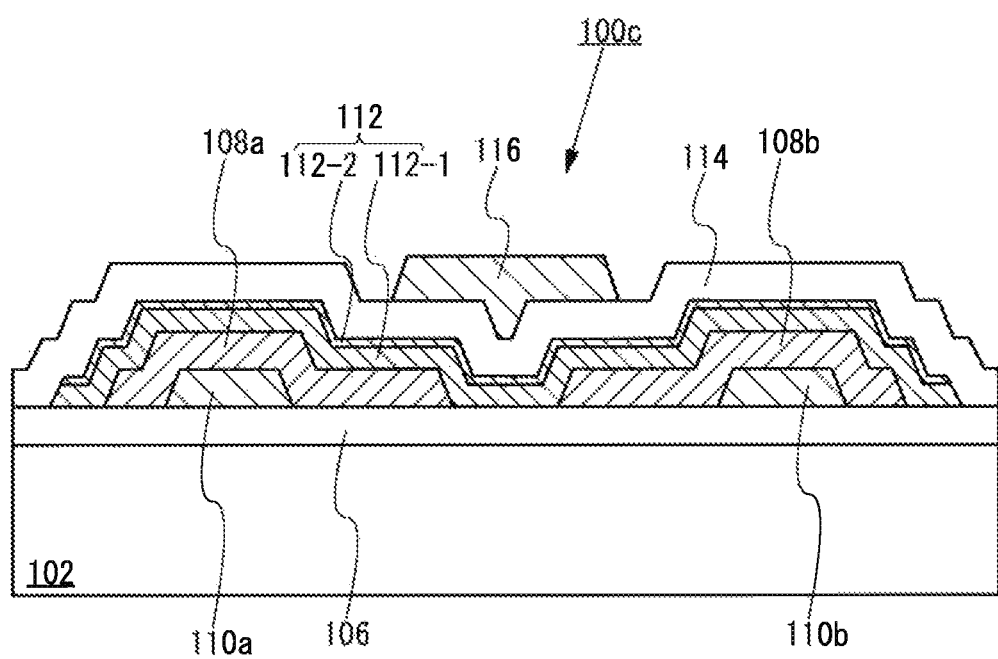
FIG. 32 is a cross-sectional view showing a structure of a transistor in an embodiment according to the present invention.

FIG. 32 is a cross-sectional view showing a structure of a transistor 100c in an embodiment according to the present invention. The transistor 100c includes the second insulating layer 106, the oxide semiconductor layer 112, the first insulating layer 114, and the first gate electrode 116, which are provided on the substrate 102 having an insulating surface.

The first gate electrode 116 is located to face one surface of the oxide semiconductor layer 112 (surface opposite to a surface facing the substrate 102). The first insulating layer 114 is located between the oxide semiconductor layer 112 and the first gate electrode 116. The first gate electrode 116 and the oxide semiconductor layer 112 are located to partially overlap each other while having the first insulating layer 114 between the first gate electrode 116 and the oxide semiconductor layer 112. In the transistor 100c, a channel is formed in a region where the oxide semiconductor layer 112 overlaps the first gate electrode 116. The first insulating layer 114 acts as a gate insulating film in a region where the oxide semiconductor layer 112 and the first gate electrode 116 overlap each other.

The second insulating layer 106 is located between the oxide semiconductor layer 112 and the substrate 102. A first oxide conductive layer 108a and a second oxide conductive layer 108b are located between the oxide semiconductor layer 112 and the second insulating layer 106. The first oxide conductive layer 108a and the second oxide conductive layer 108b are provided in contact with the oxide semiconductor layer 112. The first oxide conductive layer 108a and the second oxide conductive layer 108b are located such that one end part of the first oxide conductive layer 108a and one end part of the second oxide conductive layer 108b overlap the first gate electrode 116. One of the first oxide conductive layer 108a and the second oxide conductive layer 108b acts as a source region, and the other of the first oxide conductive layer 108a and the second oxide conductive layer 108b acts as a drain region. In the structure shown in FIG. 32, the first oxide conductive layer 108a and the second oxide conductive layer 108b are located such that one end part of the first oxide conductive layer 108a and one end part of the second oxide conductive layer 108b overlap the first gate electrode 116. Therefore, the oxide semiconductor layer 112 does not include any offset region (region having a high resistance). Thus, the level of on-current is increased.

A first line 110a is provided in contact with the first oxide conductive layer 108a, and a second line 110b is provided in contact with the second oxide conductive layer 108b. The first line 110a is located between the first oxide conductive layer 108a and the second insulating layer 106, and the second line 110b is located between the second oxide conductive layer 108b and the second insulating layer 106. According to the transistor 100c in this embodiment, the oxide semiconductor layer 112 is not in direct contact with the first line 110a and the second line 110b, so that the channel region is prevented from being contaminated with a metal used as a material of the first line 110a and the second line 110b.

Embodiment 6

In embodiment 6, a transistor having a structure different from that in embodiment 5 will be described. In embodiment 6, unlike in embodiment 5, the second gate electrode 104 is located to face one surface of the oxide semiconductor layer 112 (surface facing the substrate 102). Components that are the same as those in embodiments 1 to 5 will bear the same reference signs, and the descriptions thereof will not be repeated.

6-1. Transistor Structure

Figure 33:
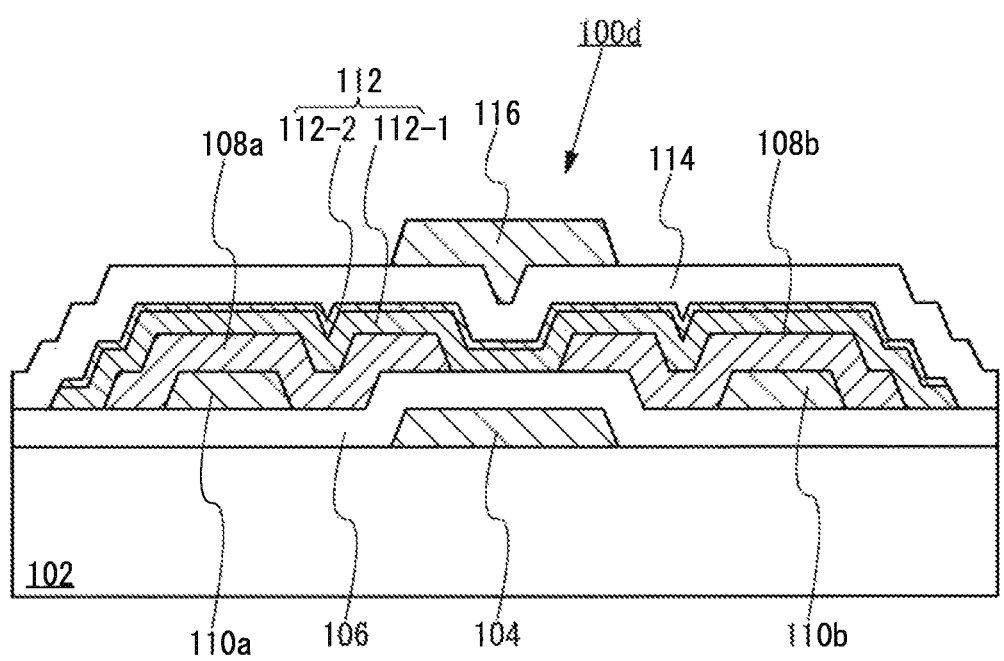
FIG. 33 is a cross-sectional view showing a structure of a transistor in an embodiment according to the present invention.

FIG. 33 is a cross-sectional view showing a structure of a transistor 100d in an embodiment according to the present invention. The transistor 100d includes the second gate electrode 104, the second insulating layer 106, the oxide semiconductor layer 112, the first insulating layer 114, and the first gate electrode 116, which are provided on the substrate 102 having an insulating surface.

The second gate electrode 104 is located to face one surface of the oxide semiconductor layer 112 (surface facing the substrate 102). The second insulating layer 106 is located between the oxide semiconductor layer 112 and the second gate electrode 104. The first gate electrode 116 is located to face the other surface of the oxide semiconductor layer 112 (surface opposite to the surface facing the substrate 102). The first insulating layer 114 is located between the oxide semiconductor layer 112 and the first gate electrode 116. The second gate electrode 104 and the first gate electrode 116 are located to partially overlap each other while having the second insulating layer 106, the oxide semiconductor layer 112 and the first insulating layer 114 between the second gate electrode 104 and the first gate electrode 116. In the transistor 100b, a channel is formed in a region where the oxide semiconductor layer 112 overlaps the second gate electrode 104 and the first gate electrode 116. The second insulating layer 106 acts as a gate insulating film in a region where the oxide semiconductor layer 112 and the second gate electrode 104 overlap each other. The first insulating layer 114 acts as a gate insulating film in a region where the oxide semiconductor layer 112 and the first gate electrode 116 overlap each other.

The second insulating layer 106 is located between the oxide semiconductor layer 112 and the second gate electrode 104. The first oxide conductive layer 108a and the second oxide conductive layer 108b are located between the oxide semiconductor layer 112 and the second insulating layer 106. The first oxide conductive layer 108a and the second oxide conductive layer 108b are provided in contact with the oxide semiconductor layer 112. The first oxide conductive layer 108a and the second oxide conductive layer 108b are located such that one end part of the first oxide conductive layer 108a and one end part of the second oxide conductive layer 108b overlap each of the second gate electrode 104 and the first gate electrode 116. One of the first oxide conductive layer 108a and the second oxide conductive layer 108b acts as a source region, and the other of the first oxide conductive layer 108a and the second oxide conductive layer 108b acts as a drain region. With the structure shown in FIG. 26, the first oxide conductive layer 108a and the second oxide conductive layer 108b are located such that one end part of the first oxide conductive layer 108a and one end part of the second oxide conductive layer 108b overlap each of the second gate electrode 104 and the first gate electrode 116. Therefore, the oxide semiconductor layer 112 does not include any offset region (region having a high resistance). Thus, the level of on-current is increased.

A first line 110a is provided in contact with the first oxide conductive layer 108a, and a second line 110b is provided in contact with the second oxide conductive layer 108b. The first line 110a is located between the first oxide conductive layer 108a and the second insulating layer 106, and the second line 110b is located between the second oxide conductive layer 108b and the second insulating layer 106. According to the transistor 100d in this embodiment, the oxide semiconductor layer 112 is not in direct contact with the first line 110a and the second line 110b, so that the channel region is prevented from being contaminated with a metal used as a material of the first line 110a and the second line 110b.

The present invention is not limited to the above-described embodiments, and can be modified as appropriate in a range not deviating from the gist of the invention. Also, the embodiments can be combined as appropriate.

What is claimed is:

1. A transistor comprising:
    an oxide semiconductor layer on a substrate, the oxide semiconductor layer including a first layer and a second layer;
    a first gate electrode including a region overlapping the oxide semiconductor layer;
    a first insulating layer between the first gate electrode and the oxide semiconductor layer; and
    a first oxide conductive layer and a second oxide conductive layer each including a region in contact with the oxide semiconductor layer;
    wherein the first layer of the oxide semiconductor layer and the second layer of the oxide semiconductor layer include a region overlapping each other, the first layer of the oxide semiconductor layer is arranged closer to the top surface of the substrate than the second layer of the oxide semiconductor layer,
    wherein an energy level at a lower end of the conduction band of the second layer of the oxide semiconductor layer is higher than an energy level at a lower end of the conduction band of the first layer of the oxide semiconductor layer.

2. The transistor according to claim 1, wherein the first gate electrode is arranged to face a surface of the oxide semiconductor layer opposite to a top surface of the substrate.

3. The transistor according to claim 2, further comprising a second insulating layer between the substrate and the oxide semiconductor layer; and
    a second gate electrode including a region overlapping the oxide semiconductor layer and the first gate electrode, the second gate electrode being arranged between the second insulating layer and the substrate.

4. The transistor according to claim 3, wherein a width of the first gate electrode in a channel length direction is larger than a width of the second gate electrode in the channel length direction.

5. The transistor according to claim 1, wherein the first oxide conductive layer and the second oxide conductive layer are arranged between the oxide semiconductor layer and the substrate.

6. The transistor according to claim 1, further comprising a second insulating layer between the substrate and the oxide semiconductor layer, the second insulating layer including a region in contact with the first layer of the oxide semiconductor layer.

7. The transistor according to claim 1, wherein an end part of the first oxide conductive layer and an end part of the second oxide conductive layer each overlap the first gate electrode.

8. The transistor according to claim 1, wherein a conductivity of the first layer of the oxide semiconductor layer is higher than a conductivity of the second layer of the oxide semiconductor layer.

9. The transistor according to claim 1, wherein a band gap of the first layer of the oxide semiconductor layer is smaller than a band gap of the second layer of the oxide semiconductor layer, and a work function of the first layer of the oxide semiconductor layer is larger than a work function of the second layer of the oxide semiconductor layer.

10. The transistor according to claim 1, wherein a band gap of the second layer of the oxide semiconductor layer is wider than a band gap of the first layer of the oxide semiconductor layer.

11. The transistor according to claim 1, wherein a carrier concentration of the second layer of the oxide semiconductor layer is lower than a carrier concentration of the first layer of the oxide semiconductor layer.

12. The transistor according to claim 1, wherein a carrier mobility of the first layer of the oxide semiconductor layer is higher than a carrier mobility of the second layer of the oxide semiconductor layer.

13. The transistor according to claim 1, wherein a crystallization ratio of the first layer of the oxide semiconductor layer is lower than a crystallization ratio of the second layer of the oxide semiconductor layer.

14. The transistor according to claim 1, wherein a film thickness of the first layer of the oxide semiconductor layer is larger than a film thickness of the second layer of the oxide semiconductor layer.

15. The transistor according to claim 1, wherein a material of the second layer of the oxide semiconductor layer is an oxide material containing amorphous $Ga_2O_3$.

16. The transistor according to claim 15, wherein a band gap of the second layer of the oxide semiconductor layer is larger than a band gap of the first layer of the oxide semiconductor layer by 1.0 eV or more.

17. The transistor according to claim 1, wherein
the first oxide conductive layer and the second oxide conductive layer each have a region overlapping with the first gate electrode,
the second oxide conductive layer has a pattern curved in a U shape in a planer view at least in a region overlapping with the first gate electrode, and
the first oxide conductive layer has a linear pattern extending inward of the pattern curved in the U shape in the planer view.

18. The transistor according to claim 1, wherein the first oxide conductive layer and the second oxide conductive layer are arranged between the oxide semiconductor layer and the substrate.

19. A transistor comprising:
an oxide semiconductor layer on a substrate, the oxide semiconductor layer having a first surface on a side of the substrate and a second surface opposite to the first surface;
a first gate electrode including a region overlapping the oxide semiconductor layer;
a first insulating layer between the first gate electrode and the oxide semiconductor layer; and
a first oxide conductive layer and a second oxide conductive layer each including a region in contact with the first surface of the oxide semiconductor layer;
wherein an energy level at a lower end of the conduction band of the second surface of the oxide semiconductor layer is higher than an energy level at a lower end of the conduction band of the first surface of the oxide semiconductor layer.

20. The transistor according to claim 19, wherein the first gate electrode is arranged to face the second surface of the oxide semiconductor layer.

* * * * *